(12) United States Patent
Currie et al.

(10) Patent No.: US 7,504,704 B2
(45) Date of Patent: *Mar. 17, 2009

(54) SHALLOW TRENCH ISOLATION PROCESS

(75) Inventors: Matthew T. Currie, Windham, NH (US); Anthony J. Lochtefeld, Somerville, MA (US)

(73) Assignee: AmberWave Systems Corporation, Salem, NH (US)

( * ) Notice: Subject to any disclaimer, the term of this patent is extended or adjusted under 35 U.S.C. 154(b) by 234 days.

This patent is subject to a terminal disclaimer.

(21) Appl. No.: 11/130,584

(22) Filed: May 17, 2005

(65) Prior Publication Data

US 2005/0205859 A1    Sep. 22, 2005

Related U.S. Application Data

(63) Continuation of application No. 10/794,010, filed on Mar. 5, 2004, now Pat. No. 6,960,781.

(60) Provisional application No. 60/452,794, filed on Mar. 7, 2003.

(51) Int. Cl.
  *H01L 29/06* (2006.01)
  *H01L 21/762* (2006.01)

(52) U.S. Cl. .................. 257/510; 438/424; 438/435; 257/E29.193; 257/19

(58) Field of Classification Search ........... 257/19, 257/E29.193, 510; 438/435
See application file for complete search history.

(56) References Cited

U.S. PATENT DOCUMENTS

| | | | |
|---|---|---|---|
| 4,010,045 A | 3/1977 | Ruehrwein | |
| 4,354,898 A | 10/1982 | Coldren et al. | |
| 4,411,734 A | 10/1983 | Maa | |
| 4,522,662 A | 6/1985 | Bradbury et al. | |
| 4,547,956 A | 10/1985 | Bouadma et al. | |
| 4,649,859 A | 3/1987 | Wanlass | |
| 4,675,074 A | 6/1987 | Wada et al. | |
| 4,710,788 A | 12/1987 | Dambkes et al. | |
| 4,717,681 A | 1/1988 | Curran | |
| 4,749,441 A | 6/1988 | Christenson et al. | |
| 4,755,478 A | 7/1988 | Abernathey et al. | |
| 4,764,246 A | 8/1988 | Bridges et al. | |
| 4,777,517 A * | 10/1988 | Onodera et al. | ............. 257/274 |
| 4,786,615 A | 11/1988 | Liaw et al. | |
| 4,803,539 A | 2/1989 | Psaras et al. | |

(Continued)

FOREIGN PATENT DOCUMENTS

DE    41 01 167 A1    7/1992

(Continued)

OTHER PUBLICATIONS

Ito, Shinya, IEEE, Mechanical stress effect of etch-stop nitride and its impact on deep submicron transistor design, http://ieeexplore.ieee.org/iel5/7241/19535/00904303.pdf?tp=&isnumber=&arnumber=904303.*

(Continued)

*Primary Examiner*—David Vu
*Assistant Examiner*—Earl N Taylor
(74) *Attorney, Agent, or Firm*—Goodwin Procter LLP

(57) ABSTRACT

A structure including a transistor and a trench structure, with the trench structure inducing only a portion of the strain in a channel region of the transistor.

22 Claims, 18 Drawing Sheets

U.S. PATENT DOCUMENTS

| | | |
|---|---|---|
| 4,857,986 A | 8/1989 | Kinugawa |
| 4,963,506 A | 10/1990 | Liaw et al. |
| 4,969,031 A | 11/1990 | Kobayashi et al. |
| 4,987,462 A | 1/1991 | Kim et al. |
| 4,990,979 A | 2/1991 | Otto |
| 4,997,776 A | 3/1991 | Harame et al. |
| 5,013,681 A | 5/1991 | Godbey et al. |
| 5,034,348 A | 7/1991 | Hartswick et al. |
| 5,089,872 A | 2/1992 | Ozturk et al. |
| 5,091,767 A | 2/1992 | Bean et al. |
| 5,108,946 A | 4/1992 | Zdebel et al. |
| 5,155,571 A | 10/1992 | Wang et al. |
| 5,166,084 A | 11/1992 | Pfiester |
| 5,177,583 A | 1/1993 | Endo et al. |
| 5,198,689 A | 3/1993 | Fujioka |
| 5,202,284 A | 4/1993 | Kamins et al. |
| 5,207,864 A | 5/1993 | Bhat et al. |
| 5,208,182 A | 5/1993 | Narayan et al. |
| 5,212,110 A | 5/1993 | Pfiester et al. |
| 5,212,112 A | 5/1993 | Lynch |
| 5,217,923 A | 6/1993 | Suguro |
| 5,221,413 A | 6/1993 | Brasen et al. |
| 5,225,703 A | 7/1993 | Nakatani et al. |
| 5,240,876 A | 8/1993 | Gaul et al. |
| 5,241,197 A | 8/1993 | Murakami et al. |
| 5,242,847 A | 9/1993 | Ozturk et al. |
| 5,243,207 A | 9/1993 | Plumton et al. |
| 5,250,445 A | 10/1993 | Bean et al. |
| 5,254,873 A | 10/1993 | Poon et al. |
| 5,285,086 A | 2/1994 | Fitzgerald |
| 5,291,439 A | 3/1994 | Kauffmann et al. |
| 5,294,564 A | 3/1994 | Karapiperis et al. |
| 5,298,452 A | 3/1994 | Meyerson |
| 5,304,834 A | 4/1994 | Lynch |
| 5,310,451 A | 5/1994 | Tejwani et al. |
| 5,316,958 A | 5/1994 | Meyerson |
| 5,334,861 A | 8/1994 | Pfiester et al. |
| 5,336,903 A | 8/1994 | Ozturk et al. |
| 5,346,840 A | 9/1994 | Fujioka |
| 5,346,848 A | 9/1994 | Grupen-Shemansky |
| 5,374,564 A | 12/1994 | Bruel |
| 5,393,375 A | 2/1995 | MacDonald et al. |
| 5,399,522 A | 3/1995 | Ohori |
| 5,413,679 A | 5/1995 | Godbey |
| 5,424,243 A | 6/1995 | Takasaki |
| 5,426,069 A | 6/1995 | Selvakumar et al. |
| 5,426,316 A | 6/1995 | Mohammad |
| 5,442,205 A | 8/1995 | Brasen et al. |
| 5,461,243 A | 10/1995 | Ek et al. |
| 5,461,250 A | 10/1995 | Burghartz et al. |
| 5,462,883 A | 10/1995 | Dennard et al. |
| 5,476,813 A | 12/1995 | Naruse |
| 5,479,033 A | 12/1995 | Baca et al. |
| 5,484,664 A | 1/1996 | Kitahara et al. |
| 5,496,750 A | 3/1996 | Moslehi |
| 5,496,771 A | 3/1996 | Cronin et al. |
| 5,516,721 A | 5/1996 | Galli et al. |
| 5,523,243 A | 6/1996 | Mohammad |
| 5,523,592 A | 6/1996 | Nakagawa et al. |
| 5,534,713 A | 7/1996 | Ismail et al. |
| 5,536,361 A | 7/1996 | Kondo et al. |
| 5,540,785 A | 7/1996 | Dennard et al. |
| 5,571,373 A | 11/1996 | Krishna et al. |
| 5,572,043 A | 11/1996 | Shimizu et al. |
| 5,596,527 A | 1/1997 | Tomioka et al. |
| 5,617,351 A | 4/1997 | Bertin et al. |
| 5,624,529 A | 4/1997 | Shul et al. |
| 5,630,905 A | 5/1997 | Lynch et al. |
| 5,633,202 A | 5/1997 | Brigham et al. |
| 5,659,187 A | 8/1997 | Legoues et al. |
| 5,659,194 A | 8/1997 | Iwamatsu et al. |
| 5,683,934 A | 11/1997 | Candelaria |
| 5,698,869 A | 12/1997 | Yoshimi et al. |
| 5,710,450 A | 1/1998 | Chau et al. |
| 5,714,413 A | 2/1998 | Brigham et al. |
| 5,714,777 A | 2/1998 | Ismail et al. |
| 5,728,623 A | 3/1998 | Mori |
| 5,739,567 A | 4/1998 | Wong |
| 5,759,898 A | 6/1998 | Ek et al. |
| 5,777,347 A | 7/1998 | Bartelink |
| 5,786,612 A | 7/1998 | Otani et al. |
| 5,786,614 A | 7/1998 | Chuang et al. |
| 5,792,679 A | 8/1998 | Nakato |
| 5,808,344 A | 9/1998 | Ismail et al. |
| 5,821,577 A | 10/1998 | Crabbe' et al. |
| 5,844,260 A | 12/1998 | Ohori |
| 5,847,419 A | 12/1998 | Imai et al. |
| 5,869,359 A | 2/1999 | Prabhakar |
| 5,876,796 A | 3/1999 | Regolini et al. |
| 5,877,070 A | 3/1999 | Goesele et al. |
| 5,877,535 A | 3/1999 | Matsumoto |
| 5,891,769 A | 4/1999 | Liaw et al. |
| 5,906,708 A | 5/1999 | Robinson et al. |
| 5,906,951 A | 5/1999 | Chu et al. |
| 5,912,479 A | 6/1999 | Mori et al. |
| 5,933,741 A | 8/1999 | Tseng |
| 5,943,560 A | 8/1999 | Chang et al. |
| 5,963,817 A | 10/1999 | Chu et al. |
| 5,966,622 A | 10/1999 | Levine et al. |
| 5,976,939 A | 11/1999 | Thompson et al. |
| 5,998,807 A | 12/1999 | Lustig et al. |
| 6,008,111 A | 12/1999 | Fushida et al. |
| 6,013,134 A | 1/2000 | Chu et al. |
| 6,025,234 A | 2/2000 | Chou |
| 6,030,887 A | 2/2000 | Desai et al. |
| 6,030,889 A | 2/2000 | Aulicino et al. |
| 6,033,974 A | 3/2000 | Henley et al. |
| 6,033,995 A | 3/2000 | Muller |
| 6,051,478 A | 4/2000 | Ibok |
| 6,058,044 A | 5/2000 | Sugiura et al. |
| 6,059,895 A | 5/2000 | Chu et al. |
| 6,066,563 A | 5/2000 | Nagashima |
| 6,069,091 A | 5/2000 | Chang et al. |
| 6,074,919 A | 6/2000 | Gardner et al. |
| 6,096,590 A | 8/2000 | Chan et al. |
| 6,096,647 A | 8/2000 | Yang et al. |
| 6,103,559 A | 8/2000 | Gardner et al. |
| 6,107,653 A | 8/2000 | Fitzgerald |
| 6,111,267 A | 8/2000 | Fischer et al. |
| 6,117,750 A | 9/2000 | Bensahel et al. |
| 6,121,100 A | 9/2000 | Andideh et al. |
| 6,130,453 A | 10/2000 | Mei et al. |
| 6,132,806 A | 10/2000 | Dutartre |
| 6,133,124 A | 10/2000 | Horstmann et al. |
| 6,133,799 A | 10/2000 | Favors et al. |
| 6,140,687 A | 10/2000 | Shimomura et al. |
| 6,143,636 A | 11/2000 | Forbes et al. |
| 6,153,495 A | 11/2000 | Kub et al. |
| 6,154,475 A | 11/2000 | Soref et al. |
| 6,159,852 A | 12/2000 | Nuttall et al. |
| 6,159,856 A | 12/2000 | Nagano |
| 6,160,303 A | 12/2000 | Fattaruso |
| 6,162,688 A | 12/2000 | Gardner et al. |
| 6,184,111 B1 | 2/2001 | Henley et al. |
| 6,187,657 B1 | 2/2001 | Xiang et al. |
| 6,191,007 B1 | 2/2001 | Matsui et al. |
| 6,191,432 B1 | 2/2001 | Sugiyama et al. |
| 6,194,722 B1 | 2/2001 | Fiorini et al. |
| 6,204,529 B1 | 3/2001 | Lung et al. |
| 6,207,977 B1 | 3/2001 | Augusto |
| 6,210,988 B1 | 4/2001 | Howe et al. |
| 6,214,679 B1 | 4/2001 | Murthy et al. |
| 6,218,677 B1 | 4/2001 | Broekaert |
| 6,222,218 B1 | 4/2001 | Jammy et al. |

| | | |
|---|---|---|
| 6,228,694 B1 | 5/2001 | Doyle et al. |
| 6,232,138 B1 | 5/2001 | Fitzgerald et al. |
| 6,235,567 B1 | 5/2001 | Huang |
| 6,235,568 B1 | 5/2001 | Murthy et al. |
| 6,235,575 B1 | 5/2001 | Kasai et al. |
| 6,239,002 B1 | 5/2001 | Jang et al. |
| 6,242,324 B1 | 6/2001 | Kub et al. |
| 6,242,327 B1 | 6/2001 | Yokoyama et al. |
| 6,245,684 B1 | 6/2001 | Zhao et al. |
| 6,245,691 B1 | 6/2001 | Jang et al. |
| 6,246,077 B1 | 6/2001 | Kobayashi et al. |
| 6,249,022 B1 | 6/2001 | Lin et al. |
| 6,251,755 B1 | 6/2001 | Furukawa et al. |
| 6,251,780 B1 | 6/2001 | Sohn et al. |
| 6,261,929 B1 | 7/2001 | Gehrke et al. |
| 6,266,278 B1 | 7/2001 | Harari et al. |
| 6,268,257 B1 | 7/2001 | Wieczorek et al. |
| 6,271,551 B1 | 8/2001 | Schmitz et al. |
| 6,271,726 B1 | 8/2001 | Fransis et al. |
| 6,281,532 B1 | 8/2001 | Doyle et al. |
| 6,291,321 B1 | 9/2001 | Fitzgerald |
| 6,294,448 B1 | 9/2001 | Chang et al. |
| 6,306,698 B1 | 10/2001 | Wieczorek et al. |
| 6,313,016 B1 | 11/2001 | Kibbel et al. |
| 6,313,486 B1 | 11/2001 | Kencke et al. |
| 6,315,384 B1 | 11/2001 | Ramaswami et al. |
| 6,316,301 B1 | 11/2001 | Kant |
| 6,316,357 B1 | 11/2001 | Lin et al. |
| 6,319,799 B1 | 11/2001 | Ouyang et al. |
| 6,319,805 B1 | 11/2001 | Iwamatsu et al. |
| 6,323,108 B1 | 11/2001 | Kub et al. |
| 6,326,281 B1 | 12/2001 | Violette et al. |
| 6,326,664 B1 | 12/2001 | Chau et al. |
| 6,329,063 B2 | 12/2001 | Lo et al. |
| 6,335,546 B1 | 1/2002 | Tsuda et al. |
| 6,339,232 B1 | 1/2002 | Takagi |
| 6,342,421 B1 | 1/2002 | Mitani et al. |
| 6,344,375 B1 | 2/2002 | Orita et al. |
| 6,350,311 B1 | 2/2002 | Chin et al. |
| 6,350,993 B1 | 2/2002 | Chu et al. |
| 6,352,892 B2 | 3/2002 | Jammy et al. |
| 6,352,909 B1 | 3/2002 | Usenko |
| 6,362,071 B1 | 3/2002 | Nguyen et al. |
| 6,368,733 B1 | 4/2002 | Nishinaga |
| 6,368,927 B1 | 4/2002 | Lee et al. |
| 6,369,438 B1 | 4/2002 | Sugiyama et al. |
| 6,372,356 B1 | 4/2002 | Thornton et al. |
| 6,372,593 B1 | 4/2002 | Hattori et al. |
| 6,376,318 B1 | 4/2002 | Lee et al. |
| 6,380,008 B2 | 4/2002 | Kwok et al. |
| 6,387,764 B1 | 5/2002 | Curtis et al. |
| 6,391,798 B1 | 5/2002 | DeFelice et al. |
| 6,399,970 B2 | 6/2002 | Kubo et al. |
| 6,403,975 B1 | 6/2002 | Brunner et al. |
| 6,406,973 B1 | 6/2002 | Lee |
| 6,406,986 B1 | 6/2002 | Yu |
| 6,407,406 B1 | 6/2002 | Tezuka |
| 6,410,371 B1 | 6/2002 | Yu et al. |
| 6,420,937 B1 | 7/2002 | Akatsuka et al. |
| 6,425,951 B1 | 7/2002 | Chu et al. |
| 6,429,061 B1 | 8/2002 | Rim |
| 6,444,578 B1 | 9/2002 | Cabral et al. |
| 6,455,894 B1 | 9/2002 | Matsumoto et al. |
| 6,455,912 B1 | 9/2002 | Kim et al. |
| 6,461,960 B2 | 10/2002 | Lee |
| 6,483,156 B1 | 11/2002 | Adkisson et al. |
| 6,486,520 B2 | 11/2002 | Okuno et al. |
| 6,492,216 B1 * | 12/2002 | Yeo et al. .................... 438/197 |
| 6,498,359 B2 | 12/2002 | Schmidt et al. |
| 6,498,360 B1 | 12/2002 | Jain et al. |
| 6,503,833 B1 | 1/2003 | Ajmera et al. |
| 6,504,173 B2 | 1/2003 | Hsu et al. |
| 6,509,587 B2 | 1/2003 | Sugiyama et al. |
| 6,521,041 B2 | 2/2003 | Wu et al. |
| 6,521,508 B1 | 2/2003 | Cheong et al. |
| 6,524,935 B1 | 2/2003 | Canaperi et al. |
| 6,555,839 B2 | 4/2003 | Fitzgerald |
| 6,555,880 B2 | 4/2003 | Cabral et al. |
| 6,562,703 B1 | 5/2003 | Maa et al. |
| 6,563,152 B2 | 5/2003 | Roberds et al. |
| 6,566,718 B2 | 5/2003 | Wieczorek et al. |
| 6,573,126 B2 | 6/2003 | Cheng et al. |
| 6,573,160 B2 | 6/2003 | Taylor, Jr. et al. |
| 6,583,000 B1 | 6/2003 | Hsu et al. |
| 6,583,015 B2 | 6/2003 | Fitzgerald et al. |
| 6,591,321 B1 | 7/2003 | Arimilli et al. |
| 6,593,191 B2 | 7/2003 | Fitzgerald |
| 6,593,641 B1 | 7/2003 | Fitzergald |
| 6,597,016 B1 | 7/2003 | Yuki et al. |
| 6,602,613 B1 | 8/2003 | Fitzgerald |
| 6,602,798 B1 | 8/2003 | Thakur et al. |
| 6,603,156 B2 | 8/2003 | Rim |
| 6,605,498 B1 | 8/2003 | Murthy et al. |
| 6,607,948 B1 | 8/2003 | Sugiyama et al. |
| 6,621,131 B2 * | 9/2003 | Murthy et al. .................... 257/408 |
| 6,624,478 B2 | 9/2003 | Anderson et al. |
| 6,627,506 B2 | 9/2003 | Kuhn et al. |
| 6,646,322 B2 | 11/2003 | Fitzgerald |
| 6,649,480 B2 | 11/2003 | Fitzgerald et al. |
| 6,657,223 B1 | 12/2003 | Wang et al. |
| 6,657,276 B1 * | 12/2003 | Karlsson et al. .................... 257/510 |
| 6,674,150 B2 | 1/2004 | Takagi et al. |
| 6,677,192 B1 | 1/2004 | Fitzgerald |
| 6,682,965 B1 * | 1/2004 | Noguchi et al. .................... 438/199 |
| 6,686,617 B2 | 2/2004 | Agnello et al. |
| 6,690,043 B1 | 2/2004 | Usuda et al. |
| 6,699,765 B1 | 3/2004 | Shideler et al. |
| 6,703,144 B2 | 3/2004 | Fitzgerald |
| 6,703,271 B2 | 3/2004 | Yeo et al. |
| 6,703,648 B1 | 3/2004 | Xiang et al. |
| 6,703,688 B1 | 3/2004 | Fitzergald |
| 6,709,903 B2 | 3/2004 | Christiansen |
| 6,709,929 B2 | 3/2004 | Zhang et al. |
| 6,713,326 B2 | 3/2004 | Cheng et al. |
| 6,723,661 B2 | 4/2004 | Fitzgerald |
| 6,724,008 B2 | 4/2004 | Fitzergald |
| 6,724,019 B2 | 4/2004 | Oda et al. |
| 6,730,551 B2 | 5/2004 | Lee et al. |
| 6,737,670 B2 | 5/2004 | Cheng et al. |
| 6,743,651 B2 | 6/2004 | Chu et al. |
| 6,743,684 B2 | 6/2004 | Liu |
| 6,750,130 B1 | 6/2004 | Fitzgerald |
| 6,764,908 B1 * | 7/2004 | Kadosh et al. .................... 438/285 |
| 6,787,864 B2 | 9/2004 | Paton et al. |
| 6,797,571 B2 | 9/2004 | Nagaoka et al. |
| 6,812,086 B2 | 11/2004 | Murthy et al. |
| 6,818,537 B2 | 11/2004 | Cheong et al. |
| 6,818,938 B1 | 11/2004 | Naem et al. |
| 6,828,632 B2 | 12/2004 | Bhattacharyya |
| 6,830,976 B2 | 12/2004 | Fitzgerald |
| 6,855,649 B2 | 2/2005 | Christiansen et al. |
| 6,855,990 B2 | 2/2005 | Yeo et al. |
| 6,861,318 B2 | 3/2005 | Murthy et al. |
| 6,876,053 B1 * | 4/2005 | Ma et al. .................... 257/500 |
| 6,881,360 B2 | 4/2005 | Stange et al. |
| 6,881,630 B2 | 4/2005 | Song et al. |
| 6,885,084 B2 * | 4/2005 | Murthy et al. .................... 257/622 |
| 6,887,762 B1 | 5/2005 | Murthy et al. |
| 6,887,773 B2 | 5/2005 | Gunn, III et al. |
| 6,900,103 B2 | 5/2005 | Fitzgerald |
| 6,909,186 B2 | 6/2005 | Chu |
| 6,924,181 B2 | 8/2005 | Huang et al. |
| 6,929,992 B1 * | 8/2005 | Djomehri et al. .................... 438/199 |
| 6,933,518 B2 | 8/2005 | Braithwaite et al. |
| 6,936,509 B2 | 8/2005 | Coolbaugh et al. |
| 6,940,089 B2 | 9/2005 | Cheng et al. |

| | | |
|---|---|---|
| 6,946,371 B2 | 9/2005 | Langdo et al. |
| 6,953,972 B2 | 10/2005 | Yeo et al. |
| 6,974,733 B2 | 12/2005 | Boyanov et al. |
| 6,982,433 B2 | 1/2006 | Hoffman et al. |
| 6,982,474 B2 | 1/2006 | Currie et al. |
| 6,992,355 B2 | 1/2006 | Mouli |
| 6,995,430 B2 | 2/2006 | Langdo et al. |
| 7,091,520 B2 | 8/2006 | Nakajima et al. |
| 7,238,989 B2 | 7/2007 | Yeo et al. |
| 2001/0001724 A1 | 5/2001 | Kwok et al. |
| 2001/0003269 A1 | 6/2001 | Wu et al. |
| 2001/0003364 A1 | 6/2001 | Sugawara et al. |
| 2001/0009303 A1 | 7/2001 | Tang et al. |
| 2001/0031535 A1 | 10/2001 | Agnello et al. |
| 2001/0045604 A1 | 11/2001 | Oda et al. |
| 2002/0001948 A1 | 1/2002 | Lee |
| 2002/0005561 A1 | 1/2002 | Kobayashi et al. |
| 2002/0019127 A1 | 2/2002 | Givens |
| 2002/0024395 A1 | 2/2002 | Akatsuka et al. |
| 2002/0043660 A1 | 4/2002 | Yamazaki et al. |
| 2002/0045325 A1 | 4/2002 | Kuhn et al. |
| 2002/0048910 A1 | 4/2002 | Taylor, Jr. et al. |
| 2002/0052084 A1 | 5/2002 | Fitzgerald |
| 2002/0056879 A1 | 5/2002 | Wieczorek et al. |
| 2002/0063292 A1 | 5/2002 | Armstrong et al. |
| 2002/0068393 A1 | 6/2002 | Fitzgerald et al. |
| 2002/0072130 A1 | 6/2002 | Cheng et al. |
| 2002/0084000 A1 | 7/2002 | Fitzgerald |
| 2002/0096717 A1 | 7/2002 | Chu et al. |
| 2002/0100942 A1 | 8/2002 | Fitzgerald et al. |
| 2002/0102814 A1 | 8/2002 | Olsen |
| 2002/0123167 A1 | 9/2002 | Fitzgerald |
| 2002/0123182 A1 | 9/2002 | Rabkin et al. |
| 2002/0123183 A1 | 9/2002 | Fitzgerald |
| 2002/0123197 A1 | 9/2002 | Fitzgerald et al. |
| 2002/0125471 A1 | 9/2002 | Fitzgerald et al. |
| 2002/0125475 A1 | 9/2002 | Chu et al. |
| 2002/0125497 A1 | 9/2002 | Fitzgerald |
| 2002/0135041 A1* | 9/2002 | Kunikiyo .................... 257/510 |
| 2002/0140031 A1 | 10/2002 | Rim |
| 2002/0168864 A1 | 11/2002 | Cheng et al. |
| 2002/0171077 A1 | 11/2002 | Chu et al. |
| 2002/0190284 A1 | 12/2002 | Murthy et al. |
| 2003/0003679 A1 | 1/2003 | Doyle et al. |
| 2003/0013323 A1 | 1/2003 | Hammond et al. |
| 2003/0025131 A1 | 2/2003 | Lee et al. |
| 2003/0034529 A1 | 2/2003 | Fitzgerald et al. |
| 2003/0049893 A1 | 3/2003 | Currie et al. |
| 2003/0057439 A1 | 3/2003 | Fitzgerald |
| 2003/0080361 A1* | 5/2003 | Murthy et al. ............... 257/288 |
| 2003/0089901 A1 | 5/2003 | Fitzgerald |
| 2003/0102490 A1 | 6/2003 | Kubo et al. |
| 2003/0102498 A1 | 6/2003 | Braithwaite et al. |
| 2003/0113971 A1 | 6/2003 | Nagaoka et al. |
| 2003/0162348 A1 | 8/2003 | Yeo et al. |
| 2003/0199126 A1 | 10/2003 | Chu et al. |
| 2003/0203600 A1 | 10/2003 | Chu et al. |
| 2003/0215990 A1 | 11/2003 | Fitzgerald et al. |
| 2003/0218189 A1 | 11/2003 | Christiansen |
| 2003/0227029 A1 | 12/2003 | Lochtefeld et al. |
| 2003/0227057 A1 | 12/2003 | Lochtefeld et al. |
| 2004/0005740 A1 | 1/2004 | Lochtefeld et al. |
| 2004/0007724 A1 | 1/2004 | Murthy et al. |
| 2004/0014276 A1 | 1/2004 | Murthy et al. |
| 2004/0014304 A1 | 1/2004 | Bhattacharyya |
| 2004/0029323 A1* | 2/2004 | Shimizu et al. ............ 438/142 |
| 2004/0031979 A1 | 2/2004 | Lochtefeld |
| 2004/0041210 A1 | 3/2004 | Mouli |
| 2004/0061191 A1 | 4/2004 | Paton et al. |
| 2004/0070035 A1 | 4/2004 | Murthy et al. |
| 2004/0075148 A1 | 4/2004 | Kumagai et al. |
| 2004/0075149 A1 | 4/2004 | Fitzgerald et al. |
| 2004/0084735 A1 | 5/2004 | Murthy et al. |
| 2004/0119101 A1 | 6/2004 | Schrom et al. |
| 2004/0121564 A1 | 6/2004 | Gogoi |
| 2004/0142537 A1* | 7/2004 | Lee et al. .................... 438/424 |
| 2004/0142545 A1 | 7/2004 | Ngo et al. |
| 2004/0173815 A1 | 9/2004 | Yeo et al. |
| 2004/0175893 A1 | 9/2004 | Vatus et al. |
| 2004/0217430 A1 | 11/2004 | Chu |
| 2004/0219726 A1 | 11/2004 | Fitzgerald |
| 2004/0253774 A1 | 12/2004 | Boyanov et al. |
| 2004/0253776 A1 | 12/2004 | Hoffman et al. |
| 2004/0256613 A1 | 12/2004 | Oda et al. |
| 2004/0262683 A1 | 12/2004 | Bohr et al. |
| 2005/0009263 A1 | 1/2005 | Yeo et al. |
| 2005/0042849 A1 | 2/2005 | Currie et al. |
| 2005/0077511 A1 | 4/2005 | Fitzgerald |
| 2005/0112048 A1 | 5/2005 | Tsakalakos et al. |
| 2005/0130454 A1 | 6/2005 | Murthy et al. |
| 2005/0156169 A1 | 7/2005 | Chu |
| 2005/0156180 A1 | 7/2005 | Zhang et al. |
| 2005/0156210 A1 | 7/2005 | Currie et al. |
| 2005/0161711 A1 | 7/2005 | Chu |
| 2005/0167652 A1 | 8/2005 | Hoffman et al. |
| 2005/0176204 A1 | 8/2005 | Langdo et al. |
| 2005/0250298 A1 | 11/2005 | Bauer |
| 2005/0277272 A1 | 12/2005 | Singh et al. |
| 2005/0280026 A1 | 12/2005 | Isaacson et al. |
| 2005/0280098 A1 | 12/2005 | Shin et al. |
| 2006/0008958 A1 | 1/2006 | Yeo et al. |
| 2006/0009001 A1 | 1/2006 | Huang et al. |
| 2006/0057825 A1 | 3/2006 | Bude et al. |
| 2006/0151832 A1* | 7/2006 | Murthy et al. ............... 257/344 |

FOREIGN PATENT DOCUMENTS

| | | |
|---|---|---|
| EP | 0390661 | 10/1990 |
| EP | 0 514 018 A2 | 11/1992 |
| EP | 0 552 671 A2 | 7/1993 |
| EP | 0 587 520 B1 | 3/1994 |
| EP | 0 683 522 A2 | 11/1995 |
| EP | 0 828 296 A2 | 3/1998 |
| EP | 0 829 908 A2 | 3/1998 |
| EP | 0 838 858 B1 | 4/1998 |
| EP | 0 987 765 A2 | 3/2000 |
| EP | 1 020 900 A2 | 7/2000 |
| EP | 1 174 928 A1 | 1/2002 |
| FR | 2 701 599 | 9/1993 |
| GB | 2 342 777 A | 4/2000 |
| JP | 61/141116 | 6/1986 |
| JP | 2/210816 | 8/1990 |
| JP | 30-36717 | 2/1991 |
| JP | 4-74415 | 3/1992 |
| JP | 04-307974 | 10/1992 |
| JP | 5-166724 | 7/1993 |
| JP | 6-177046 | 6/1994 |
| JP | 06-244112 | 9/1994 |
| JP | 6-252046 | 9/1994 |
| JP | 7-94420 | 4/1995 |
| JP | 07-106446 | 4/1995 |
| JP | 7-240372 | 9/1995 |
| JP | 10-270685 | 10/1998 |
| JP | 11-233744 | 8/1999 |
| JP | 2000-021783 | 1/2000 |
| JP | 2000-031491 A | 1/2000 |
| JP | 2001-319935 | 11/2001 |
| JP | 2002-076334 | 3/2002 |
| JP | 2002-164520 | 6/2002 |
| JP | 2002-324765 | 8/2002 |
| JP | 2002-289533 | 10/2002 |
| WO | 98/59365 | 12/1998 |
| WO | 99/53539 | 10/1999 |
| WO | 00/48239 | 8/2000 |
| WO | 00/54338 | 9/2000 |
| WO | 01/22482 | 3/2001 |

| WO | 01/54202 A1 | 7/2001 |
| WO | 01/93338 A1 | 12/2001 |
| WO | 01/99169 A2 | 12/2001 |
| WO | 02/01544 A2 | 2/2002 |
| WO | 02/13262 | 2/2002 |
| WO | 02/27783 A1 | 4/2002 |
| WO | 02/47168 A2 | 6/2002 |
| WO | 02/071488 A1 | 9/2002 |
| WO | 02/071491 A1 | 9/2002 |
| WO | 02/071495 A1 | 9/2002 |
| WO | 02/082514 A1 | 10/2002 |
| WO | 2004/006311 A2 | 1/2004 |
| WO | 2004/006327 A2 | 1/2004 |

OTHER PUBLICATIONS

Ota, K, IEEE, Novel Locally Strained Channel Technique for High Performance 55nm CMOS, http://ieeexplore.ieee.org/iel5/8330/25999/01175771.pdf?tp=&isnumber=&arnumber=1175771.*

Steegan, An, IEEE, Silicide Induced Pattern Density and Orientation Dependent Transconductance in MOS Transistors, http://ieeexplore.ieee.org/iel5/6669/17838/00824201.pdf?tp=&arnumber=824201&isnumber=17838.*

Mizuno, Tomohisa, IEEE, Novel SOI p-Channel MOSFETs With Higher Strain in Si Channel Using Double SiGe Heterostructures, Jan. 2002, http://ieeexplore.ieee.org/iel5/16/21019/00974741.pdf.*

Sleight, Jeffrey, IEEE, Stress Induced Defects and Transistor Leakage for Shallow Trench Isolated SOI, May 1999, http://ieeexplore.ieee.org/iel4/55/16464/00761029.pdf?tp=&isnumber=&arnumber=761029.*

Scott, Gregory, IEEE, NMOS Drive Current Reduction Caused by Transistor Layout and Trench Isolation Induced Stress, http://ieeexplore.ieee.org/iel5/6669/17838/00824277.pdf?tp=&arnumber=824277&isnumber=17838.*

Wolf and Tauber, Silicon Processing for the VLSI Era: vol. 1—Process Technology, 2nd Edition, 2000, p. 203, Table 6-3.*

Aldrich et al., "Stability of C54 Titanium Germanosilicide on a Silicon-Germanium Alloy Substrate," Journal of Applied Physics, vol. 77, No. 10 (1995) 5107-5114.

Antoniadis et al., "SOI Devices and Technology," SOI devices and technology, Neuilly sur Seine, France, (1999), pp. 81-87.

Aoyama et al., "Facet formation mechanism of silicon selective epitaxial layer by Si ultrahigh vacuum chemical vapor deposition," Journal of Crystal Growth, 136 (1994), pp. 349-354.

Armstrong, "Technology for SiGe Heterostructure-Based CMOS Devices," Ph.D. Thesis, Massachusetts Institute of Technology, Department of Electrical Engineering and Computer Science (Jun. 30, 1999).

Armstrong et al., "Design of Si/SiGe Heterojunction Complementary Metal-Oxide-Semiconductor Transistors," IEDM Technical Digest (1995 International Electron Devices Meeting), pp. 761-764.

Arst et al., "Surface planarity and microstructure of low temperature silicon SEG and ELO," Journal of Materials Research, vol. 6, No. 4 (Apr. 1991), pp. 784-791.

Aubry-Fortuna et al., "Phase Formation and Strain Relaxation During Thermal Reaction of Zr and Ti with Strained Si1-x GexCy Epilayers," Journal of Applied Physics, vol. 88, Iss. 3 (2000), 1481-1423.

Augendre, "Elevated Source/Drain by Sacrificial Selective Epitaxy fo rHigh Performance Deep Submicron CMOS: Process Window versus Complexity," IEEE Transactins on Electron Devices, vol. 47, No. 7 (Jul. 2000), pp. 1484-1491.

Augusto et al., "Proposal for a New Process Flow for the Fabrication of Silicon-based Complementary MOD-MOSFETs without ion Implantation," Thin Solid Films, vol. 294, No. 1-2, pp. 254-257 (Feb. 15, 1997).

Barradas et al., "RBS analysis of MBE-grown SiGe/(001) Si heterostructures with thin, high Ge content SiGe channels for HMOS transistors," Modern Physics Letters B, 2001 (abstract).

Borenstein et al., "A New Ultra-Hard Etch-Stop Layer for High Precision Micromachining," Proceedings of the 1999 12th IEEE International Conference on Micro Electro Mechanical Systems (MEMs) (Jan. 17-21, 1999), pp. 205-210.

Bouillon et al., "Search for the optimal channel architecture for 0.18/0.12 µm bulk CMOS experimental study," IEEE, (1996), pp. 21.2.1-21.2.4.

Bruel et al., "®SMART CUT: A Promising New SOI Material Technology," Proceedings of the 1995 IEEE International SOI Conference (Oct. 1995), pp. 178-179.

Bruel, "Silicon on Insulator Material Technology," Electronic Letters, vol. 31, No. 14 (Jul. 6, 1995), pp. 1201-1202.

Bufler et al., "Hole transport in strained $Si_{1-x}Ge_x$ alloys on $Si_{1-y}Ge_y$ substrates," Journal of Applied Physics, vol. 84, No. 10 (Nov. 15, 1998), pp. 5597-5602.

Burghartz et al., "Microwave Inductors and Capacitors in Standard Multilevel Interconnect Silicon Technology," IEEE Transactions on Microwave Theory and Techniques, vol. 44, No. 1 (Jan. 1996), pp. 100-104.

Canaperi et al., "Preparation of a relaxed Si-Ge layer on an insulator in fabrication high-speed semiconductor devices with strained epitaxial films," Intern. Business Machines Corporation, USA, 2002 (abstract).

Cao et al., "0.18-mm Fully-Depleted Silicon-on-Insulator MOSFET's," IEEE Electron Device Letters, vol. 18, No. 6 (Jun. 1997), pp. 251-253.

Carlin et al., "High Efficiency GaAs-on-Si Solar Cells with High Voc Using Graded GeSi Buffers," IEEE (2000), pp. 1006-1011.

Chang et al., "Selective Etching of SiGe/Si Heterostructures," Journal of the Electrochemical Society, No. 1 (Jan. 1991), pp. 202-204.

Cheng et al., "Electron Mobility Enhancement in Strained-Si n-MOSFETs Fabricated on SiGe-on-Insulator (SGOI) Substrates," IEEE Electrron Device Letters, vol. 22, No. 7 (Jul. 2001), pp. 321-323.

Cheng et al., "Relaxed Silicon-Germanium on Insulator Substrate by Layer Transfer," Journal of Electronic Materials, vol. 30, No. 12 (2001), pp. L37-L39.

Chieh et al., "Low-Resistance Bandgap-Engineered W/Si1-xGex/Si Contacts," IEEE Electron Device Letters, vol. 17, No. 7 (Jul. 1996) pp. 360-362.

Choi et al., "30nm ultra-thin body SOI MOSFET with selectively deposited Ge raised S/D," 58th Device Research Conference (2000) pp. 23-24.

Choi et al., "Nanoscale Ultrathin Body PMOSFETs With Raised Selective Germanium Source/Drain," IEEE Electron Device Letters, vol. 22, No. 9 (Sep. 2001), pp. 447-448.

Cullis et al., "Growth ripples upon strained SiGe epitaxial layers on Si and misfit dislocation interactions," Journal of Vacuum Science and Technology A, vol. 12, No. 4 (Jul./Aug. 1994), pp. 1924-1931.

Currie et al., "Carrier mobilities and process stability of strained Si n- and p-MOSFETs on SiGe virtual substrates," Journal of Vacuum Science and Technology B, vol. 19, No. 6 (Nov./Dec. 2001), pp. 2268-2279.

Detavernier et al., "CoSi2 Nucleation in the Presence of Ge," Thin Solid Films, vol. 384, No. 2 (2001), pp. 243-250.

Drowley et al., "Model for facet and sidewall defect formation during selective epitaxial growth of (001) silicon," Applied Physics Letters, 52 (7) (Feb. 15, 1988), pp. 546-548.

Eaglesham et al., "Dislocation-Free Stranski-Krastanow Growth of Ge on Si(100)," Physical Review Letters, vol. 64, No. 16, (Apr. 16, 1990), pp. 1943-1946.

Eaglesham et al., "Growth Morphology and the Equilibrium Shape: The Role of"Surfactants" in the Ge/Si Island Formation," Physical Review Letters, vol. 70, No. 7 (Feb. 15, 1993), pp. 966-969.

Eberhart et al., "Ni/Ag Metallization for SiGe HBTs using a Ni Silicide Contact," Semiconductor Science and Technology vol. 16, No. 9, (2001) pp. L47-L49.

Feijoo et al., "Epitaxial Si-Ge Etch Stop Layers with Ethylene Diamine Pyrocatechol for Bonded and Etchback Silicon-on-Insulator," Journal of Electronic Materials, vol. 23, No. 6 (Jun. 1994), pp. 493-496.

Fischetti et al., "Band structure, deformation potentials, and carrier mobility in strained Si, Ge, and SiGe alloys," Journal of Applied Physics, vol. 80, No. 4 (Aug. 15, 1996), pp. 2234-2252.

Fischetti, "Long-range Coulomb interactions i small Si devices. Part II. Effective electronmobility in thin-oxide structures," Journal of Applied Physics, vol. 89, No. 2 (Jan. 15, 2001), pp. 1232-1250

Fitzgerald et al., "Dislocation dynamics in relaxed graded composition semiconductors," Materials Science and Engineering, B67 (1999), pp. 53-61.

Fitzgerald et al., "Relaxed $Ge_xSi_{1-x}$ structures for III-V integration with Si and high mobility two-dimensional electron gases in Si," Journal of Vacuum Science and Technology, (Jul./Aug. 1992), pp. 1807-1819.

Fitzgerald et al., "Totally Relaxed $Ge_xSi_{1-x}$ Layers with Low Threading Dislocation Densities Grown on Si Substrates," Applied Physics Letters, vol. 59, No. 7 (Aug. 12, 1991), pp. 811-813.

Freiman et al., "Kinetics of Processes in the Ti-Si1-x Gex Systems," Applied Physics Letters vol. 69, No. 25 (1996) pp. 3821-3823.

Freiman et al., "Titanium Metallization of Si/Ge Alloys and Superlattices," Thin Solid Films vol. 294, No. 1-2 (1997) pp. 217-219.

Gallas et al., "Influence of doping on facet formation at the SiO2/Si interface," Surface Science, 440 (1999), pp. 41-48.

Garone et al., "Silicon vapor phase epitaxial growth catalysis by the presence of germane," Applied Physics Letters, vol. 56, No. 13 (Mar. 26, 1990), pp. 1275-1277.

Glück et al., "$CoSi_2$ and $TiSi_2$ for Si/SiGe heterodevices," Thin Solid Films, vol. 270 (1995) pp. 549-554.

Godbey et al., (1990) "Fabrication of Bond and Etch-Back Silicon Insulator Using a Strained $SI_{0.7}GE_{0.3}$ Layer as an Etch Stop," Journal of the Electrical Society, vol. 137, No. 10 (Oct. 1990) pp. 3219-3223.

Goulding, "The selective epitaxial growth of silicon," Materials Science and Engineering, B17 (1993), pp. 47-67.

Gray et al., "Analysis and Design of Analog Integrated Circuits," John Wiley & Sons, 1984, pp. 605-632.

Greve et al., "Growth Rate of Doped and Undoped Silicon by Ultra-High Vacuum Chemical Vapor Deposition," Journal of the Electrochemical Society, vol. 138, No. 6 (Jun. 1991), pp. 1744-1748.

Grillot et al., "Acceptor diffusion and segregation in $(AI_xGa_{1-x})_{0.5}In_{0.5}P$ heterostructures," Journal of Applied Physics, vol. 91, No. 8 (2002), pp. 4891-4899.

Grützmacher et al., "Ge segregation in SiGe/Si heterostructures and its dependence on deposition technique and growth atmosphere," Applied Physics Letters, vol. 63, No. 18 (Nov. 1, 1993), pp. 2531-2533.

Hackbarth et al, "Alternatives to Thick MBE-Grown Relaxed SiGe Buffers," Thin Solid Films, vol. 369, pp. 148-151 (2000).

Hackbarth et al., "Strain relieved SiGe buffers for Si-based heterostructure field-effect transistors," Journal of Crystal Growth, vol. 201/202 (1999), pp. 734-738.

Halsall et al., "Electron diffraction and Raman studies of the effect of substrate misorientation on ordering in the AlGaInP system," Journal of Applied Physics, vol. 85, No. 1 (1999), pp. 199-202.

Herzog et al., "SiGe-based FETs: Buffer Issues and Device Results," Thin Solid Films, vol. 380, No. 1-2, pp. 36-41 Dec. 12, 2000.

Höck et al., "Carrier mobilities in modulation doped $Si_{1-x}Ge_x$ heterostructures with respect to FET applications," Thin Solid Films, vol. 336 (1998), pp. 141-144.

Höck et al., "High hole mobility in $Si_{0.17}Ge_{0.83}$ channel metal-oxide-semiconductor field-effect transistors grown by plasma-enhanced chemical vapor deposition," Applied Physics Letters, vol. 76, No. 26 (Jun. 26, 2000), pp. 3920-3922.

Höck et al., "High performance 0.25 µm p-type Ge/SiGe MODFETs," Electronics Letters, vol. 34, No. 19 (Sep. 17, 1998), pp. 1888-1889.

Hsiao et al., "Advanced Technologies for Optimized Sub-Quarter-Micrometer SOI CMOS Devices," IEEE Transactions on Electron Devices, vol. 45, No. 5 (1998) pp. 1092-1098.

Hsu et al., "Surface morphology of related $Ge_xSi_{1-x}$ films," Appl. Phys. Lett., vol. 61, No. 11 (1992), pp. 1293-1295.

Huang et al., (2001) "Carrier Mobility enhancement in strained Si-on-insulatoir fabricated by wafer bonding", 2001 Symposium on VLSI Technology, Digest of Technical Papers, pp. 57-58.

Huang et al., "Electrical and Compositional Properties of Co-Silicided Shallow P+-n Junction Using Si-Capped/Boron-Doped $Si_{1-x}Ge_x$ Layer Deposited by UHVCME," Journal of the Electrochemical Society, vol. 148, No. 3 (2001) pp. G126-C131.

Huang et al., "High-quality strain-relaxed SiGe alloy grown on implanted silicon-on-insulator substrate," Applied Physics Letters, vol. 76, No. 19 (May 8, 2000), pp. 2680-2682.

Huang, et al., "Study on Ge/Si Ration Silidation, and Strain Relaxation of High Temperature Sputtered $Co/Si_{1-x}Ge_x$ Structures," Journal of Applied Physics, vol. 88, No. 4 (2000) pp. 1831-1837.

Huang et al., "The Impact of Scaling Down to Deep Submicron on CMOS RF Circuits," IEEE Journal of Solid-State Circuits, vol. 33, No. 7 (Jul. 1998), pp. 1023-1036.

IBM Technical Disclosure Bulletin, "Optimal Growth Technique and Structure for Strain Relaxation of Si-Ge Layers on Si Substrates," vol. 32, No. 8A (Jan. 1990), pp. 330-331.

IBM Technical Disclosure Bulletin, "2 Bit/Cell EEPROM Cell Using Band to Band Tunneling for Data Read-Out," vol. 35, No. 4B (Sep. 1992), pp. 136-140.

Ilderem et al., "Very low pressure chemical vapor deposition process for selective titanium silicide films," Appl. Phys. Lett., vol. 53, No. 8 (Aug. 22, 1988) pp. 687-689.

Ishikawa et al., "Creation of Si-Ge-based SIMOX structures by low energy oxygen implantation," Proceedings of the 1997 IEEE International SOI Conference (Oct. 1997), pp. 16-17.

Ishikawa et al., "SiGe-on-insulator substrate using SiGe alloy grown Si(001)," Applied Physics Letters, vol. 75, No. 7 (Aug. 16, 1999), pp. 983-985.

Ishitani et al., "Facet Formation in Selective Silicon Epitaxial Growth," Japanese Journal of Applied Physics, vol. 24, No. 10 (Oct. 1985), pp. 1267-1269.

Ismail et al., "Modulation-doped n-type Si/SiGe with Inverted Interface," Applied Physics Letters, 65 (10), pp. 1248-1250 Sep. 5, 1994.

Ismail, "Si/SiGe High-Speed Field-Effect Transistors," International Electron Devices Meeting, Washington, D.C. (Dec. 10, 1995), pp. 20.1.1-20.1.4.

Jang et al., "Phosphorus doping of epitaxial Si and $Si_{1-x}Ge_x$ at very low pressure," Applied Physics Letters, 63 (12) (Sep. 20, 1993), pp. 1675-1677.

Jastrzebski, "SOI by CVD: Epitaxial Lateral Overgrowth (ELO) Process—Review," Journal of Crystal Growth, 63 (1983), pp. 493-526.

Jungemann et al., "Full-Band Monte Carlo Simulation of a 0.12 µm-Si-PMOSFET with and without a Strained SiGe-Channel", IEEE Electron Devices Meeting, 1998, pp. 897-900.

Kamins et al., "Kinetics of selective epitaxial deposition of $Si_{1-x}Ge_x$," Applied Physics Letters, 61 (6) (Aug. 10, 1992), pp. 669-671.

Kandel et al., "Surfactant Mediated Crystal Growth of Semiconductors," Physical Review Letters, vol. 75, No. 14 (Oct. 2, 1995), pp. 2742-2745.

Kearney et al., "The effect of alloy scattering on the mobility of holes in a $Si_{1-x}Ge_x$ quantum well," Semiconductor Science and Technology, vol. 13 (1998), pp. 174-180.

Kim et al., "A Fully Integrated 1.9-GHz CMOS Low-Noise Amplifier," IEEE Microwave and Guided Wave Letters, vol. 8, No. 8 (Aug. 1998), pp. 293-295.

King et al., "A Polycrystalline $Si_{1-x}Ge_x$-Gate CMOS Technology", IEEE, vol. No. 1990, pp. 253-256.

King, "Silicon-Germanium: from Microelectronics to Micromechanics," Presentation to the Thin Film Users Group Meeting, AVS Northern California Chapter, Apr. 17, 2002.

Kitajima et al., "Lattice Defect in Selective Epitaxial Silicon and Laterally Overgrown Regions on $SiO_2$," Journal of Crystal Growth, 98 (1989), pp. 264-276.

Koester et al., "Extremely High Transconductance $Ge/Si_{0.4}Ge_{0.6}$ p-MODFET's Grown by UHV-CVD," IEEE Electron Device Letters, vol. 21, No. 3 (Mar. 2000), pp. 110-112.

Konig et al., "Design Rules for N-Type SiGe Hetero FETs," Solid State Electronics, vol. 41, No. 10, pp. 1541-1547 Oct. 1, 1997.

König et al., "p-Type Ge-Channel MODFET's with High Transconductance Grown on Si Substrates," IEEE Electron Device Letters, vol. 14, No. 4 (Apr. 1993), pp. 205-207.

König et al., "SiGe HBTs and HFETs," Solid-State Electronics, vol. 38, No. 9 (1995), pp. 1595-1602.

Ku et al., "High Performance PMOSFETS With $Ni(Si_{1-x}Ge_x)/Poly-Si_{0.8}Ge_{0.2}$ Gate," IEEE- 2000 Symposium on BLSI Technology Digest of Technical Papers, pp. 114-115 (2000).

Kurosawa et al., "A New Bird's Beak Free Field Isolation Technology for VLSI Devices," IEDM Technical Digest, Washington, D.C., Dec. 7-9, 1981, pp. 384-387.

Kuznetsov et al., "Technology for high-performance n-channel SiGe modulation-doped field-effect transistors," J. Vac. Sci. Technol., B 13(6), pp. 2892-2896 (Nov./Dec. 1995).

Lai, J.B. et al., "Effects of Composition on the Formation Temperatures and Electrical Resistivities of C54 Titanium Germanosilicide in Ti- $Si_{1-x}Ge_x$ Systems," Journal of Applied Physics, vol. 86, No. 3 (1999) pp. 1340-1345.

Langdo et al., (2002) "Preparation of Novel SiGe-free Strained Si on Insulator Substrates" IEEE International SOI Conference, pp. 211-212 (XP002263057).

Langdo, "Selective SiGe Nanostructures," Ph.D. Thesis, Massachusetts Institute of Technology, 2001.

Larson, "Integrated Circuit Technology Options for RFIC's—Present Status and Future Directions," IEEE Journal of Solid-State Circuits, vol. 33, No. 3 (Mar. 1998), pp. 387-399.

Lee et al., "CMOS RF Integrated Circuits at 5 GHz and Beyond," Proceedings of the IEEE, vol. 88, No. 10 (Oct. 2000), pp. 1560-1571.

Lee et al., "Strained Ge channel p-type metal-oxide-semiconductor field-effect transistors grown on $Si_{1-x}Ge_x$/Si virtual substrates," Applied Physics Letters, vol. 79, No. 20 (Nov. 12, 2001), pp. 3344-3346.

Lee et al., "Strained Ge channel p-type MOSFETs fabricated on $Si_{1-x}Ge_x$/Si virtual substrates," Material Research Society Symposium Proceedings, vol. 686 (2002), pp. A1.9.1-A1.9.5.

Leitz et al., "Channel Engineering of SiGe-Based Heterostructures for High Mobility MOSFETs," Material Research Society Symposium Proceedings, vol. 686 (2002), pp. A3.10.1-A3.10.6.

Leitz et al., "Dislocation glide and blocking kinetics in compositionally graded SiGe/Si," Journal of Applied Physics, vol. 90, No. 6 (Sep. 15, 2001), pp. 2730-2736.

Leitz et al., "Hole mobility enhancements in strained $Si/Si_{1-y}Ge_y$ p-type metal-oxide-semiconductor field-effect transistors grown on relaxed $Si_{1-x}Ge_x$ (x<y) virtual substrates," Applied Physics Letters, vol. 79, No. 25 (Dec. 17, 2001), pp. 4246-4248.

Li et al., "Design of high speed Si/SiGe heterojunction complementary metal-oxide-semiconductor field effect transistors with reduced short-channel effects," Vacuum Science and Technology A, vol. 20, No. 3 (May/Jun. 2002), pp. 1030-1033.

Li et al., "Modeling of facet growth on patterned Si substrate in gas source MBE," Journal of Crystal Growth, 157 (1995), pp. 185-189.

Lochtefeld, "Toward the End of the MOSFET Roadmap: Investigating Fundamental Transport Limits and Device Architecture Alternatives," Ph.D. Thesis, Massachusetts Institute of Technology, 2001.

Lu et al., "High Performance 0.1 μm Gate-Length P-Type SiGe MODFET's and MOS-MODFET's," IEEE Transactions on Electron Devices, vol. 47, No. 8 (Aug. 2000), pp. 1645-1652.

Lynch, "Self-Aligned Contact Schemes for Source-Drains in Submicron Devices," IEDM Technical Digest (1987) pp. 354-357.

Maillard-Schaller et al., "Role of the substrate strain in the sheet resistance stability of NiSi deposited on Si(100)," Journal of Applied Physics, vol. 85, No. 7 (Apr. 1, 1999) pp. 3614-3618.

Maiti et al., "Strained-Si Heterostructure Field Effect Transistors," Semicond. Sci. Technol., vol. 13, pp. 1225-1246 (1998).

Maszara, "Silicon-On-Insulator by Wafer Bonding: A Review," Journal of the Electrochemical Society, No. 1 (Jan. 1991), pp. 341-347.

Mercier et al., "Selective $TiSi_2$ Deposition with no Silicon Substrate Consumption by Rapid Thermal Processing in a LPCVD Reactor," Journal of Electronic Materials, vol. 19, No. 3 (1990) pp. 253-258.

Meyer, "Elevated Source/Drain Structures," The ASM Epitaxy Newsletter of Continuous Improvement, (Spring 1998) pp. 1-3.

Meyerson et al., "Cooperative Growth Phenomena in Silicon/Germanium Low-Temperature Epitaxy," Applied Physics Letters, vol. 53, No. 25 (Dec. 19, 1988), pp. 2555-2557.

Meyerson et al., "Phosphorus-Doped Polycrystalline Silicon via LPCVD," Journal of the Electrochemical Society, vol. 131, No. 10 (Oct. 1984), pp. 2366-2368.

Mizuno et al., "Advanced SOI-MOSFETs with Strained-Si Channel for High Speed CMOS-Electron/Hole Mobility Enhancement," Digest of Technical Papers, 2002 Symposium on VLSI Technology, Honolulu, Jun. 13-15, New York, NY, pp. 210-211.

Mizuno et al., "Electron and Hole Mobility Enhancement in Strained-Si MOSFET's on SiGe-on-Insulator Substrates Fabricated by SIMOX Technology," IEEE Electron Device Letters, vol. 21, No. 5 (May 2000), pp. 230-232.

Mizuno et al., "High Performance Strained-Si p-MOSFETs on SiGe-on-Insulator Substrates Fabricated by SIMOX Technology," IEEE IDEM Technical Digest, (1999 International Electron Device Meeting), pp. 934-936.

Moon et al., "Application of interferometric broadband imaging alignment on an experimental x-ray stepper," Journal of Vacuum Science and Technology, B 16(6) (Nov./Dec. 1998), pp. 3631-3636.

Nayak et al., "High-Mobility Strained-Si PMOSFET's," IEEE Transactions on Electron Devices, vol. 43, No. 10 (Oct. 1996); pp. 1709-1716.

O'Neill et al., "Si-Ge Virtual Substrate N-channel Heterojunction MOSFETs", Semiconductor Science Technology, vol. 14, No. 9, 1999, pp. 784-789.

Okada et al., "Epitaxial Growth of Heavily B-Doped SiGe Films and Interfacial Reaction of Ti/B-Doped SiGe Bilayer Structure using Rapid Thermal Processing," Thin Solid Films, vol. 369, No. 1-2 (2000) pp. 130-133.

Osburn et al., "Low parasitic resistance contacts for scaled ULSI devices," Thin Solid Films, 332 (1998), pp. 428-436.

Ota et al., "Application of heterojunction FET to power amplifier for cellular telephone," Electronic Letters, vol. 30, No. 11 (May 26, 1994), pp. 906-907.

Öztürk et al., "Rapid Thermal Chemical Vapor Deposition of Germanium and Germanium/Silicon Alloys on Silicon: New Applications in the Fabrication of MOS Transistors," Mat. Res. Soc. Symp. Proc., vol. 224 (1991) pp. 223-234.

Papananos, "Radio-Frequency Microelectronic Circuits for Telecommunication Applications," (1999), pp. 115-117, 188-193.

Parker et al., "SiGe Heterostructure CMOS Circuits and Applications", Solid-State Electronics, vol. 43, pp. 1497-1506 (1996).

Pfiester et al., "A Self-Aligned Elevated Source/Drain MOSFET," IEEE Electron Device Letters, vol. 11, No. 9 (Sep. 1990), pp. 365-367.

Ponomarev et al., "High-Performance Deep SubMicron CMOS Technologies with Polycrystalline-SiGe Gates," IEEE Transactions on Electron Devices, vol. 47, No. 4, Apr. 2000, pp. 848-855.

Qin, et al., Structure and Thermal Stability of $Ni/Si_{1-x}Ge_x$ Contacts for VLSI Applications vol. 36, No. 21 (Oct. 2000) pp. 1819-1821.

Raaijmakers et al., "Enabling technologies for forming and contacting shallow junctions in Si: HF-vapor cleaning and selective epitaxial growth of Si and SiGe," Journal of Vacuum Science and Technology, B 17(5) (Sep./Oct. 1999), pp. 2311-2320.

Ransom et al., "Gate-Self-Aligned n-channel and p-channel Germanium MOSFET's," IEEE Transactions on Electron Devices, vol. 38, No. 12 (Dec. 1991), p. 2695.

Reinking et al., "Fabrication of high-mobility Ge p-channel MOSFETs on Si substrates," Electronics Letterrs, vol. 35, No. 6 (Mar. 18, 1999), pp. 503-504.

Ren et al., "A Novel Implantation Free Raised Source/Drain MOSFET Process Using Selective Rapid Thermal Chemical Vapor Deposition of In-Situ Boron Doped $Si_xGe_{1-x}$," Mat. Res. Soc. Symp. Proc., vol. 303 (1993) pp. 37-41.

Reynolds et al., "Selective titanium disilicide by low-pressure chemical vapor deposition," J. Appl. Phys., vol. 65, No. 8 (Apr. 15, 1989) pp. 3212-3218.

Rim, "Application of Silicon-Based Heterostructures to Enhanced Mobility Metal-Oxide-Semiconductor Field-Effect Transistors," Ph.D. Thesis, Stanford University, 1999, pp. 1-184.

Rim et al, "Enhanced Hole Mobilities in Surface-channel Strained-Si p-MOSFETs," IEEE, (1995), pp. 517-520.

Rim et al., "Fabrication and Analysis of Deep Submicron Strained-Si N-MOSFET's", IEEE Transactions on Electron Devices, vol. 47, No. 7, Jul. 2000, pp. 1406-1415.

Robbins et al., "A model for heterogeneous growth of $Si_{1-x}Ge_x$ films from hydrides," Journal of Applied Physics, 69 (6) (Mar. 15, 1991), pp. 3729-3732.

Rodder et al., "Raised Source/Drain MOSFET with Dual Sidewall Spacers," IEEE Electron Device Letters, vol. 12, No. 3 (Mar. 1991), pp. 89-91.

Sadek et al., "Design of Si/SiGe Heterojunction Complementary Metal-Oxide-Semiconductor Transistors," IEEE Trans. Electron Devices, Aug. 1996, pp. 1224-1232.

Sakaguchi et al., "ELTRAN by splitting porous Si layers," Proceedings of the 195th Int. SOI Symposium, Electrochemical Society, vol. 99-3 (1999), pp. 117-121.

Samavedam et al., "Elevated source drain devices using silicon selective epitaxial growth," Journal of Vacuum Science and Technology, B 18(3) (May/Jun. 2000), pp. 1244-1250.

Savina et al., "Faceting of a growing crystal surface by surface diffusion," Physical Review, E 67, 021606 (2003), pp. 1-16.

Schäffler, "High-Mobility Si and Ge Structures," Semiconductor Science and Technology, vol. 12 (1997), pp. 1515-1549.

Sedgwick et al., "Growth of Facet-Free Selective Silicon Epitaxy at Low Temperature and Atmospheric Pressure," Journal of the Electrochemical Society, vol. 138, No. 10 (Oct. 1991), pp. 3042-3047.

Shibata et al., "High Performance Half-Micron PMOSFETs with 0.1UM Shallow P+N Junction Utilizing Selective Silicon Growth and Rapid Thermal Annealing," IEDM Technical Digest (1987) pp. 590-593.

Sidek et al., "Reduction of parasitic bipolar transistor action and punchthrough susceptibility in MOSFETs using $Si/Si_{1-x}Ge_x$ sources and drains," Electronic Letters, vol. 32, No. 3 (Feb. 1, 1996), pp. 269-270.

Sugimoto et al., "A 2V, 500 MHz and 3V, 920 MHz Low-Power Current-Mode 0.6 μm CMOS VCO Circuit," Institute of Electronics, Information and Communication Engineers, vol. E82-C, No. 7 (Jul. 1999), pp. 1327-1329.

Sun et al., "A Comparative Study of n=/p Junction Formation for Deep Submicron Elevated Source/Drain Metal Oxide Semiconductor Field Effect Transistors," Journal of the Electrochemical Society, vol. 144, No. 10 (Oct. 1997), pp. 3659-3664.

Sun et al., "The Effect of the Elevated Source/Drain Doping Profile on Performance and Reliability of Deep Submicron MOSFET's," IEEE Transactions on Electron Devices, vol. 44, No. 9 (Sep. 1997), pp. 1491-1498.

Sun et al., "Impact of Epi Facets on Deep Submicron Elevated Source/Drain MOSFET Characteristics," IEEE Transactions on Electron Devices, vol. 45, No. 6 (Jun. 1998), pp. 1377-1380.

Ternent et al., "Metal Gate Strained Silicon MOSFETs for Microwave Integrated Circuits," IEEE (Oct. 2000), pp. 38-43.

Tromp et al., "Local Dimer Exchange in Surfactant-Mediated Epitaxial Growth," Physical Review Letters, vol. 68, No. 7 (Febb. 17, 1992), pp. 954-957.

Tsang et al., "Measurements of alloy composition and strain in thin $Ge_xSi_{1-x}$ layers," Journal of Applied Physics, vol. 75, No. 12 (Jun. 15, 1994), pp. 8098-8108.

Tweet et al., "Factors determining the composition of strained GeSi layers grown with disilane and germane," Applied Physics Letters, vol. 65, No. 20 (Nov. 14, 1994), pp. 2579-2581.

Uchino et al., "MOSFETs with Utrashallow Junction and Minimum Drain Area Formed by Using Solid-Phase Diffusion from SiGe," IEEE Transactions on Electron Devices, vol. 48, No. 7 (Jul. 2001) pp. 1406-1411.

Uhrberg et al., "Electronic and atomic structure of arsenic terminated Si(100)," Journal of Vacuum Science and Technology, A 4 (3) (May/Jun. 1986), pp. 1259-1264.

Usami et al., "Spectroscopic study of Si-based quantum wells with neighboring confinement structure," Semicon. Sci. Technol., 1997 (abstract).

Welser et al., "Electron Mobility Enhancement in Strained-Si N-Type Metal-Oxide-Semiconductor Field-Effect Transistors," IEEE Electron Device Letters, vol. 15, No. 3 (Mar. 1994), pp. 100-102.

Welser et al., "Evidence of Real-Space Hot-Electron Transfer in High Mobility, Strained-Si Multilayer MOSFETs," IEDM, pp. 545-548 (1993).

Welser et al., "NMOS and PMOS Transistors Fabricated in Strained Silicon/Relaxed Silicon-Germanium Structures," IEEE, pp. 1000-1002 (1992).

Welser, "The application of strained-silicon/relaxed-silicon germanium heterostructures to metal-oxide-semiconductor field-effect transistors," Ph.D. Thesis, Stanford University Dept. of Electrical Engineering, 1995.

Wolf and Tauber, "Silicon Processing for the VLSI Era vol. 1: Process Technology," Lattice Press, Sunset Beach, CA, 1986, pp. 384-386.

Wong et al., "Elevated Source/Drain MOSFET," IEDM Technical Digest, 28 (1984), pp. 634-637.

Xiang et al., "Interfacet mass transport and facet evolution in selective epitaxial growth of Si by gas source molecular beam epitaxy," Journal of Vacuum Science and Technology, B 14(3) (May/Jun. 1996), pp. 2381-2386.

Xie et al., "Semiconductor Surface Roughness: Dependence on Sign and Magnitude of Bulk Strain," Physical Review Letters, vol. 73, No. 22 (Nov. 28, 1994), pp. 3006-3009.

Xie et al., "Very high mobility two-dimensional hole gas in $Si/Ge_xSi_{1-x}/Ge$ structures grown by molecular beam epitaxy," Applied Physics Letters, vol. 63, No. 16 (Oct. 18, 1993), pp. 2263-2264.

Xie, "SiGe field effect transistors," Materials Science and Engineering, vol. 25 (1999), pp. 89-121.

Yamagata et al., "Bonding, Splitting and Thinning by Porous Si in ELTRAN; SOI- EPI Wafer," Material Research Society Symposium Proceedings, vol. 681E (2001), pp. 18.2.1-18.2.10.

Yasuda et al., "Interfacial Reactions of Ti / and Zr / $Si_{1-x}Ge_x$ / Si Contacts with Rapid Thermal Annealing", Thin Solid Films, vol./No. 373, 2000, pp. 73-78.

Yeo et al., "Nanoscale Ultra-Thin-Body Silicon-on-Insulator P-MOSFET with a SiGe/Si Heterostructure Channel," IEEE Electron Device Letters, vol. 21, No. 4 (Apr. 2000), pp. 161-163.

Yew, "Growth and Characterization of Low Temperature Silicon Selective Epitaxy," Ph.D. Thesis, MIT, 1990, pp. 1-210.

Yu et al., "Doping reaction of PH3 and B2H6 with Si(100)," Journal of Applied Physics, 59 (12) (Jun. 15, 1986), pp. 4032-4037.

Zhang et al., "Demonstration of a GaAs-Based Compliant Substrate Using Wafer Bonding and Substrate Removal Techniques," IEEE, (1998), pp. 25-28.

Baker et al., "STI TEOS Densification for Furnaces and RTP Tools," *Proceedings of the IEEE/SEMI Advanced Semiconductor Manufacturing Conference and Workshop*, pp. 394-399 (1999).

Burkhardt et al., "Reduction of Oxide Tub Isolation Stress Using a Silicon Nitride Liner," *Journal of the Electrochemical Society*, vol. 147, No. 9, pp. 3482-3486 (2000).

Chung et al., "Novel shallow trench isolation process using flowable oxide CVD for sub-100nm DRAM," *IEEE International Electron Devices Meeting Technical Digest*, pp. 233-236 (2002).

Currie et al., "Controlling threading dislocation densities in Ge on Si using graded SiGe layers and chemical—mechanical polishing," *Applied Physics Letters*, vol. 72, No. 14, pp. 1718-1720 (1998).

Davari et al., "A Variable-Size Shallow Trench Isolation (STI) Technology with Diffused Sidewall Doping for Submicron CMOS," *IEEE International Electron Devices Meeting Technical Digest*, pp. 92-95 (1988).

Dombrowski et al., "Determination of Stress in Shallow Trench Isolation for Deep Submicron MOS Devices by UV Raman Spectroscopy," *IEEE International Electron Devices Meeting Technical Digest*, pp. 357-360 (1999).

En et al., "Redduction of STI/active Stress on 0.18um SOI Devices Through Modification of STI Process," *Proceedings of the 2001 IEEE International SOI Conference*, pp. 85-86 (2001).

Gannavaram, et al., "Low Temperature (≦800° C.) Recessed Junction Selective Silicon-Germanium Source/Drain Technology for sub-70 nm CMOS," *IEEE International Electron Device Meeting Technical Digest*, (2000), pp. 437-440.

Gardeniers et al., "LPCVD silicon-rich silicon nitride films for applications in micromechanics, studied with statistical experimental design," *Journal of Vacuum Science and Technology of America*, vol. 14, No. 5, pp. 2879-2892 (1996).

Ge et al., "Process-Strained Si (PSS) CMOS Technology Featuring 3D Strain Engineering," *IEEE International Electron Devices Meeting Technical Digest*, pp. 73-76 (2003).

Ghani et al., "A 90nm High Volume Manufacturing Logic Technology Featuring Novel 45nm Gate Length Strained Silicon CMOS Transistors," *IEEE International Electron Devices Meeting Technical Digest*, (2003), 978-980.

Gopinath et al., "STI Stress-Induced Increase in Reverse Bias Junction Capacitance," *IEEE Electron Device Letters*, vol. 23, No. 6, pp. 312-314 (2002).

Gunde et al., "The relationship between the macroscopic properties of PECVD silicon nitride and oxynitride layers and the characteristics of their networks," *Applied Physics A*, vol. 74, pp. 181-186 (2002).

Habermehl, "Stress relaxation in Si-rich silicon nitride thin films," *Journal of Applied Physics*, vol. 83, No. 9, pp. 4672-4677 (1998).

Hamada et al., "A New Aspect of Mechanical Stress Effects in Scaled MOS Devices," *IEEE Transactions on Electron Devices*, vol. 38, No. 4, pp. 895-900 (1991).

Heo et al., "Void Free and Low Stress Shallow Trench Isolation Technology using P-SOG for sub 0.1 um Device," *2002 Symposium on VLSI Technology Digest of Technical Papers*, pp. 132-133 (2002).

Hu, "Stress from isolation trenches in silicon substrates," *Journal of Applied Physics*, vol. 67, No. 2, pp. 1092-1101 (1990).

Huang et al., "Isolation Process Dependence of Channel Mobility in Thin-Film SOI Devices," *IEEE Electron Device Letters*, vol. 17, No. 6 (Jun. 1996), pp. 291-293.

Huang et al., "LOCOS-Induced Stress Effects on Thin-Film SOI Devices," *IEEE Transactions on Electron Devices*, vol. 44, No. 4 (Apr. 1997), pp. 646-650.

Huang, et al., "Reduction of Source/Drain Series Resistance and Its Impact on Device Performance for PMOS Transistors with Raised $Si_{1-x}Ge_x$ Source/Drain", *IEEE Electron Device Letters*, vol. 21, No. 9, (Sept. 2000) pp. 448-450.

Iida et al., "Thermal behavior of residual strain in silicon-on-insulator bonded wafer and effects on electron mobility," *Solid-State Electronics*, vol. 43 (1999), pp. 1117-1120.

International Search Report for International Patent Application No. PCT/US2004/006844, dated Oct. 26, 2004, 4 pages.

Ishimaru et al., "Mechanical Stress Induced MOSFET Punch-through and Process Optimization for Deep Submicron $TEOS-O_3$ filled STI Device," *1997 Symposium on VLSI Technology Digest of Technical Papers*, pp. 123-124 (1997).

Ito et al., "Mechanical Stress Effect of Etch-Stop Nitride and its Impact on Deep Submicron Transistor Design," *IEEE International Electron Devices Meeting Technical Digest*, pp. 247-250 (2000).

Jeon et al., "Generation of trench dislocation in 0.25um logic technology and its elimination," *Proceedings of the 6th International Conference on VLSI and CAD (ICVC 99)*, pp. 463-465 (1999).

Jeon et al., "The impact of STI mechanical stress on the device performance of 90nm technology node with different substrates and isolation processes," *Proceedings of the 2003 IEEE International SOI Conference*, pp. 164-165 (2003).

Kim et al., "High-resolution strained measurement in shallow trench isolation structures using dynamic electron diffraction," *Applied Physics Letters*, vol. 84, No. 12, pp. 2181-2183 (2004).

Kim et al., "Modeling of Cumulative Thermo-Mechanical Stress (CTMS) Produced by the Shallow Trench Isolation Process for 1Gb DRAM and beyond", *IEEE International Electron Devices Meeting Technical Digest*, pp. 145-148, (1998).

Koster et al., "Fabrication and characterisation of SiGe based In-Plane-Gate Transistors," *Microelectronic Engineering*, vol. 35, pp. 301-304 (1997).

Krivokapic et al., "Locally Strained Ultra-Thin Channel 25nm Narrow FDSOI Devices with Metal Gate and Mesa Isolation," *IEEE International Electron Devices Meeting Technical Digest*, pp. 445-448 (2003).

Lau et al., "Stability of electrical properties of nitrogen-rich, silicon-rich, and stoichiometric silicon nitride films," *Journal of Applied Physics*, vol. 66, No. 6, pp. 2765-2767 (1989).

Lee et al., "A Novel Shallow Trench Isolation Technology Using LPCVD MTO/SiN Liner in SOI Wafer," *Proceedings of the 2001 IEEE International SOI Conference*, pp. 83-84 (2001).

Lee et al., "An Optimized Densification of the Filled Oxide for Quarter Micron Shallow Trench Isolation (STI)," *1996 Symposium on VLSI Technology Digest of Technical Papers*, pp. 158-159 (1996).

Lee et al., "Low Temperature Silicon Nitride and Silicon Dioxide Film Processing by Inductively Coupled Plasma Chemical Vapor Deposition," *Journal of the Electrochemical Society*, vol. 147, No. 4, pp. 1481-1486 (2000).

Lein et al., "A Manufacturable Shallow Trench Isolation Process for sub-0.2um DRAM Technologies," *Proceedings of the IEEE/SEMI Advanced Semiconductor Manufacturing Conference and Workshop*, pp. 11-16, (2002).

Lim et al., "The Effects of STI Process Parameters on the Integrity of Dual Gate Oxides," *Proceedings of the 39th Annual International Reliability Physics Symposium*, pp. 48-51.

Loboda et al., "Chemical influence of inert gas on the thin film stress in plasma-enhanced chemical vapor deposited α-SiN : H films," *Journal of Materials Research*, vol. 11, No. 2, pp. 391-398 (1996).

Lochtefeld et al., "Investigating the Relationship Between Electron Mobility and Velocity in Deeply Scaled NMOS via Mechanical Stress," *IEEE Electron Device Letters*, vol. 22, No. 12 (2001), pp. 591-593.

Luoh et al., "Stress Release for Shallow Trench Isolation by Single-Wafer, Rapid-Thermal Steam Oxidation," *Proceedings of the 10th IEEE International Conference on Advanced Thermal Processing of Semiconductors (RTP 2002)*, pp. 111-118 (2002).

Miyamoto et al., "Impact of Reducing STI-Induced Stress on Layout Dependence of MOSFET Characteristics," *IEEE Transactions on Electron Devices*, vol. 51, No. 3, pp. 440-443 (2004).

Miyano et al., "Facet-Free Si Selective Epitaxial Growth Adaptive to Elevated Source/Drain MOSFETs with Narrow Shallow Trench Isolation," *Japanese Journal of Applied Phyics*, vol. 38, pp. 2419-2423 (1999).

Nandakumar et al., "Shallow Trench Isolation for advanced ULSI CMOS Technologies," *IEEE International Electron Devices Meeting Technical Digest*, pp. 133-136 (1998).

Nouri et al., "A Manufacturable Shallow Trench Isolation process for 0.18um and beyond—optimization, stress reduction and electrical performance," *Proceedings of the IEEE/SEMI Advanced Semiconductor Manufacturing Conference and Workshop*, pp. 413-418 (1998).

Ootsuka et al., "A Highly Dense, High-Performance 130nm node CMOS Technology for Large Scale System-on-a-Chip Applications," *IEEE International Electron Devices Meeting Technical Digest*, pp. 575-578 (2000).

Ota et al., "Novel Locally Strained Channel Technique for High Performance 55nm CMOS," *IEEE International Electron Devices Meeting Technical Digest*, pp. 27-30 (2002).

Öztürk, et al., "Advanced $Si_{1-x}Ge_x$ Source/Drain and Contact Technologies for Sub-70 nm CMOS," *IEEE International Electron Device Meeting Technical Digest*, (2002), pp. 375-378.

Öztürk, et al., "Low Resistivity Nickel Germanosilicide Contacts to Ultra-Shallow $Si_{1-x}Ge_x$ Source/Drain Junctions for Nanoscale CMOS," *IEEE International Electron Device Meeting Technical Digest* (2003), pp. 497-500.

Öztürk, et al., "Selective Silicon-Gremanium Source/Drain Technology for Nanoscale CMOS," *Mat. Res. Soc. Symp. Proc.*, vol. 717, (2002), pp. C4.1.1-C4.1.12.

Öztürk, et al., "Ultra-Shallow Source/Drain Junctions for Nanoscale CMOS Using Selective Silicon-Germanium Technology," *Extended Abstracts of International Workshop on Junction Technology*, (2001), pp. 77-82.

Park et al., "Correlation between Gate Oxide Reliability and the Profile of the Trench Top Corner in Shallow Trench Isolation (STI)," *IEEE International Electron Devices Meeting Technical Digest*, pp. 747-750 (1996).

Park et al., "Stress Minimization in Deep Sub-Micron Full CMOS Devices by Using an Optimized Combination of the Trench Filling CVD Oxides," *IEEE International Electron Devices Meeting Technical Digest*, pp. 669-672 (1997).

Pyi et al., "Roles of Sidewall Oxidation in the Devices with Shallow Trench Isolation," *IEEE Electron Device Letters*, vol. 20, No. 8, pp. 384-386 (1999).

Saino et al., "Control of Trench Sidewall Stress in Bias ECR-CVD Oxide-Filled STI for Enhanced DRAM Data Retention Time," *IEEE International Electron Devices Meeting Technical Digest*, pp. 149-152 (1998).

Scott et al., "NMOS Drive Current Reduction Caused by Transistor Layout and Trench Isolation Induced Stress," *IEEE International Electron Devices Meeting Technical Digest*, pp. 827-830 (1999).

Sekimoto et al., "Silicon nitride single-layer x-ray mask," *Journal of Vacuum Science and Technology*, vol. 21, No. 4, pp. 1017-1021 (1982).

Sheu et al., "Impact of STI Mechanical Stress in Highly Scaled MOSFETs," *Proceedings of the 2003 International Symposium on VLSI Technology, Systems, and Applications*, pp. 76-79 (2003).

Sheu et al., "Study on STI Mechanical Stress Induced Variations on Advanced CMOSFETs," *Proceedings of the IEEE International Conference on Microelectronic Test Structures*, pp. 205-208 (2003).

Shimizu et al., "Local Mechanical-Stress Control (LMC): A New Technique for CMOS-Performance Enhancement," *IEEE International Electron Devices Meeting Technical Digest*, pp. 433-436 (2001).

Shiozawa et al., "Impact of STI Stress on the Junction Characteristics," *Extended Abstracts of the International Workshop on Junction Technology (IWJT)*, pp. 19-20 (2001).

Sleight et al., "Stress Induced Defects and Transistor Leakage for Shallow Trench Isolated SOI," *IEEE Electron Device Letters*, vol. 20, No. 5, pp. 248-250 (1999).

Smeys, et al., "The influence of oxidation-induced stress on the generation current and its impact on scaled device perfromance," *IEEE International Electron Devices Meeting Technical Digest*, pp. 709-712 (1996).

Steegen et al., "Silicide and Shallow Trench Isolation line width dependent stress induced junction leakage," *2000 Symposium on VLSI Technology Digest of Technical Papers*, pp. 180-181 (2000).

Stiffler et al., "Oxidation-Induced Defect Generation in Advanced DRAM Structures," *IEEE Transactions on Electron Devices*, vol. 37, No. 5, pp. 1253-1258 (1990).

Su et al., "A Scaleable Model for STI Mechanical Stress Effect on Layout Dependence of MOS Electrical Characteristics," *Proceedings of the IEEE 2003 Custom Integrated Circuits Conference*, pp. 245-248 (2003).

Thompson et al., "A 90 nm Logic Technology Featuring 50nm Strained-Silicon Channel Transistors, 7 layers of Cu *Interconnects*, Low k ILD, and L um$^2$ SRAM Cell," *IEEE International Electron Devices Meeting Technical Digest*, (2002), pp. 61-64.

Thompson et al., "A Logic Nanotechnology Featuring Strained-Silicon," *IEEE Electron Device Letters*, vol. 25, No. 4 (Apr. 2004), pp. 191-193.

Tiwari et al., "Hole Mobility Improvement in Silicon-on-Insulator and Bulk Silicon Transistors Using Local Strain," *IEEE International Electron Devices Meeting Technical Digest*, pp. 939-941 (1997).

Uchino, et al., "A Raised Source/Drain Technology Using In-situ P-doped SiGe and B-doped Si for 0.1-μm CMOS ULSIs," *IEEE International Electron Device Meeting Technical Digest*, (1997), pp. 479-482.

uz Zaman et al., "Low Cost and Room Temperature Plasma CVD Silicon Nitride Passivation," *Proceedings of the 46$^{th}$ Electronic Components and Technology Conference*, pp. 849-854 (1996).

Violette et al., "Facet-Free Selective Silicon Epitaxy by Reduced-Pressure Chemical Vapor Deposition," *Journal of The Electrochemical Society*, pp. 1895-1902 (1999).

Wolf et al., *Silicon Processing for the VLSI Era*, Lattice Press, vol. 1, pp. 182-183 and 194 (1986).

Yota et al., "A comparative study on inductively-coupled plasma high-density plasma, plasma-enhanced, and low pressure chemical vapor deposition silicon nitride films," *Journal of Vacuum Science and Technology of America*, vol. 18, No. 2, pp. 372-376 (2000).

Clark et al., "Deposition and Patterning of Tungsten and Tantalum Polycides," *Solid State Technology*, vol. 27 (1984) pp. 235-242.

Communication pursuant to Article 96(2) EPC for European Patent Application No. 02 749 559.7-1235 (Aug. 16, 2004).

Communication pursuant to Article 96(2) EPC for European Patent Application No. 02 749 559.7-1235 (May 27, 2005).

uz Zaman et al., "Low Cost and Room Temperature Plasma CVD Silicon Nitride Passivation," *Proceedings of the 46$^{th}$ Electronic Components and Technology Conference*, pp. 849-854 (1996).

Rim et al., Characteristics and Device Design of Sub-100 nm Strained Si N- and PMOSFETs, 2002 Symp. on VLSI Tech. Digest Tech. Papers 98.

Aoki et al, "Optimum Crystallographic Orientation of Submicron CMOS Devices," 1985 IEDM 577-580.

Bowling, "Single-Wafer Processing and Real-Time Process Control for Semiconductor Integrated Circuit Manufacturing," 1994 Int'l Symp. on Semiconductor Manufacturing, pp. 31-33.

Chau, "A 50 nm Depleted-Substrate CMOS Transistor (DST)," 2001 IEDM 621-624.

Request for Ex Parte Reexamination of U.S. Patent No. 7,122,449, Oct. 17, 2006.

Saddow et al., "Lateral Epitaxial Overgrowth and Pendeo Epitaxy of 3C-SiC on Si Substrates," 1999 Int'l Conf. on SiC and Related Materials.

AmberWave Systems Corporation's Responses to Intel's Second Set of Requests for Production, U.S.D.C., District of Delaware, C.A. No. 05-301-KAJ, (Feb. 3, 2006).

AmberWave Systems Corporation's Responses to Intel's Third Set of Interrogatories, U.S.D.C., District of Delaware, C.A. No. 05-301-KAJ (consolidated), (Feb. 3, 2006).

AmberWave Systems Corporation's First Supplemental Responses to Intel's Third Set of Interrogatories, U.S.D.C., District of Delaware, C.A. No. 05-301-KAJ (consolidated), (Mar. 27, 2006).

AmberWave Systems Corporation's Responses to Intel's Third Set of Requests for Production, U.S.D.C., District of Delaware, C.A. No. 05-301-KAJ (consolidated), (Feb. 10, 2006).

AmberWave Systems Corporation's Responses to Intel's Fourth Set of Interrogatories, U.S.D.C., District of Delaware, C.A. No. 05-301-KAJ (consolidated), (Feb. 27, 2006).

AmberWave Systems Corporation's to Intel's Fifth Set of Requests for Production, U.S.D.C., District of Delaware, C.A. No. 05-301-KAJ (consolidated), (Jun. 30, 2006).

AmberWave Systems Corporation's Responses to Intel's Fifth Set of Interrogatories, U.S.D.C., District of Delaware, C.A. No. 05-301-KAJ (consolidated), (Jun. 19, 2006).

Intel's Responses and Objections to AmberWave's Fourth Set of Requests for Production, U.S.D.C., District of Delaware, C.A. No. 05-301-KAJ (consolidated), Aug. 17, 2006.

Abstreiter et al., "Silicon/Germanium Strained Layer Superlattices," Journal of Crystal Growth, 95:431-438 (1989).

Ahlgren et al., "A SiGe HBT BICMOS Technology for Mixed-Signal RF Applications," 1997 IEEE Bipolar/BiCMOS Circuits and Tech. Meeting 195.

Ahn et al., "Film Stress-Related Vacancy Supersaturation in Silicon Under Low-Pressure Chemical Vapor Deposited Silicon Nitride Films," 64 J. Applied Physics 4914 (1988).

AmberWave Systems Corporation's Second Supplemental Responses to Intel's Third Set of Interrogatories, U.S.D.C., District of Delaware, C.A. No. 05-301-KAJ (Jul. 12, 2006).

Antonelli et al., "Pressure and Strain Effects on Diffusion," 163 Materials Res. Soc'y Symp. Proc. 523 (1989).

Auberton-Hervé et al., "SMART CUT®: The Basic Fabrication Process for UNIBOND® SOI Wafers," IEICE Transactions on Electronics, E80-C(3):358-363 (1997).

Augendre et al., "Elevated Source/Drain by Sacrificial Selective Epitaxy for High Performance Deep Submicron CMOS: Process Window Versus Complexity," 47 IEEE Transactions on Electron Devices 7, pp. 1484-1491 (2000).

Badenes et al, "A High Performance 0.18 μm CMOS Technology Designed for Manufacturability," 1997 Proc. 27th European Solid-State Device Res. Conf. 404.

Badenes et al., "Optimization of Critical Parameters in a Low Cost, High Performance Deep Submicron CMOS Technology," 1999 Proc. 29th European Solid-State Device Res. Conf. 628.

Borland et al., "Low Temperature Low Pressure Silicon Epitaxial Growth and Its Application to Advanced Dielectric Isolation Technology," 1986 Extended Abstracts 18th Int'l Conf. on Solid State Devices and Materials 53 (1986).

Borland, "Novel Device Structures by Selective Epitaxial Growth (SEG)," 1987 IEDM Tech. Dig. 12.

C. Carter et al., "Residual Defects Following Rapid Thermal Annealing of Shallow Boron and Boron Fluoride Implants into Preamorphized Silicon," 44 Applied Physics Letters 459 (1984).

Carns et al, "Hole Mobility Measurements in Heavily Doped $Si_{1-x}Ge_x$ Strained Layers," 41 IEEE Transactions on Electron Devices 1273 (1994).

Chau et al., "Advanced CMOS Transistors in the Nanotechnology Era for High-Performance, Low-Power Logic Applications," pp. 26-30 (2004).

Cowern et al., "Diffusion in Strained Si(Ge)," 72 Physical Review Letters 2585 (1994).

Cressler, "SiGe HBT Technology: A New Contender for Si-Based RF and Microwave Circuit Applications," 46 IEEE Transactions on Microwave Theory and Tech. 572 (1998).

Czaja, "Conditions for the Generation of Slip by Diffusion of Phosphorus into Silicon," 37 J. App. Physics 3441 (1966).

Daembkes et al., "The N-Channel SiGe/Si Modulation-Doped Field-Effect Transistor," 33 IEEE Transactions on Electron Devices 633 (1986).

Eichinger et al., "Characterization of MBE Growth SiGe Superlattices with SIMS and RBS," Proceedings of the First International Symposium on Silicon Molecular Beam Epitaxy, 85(7):367-375 (1985).

Endo et al., "Novel Device Isolation Technology with Selective Epitaxial Growth," 1982 Int'l Electron Devices Meeting Tech. Dig. 241.

Endo et al., "Scaled CMOS Technology Using SEG Isolation and Buried Well Process," 33 IEEE Transactions on Electron Devices 1659 (1986).

Examination Report for European Patent Application No. 01 973 651.1-1528, dated Nov. 12, 2004, 9 pages.

Examination Report for European Patent Application No. 01 973 651.1-1528, dated Mar. 22, 2004, 3 pages.

Examination Report for European Patent Application No. 01 989 893.1-1235, dated Aug. 16, 2004, 5 pages.

Examination Report for European Patent Application No. 02 709 406.9-2203, dated Mar. 24, 2005, 5 pages.

Examination Report for European Patent Application No. 02 709 406.9-2203, dated May 11, 2004, 3 pages.

Examination Report for European Patent Application No. 98 931 529.6-2203, dated Jan. 10, 2002, 4 pages.

Examination Report for European Patent Application No. 98 931 529.6-2203, dated May 9, 2003, 5 pages.

Fahey et al., "Point Defects and Dopant Diffusion in Silicon," 61 Reviews of Modern Physics 289 (1989).

Fair, "Concentration Profiles of Diffused Dopants in Silicon," in Impurity Doping Processes in Silicon, Chapt. 7, pp. 318-442 (1981).

Fair, "Quantified Conditions for Emitter-Misfit Dislocation Formation in Silicon," Journal of the Electrochemical Society, 125(6):923-926 (1978).

Fair, "Boron Diffusion in Silicon-Concentration and Orientation Dependence, Background Effects and Profile Estimation," 122 J. Electrochemical Soc'y 800 (1975).

Fathy et al., "Formation of epitaxial layers of Ge on Si substrates by Ge implantation and oxidation," Applied Physics Letters, 51(17):1337-1339 (1987).

Fitch, "Selectively Mechanisms in Low Pressure Selective Epitaxial Silicon Growth," 141 J. Electrochemical Soc'y 1046 (1994).

Fitzgerald et al., "Dislocations in Relaxed SiGe/Si Heterostructures," Phys. Stat. Sol. A, Applied Research, Berlin, De, vol. 171, Nr. 1, pp. 227-238 (1999).

Fuller et al., "Diffusion of Donor and Acceptor Elements in Silicon," 27 J. Applied Physics 544 (1956).

Gaworzewski et al., "Electrical Properties of Lightly Doped P-Type Silicon-Germanium Single Crystals," 83 J. App. Physics 5258 (1998).

Ghani et al., "Effect of oxygen on minority-carrier lifetime and recombination currents in Si1-xGex heterostructure devices," Applied Physics Letters, 58(12):1317-1319 (1991).

Gibbons et al., "Limited reaction processing: Silicon epitaxy," Applied Physics Letters, 47(7):721-723 (1985).

Godbey et al., "A $Si_{0.7}Ge_{0.3}$ Strained Layer Etch Stop for the Generation of Bond and Etch Back SOI," IEEE SOS/SOI Tech. Conf. Proc., pp. 143-144 (1989).

Goo et al., "Scalability of Strained-Si nMOSFETs Down to 25 nm Gate Length," 24 IEEE Electron Device Letters 351 (2003).

Gronet et al., "Growth of GeSi/Si strained-layer superlattices using limited reaction processing," 61 J. App. Physics 6, pp. 2407-2409 (1987).

Gwoziecke et al., "Suitability of Elevated Source/Drain for Deep Submicron CMOS," 1999 Proc. 29th European Solid-State Device Res. Conf. 384.

Harame et al., "A High-Performance Epitaxial SiGe-Base ECL BiCMOS Technology," 1992 Int'l Electron Devices Meeting Tech. Dig. 19.

Hobart et al., "Ultra-cut: A Simple Technique for the Fabrication of SOI Substrates with Ultra-Thin (<5 nm) Silicon Films," Proceedings 1998 IEEE International SOI Conference, pp. 145-146 (1998).

Holländer et al., "Reduction of Dislocation Density of MBE-Grown $Si_{1-x}Ge_x$ Layers on (100) Si by Rapid Thermal Annealing," Thin Solid Films, 183: 157-164 (1989).

Hopkins et al., "Enhanced Diffusion in Boron Implanted Silicon," 132 Journal of the Electrochemical Society 2035 (1985).

Hu et al., "Channel and Source/Drain Engineering in High-Performance Sub-0.1 um NMOSFETs Using X-Ray Lithography," 1994 Symp. On VLSI Technology, Digest of Technical Papers 17.

Huang et al., "SiGe-on-insulator prepared by wafer bonding and layer transfer for high-performance field-effect transistors," Applied Physics Letters, 78(9):1267-1269 (2001).

Huang et al., "N-Channel MOS Transistors Below 0.5 μm with Ultra-Shallow Channels Formed by Low Temperature Selective Silicon Epitaxy," 387 Materials Res. Soc'y Symp. Proc. 347 (1995).

Hull et al., "Structural Studies of GeSi/Si Heterostructures," Proc. First Int'l Symp. on Silicon Molecular Beam Epitaxy, 85(7):376-384 (1985).

Intel's Amended and Supplemented Responses and Objections to AmberWave's Second Set of Interrogatories, U.S.D.C., District of Delaware, C.A. No. 05-301-KAJ, Aug. 7, 2006.

Intel's Responses and Objections to AmberWave's Second Set of Interrogatories, U.S.D.C., District of Delaware, C.A. No. 05-301-KAJ, Feb. 3, 2006.

Intel's Responses and Objections to AmberWave's Second Set of Requests for Production, U.S.D.C., District of Delaware, C.A. No. 05-301-KAJ, Feb. 3, 2006.

International Search Report for International Patent Application No. PCT/US02/03688, dated May 7, 2002, 4 pages.

International Search Report for International Patent Application No. PCT/US03/19528, dated Sep. 23, 2003, 4 pages.

International Search Report for Patent Application No. PCT/US 98/13076, dated Oct. 27, 1998, 4 pages.

Ishitani et al., "Local Loading Effect in Selective Silicon Epitaxy," 23 Japanese J. Applied Physics L391 (1984).

Ismail et al., "Extremely high electron mobility in Si/SiGe modulation-doped heterostructures," Applied Physics Letters, 66(9):1077-1079 (1995).

Ismail et al., "Gated Hall effect measurements in high-mobility n-type Si/SiGe modulation-doped heterostructures," Applied Physics Letters, 66(7):842-844 (1995).

Ismail et al., "Identification of a Mobility-Limiting Scattering Mechanism in Modulation-Doped Si/SiGe Heterostructures," Physical Review Letters, 73(25):3447-3452 (1994).

Jain et al., "Theoretical Calculations of the Fermi Level and of Other Parameters in Phosphorous Doped Silicon at Diffusion Temperatures," 21 IEEE Transactions on Electron Devices 155 (1974).

Kasper, "Growth and Properties of Si/SiGe Superlattices," Surface Science, 174:630-639 (1986).

Kato, "The Annealing Time and Temperature Dependence of Electrical Dopant Activation in High-Dose $BF_2$ Ion Implanted Silicon," 141 Journal of the Electrochemical Society 3158 (1994).

Kim et al., "Properties of c-Axis-Oriented Freestanding GaN Substrates Prepared on Fused Silica Glass by Hydride Vapor Phase Epitaxy," 33 J. Korean Physical Society L1 (1998).

King et al., "Si/$Si_{1-x}Ge_x$ Heterojunction Bipolar Transistors Produced by Limited Reaction Processing," 10 IEEE Electron Device Letters 52 (1989).

Kiatjima et al., "Crystalline Defects in Selectively Epitaxial Silicon Layers," 22 Japanese J. Applied Physics L783 (1983).

Klauk et al., "Thermal stability of undoped strained Si channel SiGe heterostructures," Applied Physics Letters, No. 68, pp. 1975-1977 (Apr. 1996).

Ku et al., "High Performance pMOSFETs with $Ni(Si_xGe_{1-x})$/Poly-$Si_{0.8}Ge_{0.2}$ Gate," Symp. on VLSI Tech., Dig. Tech. Papers 114.

Kuo, et al., "Effects of Strain on Boron Diffusion in Si and $Si_{1-x}Ge_x$," 66 Applied Physics Letters 580 (1995).

Lee et al., "High Quality Thin Epitaxial Silicon Layers Deposited Selectively by Rapid Thermal Processing," 1989 Proc. Second Int'l Symp on Ultra Large Scale Integration Sci. Tech. 233.

Loechelt et al., "Measurement and Modeling of Boron Diffusion in Si and Strained $Si_{1-x}Ge_x$ Epitaxial Layers During Rapid Thermal Annealing," 74 J. App. Physics 5520 (1983).

Lunnon et al., "Furnace and Rapid Thermal Annealing of P+/n Junctions in $BF_{2+}$-Implanted Silicon," 132 Journal Electrochemical Soc'y 2473 (1985).

Maleville et al., "Physical Phenomena Involved Involved in the Smart-Cut® Process," Electrochemical Soc'y Proc., 96(3):34-46 (1996).

Maseeh et al., "Plastic Deformation of Highly Doped Silicon," A21-A23 Sensors & Actuators 861 (1990).

Mazuré et al., "Facet Engineered Elevated Source/Drain by Selective Si Epitaxy for 0.35 Micron MOSFETS," 1992 IEDM Tech. Dig. 853.

Mehregany et al., "Anisotropic Etching of Silicon in Hydrazine," 13 Sensors and Actuators 375 (1988).

Meyerson, "Low-Temperature Silicon Epitaxy by Ultrahigh Vacuum/Chemical Vapor Deposition," 48 Applied Physics Letters 797 (1986).

Mieno et al., "Selective Doped Polysilicon Growth," 134 J. Electrochemical Soc'y 11, pp. 2862-2867 (1987).

Mirabedini et al., "Submicrometre Elevated Source and Drain MOSFET Technology Using E-Beam Evaporated Silicon," 33 Electronics Letters 1183 (1997).

Mistry et al., "Delaying Forever: Uniaxial Strained Silicon Transistors in a 90nm CMOS Technology," Symp. on VLSI Tech. Dig. Tech. Papers, pp. 50-51 (2004).

Miyake et al., "Transient Enhanced Diffusion of Ion-Implanted Boron in Si During Rapid Thermal Annealing," 63 J. App. Physics 1754 (1988).

Miyauchi et al., "Low-Temperature (850° C) Silicon Selective Epitaxial Growth on HF-Treated Si (100) Substrates Using SiH4-HCl-H2 Systems," 138 J. Electrochemical Soc'y 3480 (1991).

Mizuo et al., "Anomalous Diffusion of B and P in Si Directly Masked with $Si_3N_4$," 21 Japanese J. App. Physics 281 (1982).

Monroe et al., "Comparison of mobility-limiting mechanisms in high-mobility Si1-xGex heterostructures," J. Vac. Sci. Technol. B, 11(4):1731-1737 (1993).

Moriya et al., "Boron Diffusion in Strained $Si_{1-x}Ge_x$ Epitaxial Layers," 71 Physical Review Letters 883 (1993).

Moriya et al., "Doping and Electrical Characteristics of In Situ Heavily B-Doped $Si_{1-x}Ge_x$ Films Epitaxially Grown Using Ultraclean LPCVD," 343-344 Thin Solid Films 541 (1999).

Moslehi et al., "Single-Wafer Integrated Semiconductor Device Processing," 39 IEEE Transactions on Electron Devices 4 (1992).

Murota et al., "CVD $Si_{1-x}Ge_x$ Epitaxial Growth and Its Doping Control," 27 J. Japanese Ass'n for Crystal Growth 171 (2000).

Nakahara et al., "Ultra-Shallow In-Situ-Doped Raised Source/Drain Structure for Sub-Tenth Micron CMOS," 1996 Symp. on VLSI Tech., Dig. Tech. Papers 174.

Noble et al., "Reduction in misfit dislocation density by the selective growth of $Si_{1-x}Ge_x/Si$ in small areas," Applied Physics Letters, 56(1):51-53 (1990).

Noda et al., "Doping and Electrical Characteristics of In-Situ Heavily B-Doped $Si_{1-x-y}Ge_xC_y$ Films Epitaxially Grown Using Ultraclean LPCVD," 380 Thin Solid Films 57 (2000).

Noh et al., "Contact Resistivity Between Tungsten and Impurity (P and B)-doped $Si_{1-x-y}Ge_xC_y$ Epitaxial Layer," 212-213 Applied Surface Sci. 679 (2003).

Notice of Final Rejection for Korean Patent Application No. 10-1999-7012279, dated Feb. 25, 2003, 2 pages (English translation attached).

Notice of Preliminary Rejection for Korean Patent Application No. 10-1999-7012279, dated Feb. 21, 2002, 2 pages (English translation attached).

Park et al., "Analysis of Ion-Implanted Amorphous and Polycrystalline Silicon Films as Diffusion Sources for Ultrashallow Junctions," 70 J. App. Physics 1397 (1991).

Patton et al., "Silicon-Germanium-Base Heterojunction Bipolar Transistors by Molecular Beam Epitaxy," 9 IEEE Electron Device Letters 165 (1988).

Pfiester et al., "Anomalous Co-Diffusion Effects of Germanium on Group III and V Dopants in Silicon," 52 Applied Physics Letters 471 (1988).

Powell, "Activation of Shallow, High-Dose $BF_{230}$ Implants into Silicon by Rapid Thermal Processing," 56 J. App. Physics 2837 (1984).

Prinz et al., "The Effect of Base-Emitter Spacers and Strain Dependent Densities of States in $Si/Si_{1-x}Ge_x/Si$ Heterojunction Bipolar Transistors," 1989 IEDM Tech. Dig. 639.

Prinz et al., "The Effects of Base Dopant Outdiffusion and Undoped $Si_{1-x}Ge_x$ Junction Spacer Layers in $Si/Si_{1-x}Ge_x/Si$ Heterojunction Bipolar Transistors," 12 IEEE Electron Device Letters 42 (1991).

Rim et al., "Low Field Mobility Characteristics of Sub-100 nm Unstrained and Strained Si MOSFETs," 2002 IEDM Tech. Dig. 43.

Rim et al., "Strained Si NMOSFETs for High Performance CMOS Technology," 2001 Symp. on VLSI Tech., Dig. Tech. Papers 59.

Rodrigues et al., "Strain Compensation by Heavy Boron Doping in $Si_{1-x}Ge_x$ Layers Grown by Solid Phase Epitaxy," 12 J. Materials Res. 1698 (1997).

Rosenblad et al., "Strain relaxation of graded SiGe buffers grown at very high rates," Materials Science and Engineering, B71 pp. 20-23 (2000).

Ryssel et al., "High Concentration Effects on Ion Implanted Boron in Silicon," 22 Applied Physics 35 (1980).

Schumann et al., "Impact of Elevated Source/Drain on the Reverse Short Channel Effect," 1999 Proc. 29th European Solid-State Device Res. Conf. 572.

Schäffler, "Letter to the Editor, High-electron-mobility Si/SiGe heterostructures: influence of the relaxed SiGe buffer layer," Semicond. Sci. Technol., 7:260-266 (1992).

Shifren et al., "Drive current enhancement in p-type metal-oxide-semiconductor field-effect transistors under shear uniaxial stress," Applied Physics Letters, 85(25):6188-6190 (2004).

Simard-Normandin, "Electrical Characteristics and Contact Resistance of $B^+$- and $BF_{2+}$- Implanted Silicon Diodes with Furnace and Rapid Thermal Annealing," 32 IEEE Transactions on Electron Devices 1354 (1985).

Solmi et al., "High-Concentration Boron Diffusion in Silicon: Simulation of the Precipitation Phenomena," 68 J. App. Physics 3250 (1990).

Song et al., "Facet Formation in Selectively Overgrown Silicon by Reduced Pressure Chemical Vapor Deposition," 1998 Dig. Papers Microprocesses and Nanotechnology 240.

Stach et al., "Anomalous Boron Diffusion in Silicon from Planar Boron Nitride Sources," 121 J. Electrochemical Soc'y 722 (1974).

Stivers et al., "Growth Condition Dependence of SEG Planarity and Electrical Characteristics," 1987 Proc. Tenth Int'l Conf. on Chemical Vapor Deposition 389.

Subbanna et al., "How SiGe Evolved into a Manufacturable Semiconductor Production Process," IEEE International Solid-State Circuits Conference, pp. 56, 67, 446 (1999).

Sugiyama et al., "Formation of strained-silicon layer on thin relaxed-SiGe/SiO2/Si structure using SIMOX technology," Thin Solid Films, 369:199-202 (2000).

Sun et al., "Elevated $n^+/p$ Junctions by Implant into $CoSi_2$ Formed on Selective Epitaxy for Deep Submicron MOSFET's," 45 IEEE Transactions on Electron Devices 1946 (1998).

Sun et al., "Parasitic Resistance Considerations of Using Elevated Source/Drain Technology for Deep Submicron Metal Oxide Semiconductor Field Effect Transistors," 145 J. Electrochemical Soc'y 2131 (1998).

Suzuki et al., "Effects of Si-Ge Buffer Layer for Low-temperature Si Epitaxial Growth on Si Substrate by RF Plasma Chemical Vapor Deposition," 54 J. App. Physics 1466 (1983).

Tanno et al., "Selective Silicon Epitaxy Using Reduced Pressure Technique," 21 Japanese J. Applied Physics L564 (1982).

Taraschi et al., "Relaxed SiGe on Insulator Fabricated via Wafer Bonding and Layer Transfer: Etch-Back and Smart-Cut Alternatives," 2001-3 Electrochemical Soc'y Proc. pp. 27-32 (2001).

Taraschi et al., "Relaxed SiGe-on-insulator fabricated via wafer bonding and etch back," J. Vac. Sci. Technol. B, 20(2):725-727 (2002).

Taraschi et al., "Strained-Si-on-Insulator (SSOI) and SiGe-on-Insulator (SGOI): Fabrication Obstacles and Solutions," Mat. Res. Soc. Symp. Proc., 745:105-110 (2003).

Tsai et al., "Recrystallization of Implanted Amorphous Silicon Layers. I. Electrical Properties of Silicon Implanted with $BF^+2$ or $Si^+ + B^{+a}$)," 50 J. App. Physics 183 (1979).

van Dort et al., "Influence of High Substrate Doping Levels on the Threshold Voltage and the Mobility of Deep-Submicrometer MOSFET's," 39 IEEE Transactions on Electron Devices 932 (1992).

van Meer et al., "High Performance Raised Gate/Source/Drain Transistors for Sub-0.15 µm CMOS Technologies," 1999 Proc. 29th European Solid-State Device Res. Conf. 388.

van Oostrum et al., "Characterization of Epitaxial Layers by the Depth Dependence of Boron Diffusivity," 61 Applied Physics Letters 1513 (1992).

Waite et al., "A Novel Deep Submicron Elevated Source/Drain MOSFET," pp. 148-151.

Walker et al., "Shallow Boron Junctions and Preamorphization for Deep Submicron Silicon Technology," 73 J. App. Physics 4048 (1993).

Wang, "Identification and Measurement of Scaling-Dependent Parasitic Capacitances of Small-Geometry MOSFETs," 43 IEEE Transactions on Electron Devices 965 (1996).

Weldon et al., "Raised Source-Drains Using Selective Silicon Depostition for Sub-Half Micron CMOS Devices," 94-2 Extended Abstracts Fall Meeting Electrochemical Soc'y 756 (1994).

Wong, "Beyond the Conventional Transistor," 46 IBM J. Res. & Dev. 133 (2002).

Yamakawa et al., "Drivability Improvement on Deep-Submicron MOSFET's by Elevation of Source/Drain Regions," 20 IEEE Electron Device Letters 366 (1999).

Yeo et al., "Nanoscale Ultra-Thin-Body Silicon-on-Insulator P-MOSFET with a SiGe/Si Heterostructure Channel," 21 IEEE Electron Device Letters 4, pp. 161-163 (2000).

Notice of Preliminary Rejection for Korean Patent Application No. 10-2005-7016595, dated Oct. 16, 2006 (translation attached).

Office Action in People's Republic of China Patent Application No. 200480010167.0, Oct. 20, 2006 (translation attached).

* cited by examiner

SHALLOW TRENCH ISOLATION PROCESS

RELATED APPLICATION

This application is a continuation application of U.S. Ser. No. 10/794,010, filed Mar. 5, 2004, which claims the benefit of U.S. Provisional Application 60/452,794 filed Mar. 7, 2003, the entire disclosure of each of which is hereby incorporated by reference.

FIELD OF THE INVENTION

This invention relates generally to semiconductor structures and particularly to shallow trench isolation.

BACKGROUND

The formation of integrated circuits includes the definition of isolation regions to prevent parasitic current leakage between devices. Isolation techniques include the shallow trench isolation (STI) scheme that has increased the planarity and packing density of silicon very large scale integration (Si VLSI) devices, and has thus been the isolation scheme of choice since approximately the 0.25 micrometer (μm) technology node.

In a typical STI process, an active device area is protected by a pad oxide and a nitride overlayer, and isolation trenches are etched around the active device area. After the trench etch, a liner oxide is formed in each trench. This liner oxidation step serves several purposes. First, the oxidation eliminates any etch damage to a trench sidewall by consuming a small amount of the sidewall material. Second, the liner oxidation rounds the upper corners of the trench, minimizing the fringing fields that can result from sharp corners at the active area edge. If present, these fields form a parasitic, low-threshold voltage transistor at the active area edge that can degrade the subthreshold characteristics of the main device. Finally, because it is typically a thermal oxide, the liner oxide forms a high-quality interface between the Si trench sidewall and the deposited trench oxide. Interface traps, i.e., electrically active defects present at an oxide/semiconductor interface, are thereby minimized at this interface. The liner oxidation is often performed at high temperatures, i.e., >1000° C., and in an oxygen, i.e., dry ambient.

After the liner oxidation, a chemical vapor deposited (CVD) dielectric, such as silicon dioxide, is deposited over the entire substrate, filling the trenches. This CVD dielectric also covers the active device regions, and it should be selectively removed for device processing to continue. This is accomplished by planarizing the substrate, typically via chemical-mechanical polishing (CMP), using the silicon nitride layer over the active area as a stop layer. This process removes the dielectric from the active areas while retaining it in the isolation trenches. The nitride and pad oxide masking layers are then removed, resulting in a highly planar substrate with isolated device regions.

The formation of STI structures on silicon-germanium (SiGe) virtual substrates may be particularly challenging. SiGe virtual substrates are a platform for new generations of VLSI devices that exhibit enhanced performance in comparison to devices fabricated on bulk Si substrates. An important component of a SiGe virtual substrate is a layer of SiGe that has been relaxed to its equilibrium lattice constant, i.e., a lattice constant that is larger than that of Si. This relaxed SiGe layer may be formed directly on a Si substrate by, e.g., wafer bonding or direct epitaxy, or atop a relaxed graded SiGe layer, in which the lattice constant of the SiGe material has been increased gradually over the thickness of the layer. The SiGe virtual substrate can also incorporate buried insulating layers, echoing the structure of a semiconductor-on-insulator (SOI) wafer. In order to fabricate high-performance devices on these platforms, thin strained layers of Si, Ge, or SiGe are grown on the relaxed SiGe virtual substrates. The resulting biaxial tensile or compressive strain alters the carrier mobilities in the layers, enabling the fabrication of high speed and/or low power devices. Many issues and challenges arise when fabricating devices on SiGe rather than bulk Si substrates.

Forming an STI structure on a SiGe virtual substrate includes the etching and exposure of the underlying relaxed SiGe. Direct thermal liner oxidation of a trench etched in SiGe may be problematic and may result in a low-quality liner oxide. During liner oxidation, the Ge in the SiGe may be snowplowed ahead of an oxidation front, resulting in a pure silicon dioxide ($SiO_2$) oxide layer atop a portion of a SiGe layer that is enriched in Ge content in comparison to the SiGe bulk material. Although in this case, the oxide itself has all of the properties of oxidized Si, it is proximate a layer of SiGe with an elevated Ge content. The presence of this elevated level of Ge at this interface may result in a very high density of interface traps. These interface traps may in turn result in increased subthreshold leakage, or in a shift in threshold voltage, for the active device, and are therefore undesirable.

If a trench is relied upon to induce all of the strain in a channel, the amount of strain that can be induced in the channel is limited. Too much trench-induced strain may produce defects, leading to problems with device operation.

SUMMARY

Trench structures, as well as other strain-inducing elements, are provided to induce strain in channel regions of transistors. This strain improves the performance of transistors, particularly those fabricated with small active area dimensions.

In accordance with an aspect of the present invention, interface trap density at an interface between a liner dielectric, such as an oxide, and a trench sidewall is decreased, i.e., at the point where the trench is defined in a SiGe virtual substrate. After the trench etch process is completed, a liner dielectric is formed. For example, a liner oxidation is performed such that the Ge present in the SiGe is not snowplowed ahead of the oxidation front. Instead, the Ge is incorporated into the liner oxide, leading to a decreased interface trap density and reduced subthreshold device leakage. The liner oxidation may take place in a wet, i.e., steam ambient and/or at a low temperature, i.e., <1000° C.

Since the liner oxide contains Ge incorporated during the oxidation process, it may be more susceptible to attack by etchants used during subsequent processing, e.g., wet cleans such as hydrofluoric acid (HF) or even rinses in deionized water. To protect the liner oxide from accelerated etching, a secondary protective liner may be used. This liner, preferably a dielectric material such as silicon nitride or silicon dioxide, may be deposited conformally over the initial liner oxide. The protective liner is selected to have a lower etch rate in wet etchants, such as HF, than the liner oxide. Since it may not contain Ge and may thus be less susceptible to etchants, this protective liner may preserve the integrity of the liner oxide during subsequent process steps. After the formation of the protective liner, the STI process is then continued as for Si substrates i.e., the trench is filled with a dielectric material such as high density plasma oxide.

In accordance with this invention, the interface between the liner dielectric and the trench sidewalls has a satisfactory integrity with a low interface trap density, e.g., less than $5 \times 10^{11}/cm^2$. Additionally, transistor off-state current ($I_{off}$) is affected by the edge-leakage that occurs underneath the gate of the transistor. A low interface trap density in the portions of the STI disposed underneath the gate, therefore, is critical for obtaining a low $I_{off}$. If the interface trap density is low, as enabled by this invention, sufficient leakage current cannot flow under the transistor gate to induce a high $I_{off}$. In a transistor having a channel width of 1 μm, the $I_{off}$ may be less than $10^{-6}$ Ampere. In some embodiments, the off current may be less than $10^{-9}$ Ampere. This low device off current is achieved utilizing a novel STI process that has a large degree of process latitude. In some embodiments, because the Ge-containing liner oxide is protected by a protective liner, additional process steps will be similar to those employed in standard processes. The liner oxide's possible susceptibility to chemical attack will not place limits on subsequent process steps.

In an aspect of the invention, a masking material may be used during the formation of an STI structure, i.e., a trench structure, to induce a strain of a type different from a strain in a strained layer in which the trench structure is being defined.

In an aspect, the invention features a structure including a substrate, and a first transistor disposed over a first region of the substrate. The first transistor includes a first source region and a first drain region disposed in a first portion of the substrate, a first channel region disposed between the first source region and the first drain region, the first channel region having a first type of strain, and a first gate disposed above the first channel region and between the first source and first drain regions, the first gate including a material selected from the group of a doped semiconductor, a metal, and a metallic compound. A first trench structure is proximate at least one side of one of the first source region and the first drain region. The first trench structure induces only a portion of the first type of strain in the first channel region.

One or more of the following features may be included. A strained layer may be disposed over the substrate. The strained layer may include at least one of silicon and germanium. At least a portion of the first channel region may be disposed in the strained layer. A dielectric layer may be disposed over the substrate, and the strained layer may be disposed over and in contact with the dielectric layer. The first type of strain may be tensile. The first type of strain may be compressive. The substrate may include at least one of silicon and germanium. The substrate comprises at least one element other than silicon. The other element may be germanium.

A first cap layer may be disposed over a surface of the first transistor, and the strain in the first channel region may be induced by the first cap layer. The first cap layer may include silicon nitride. The strain in the first channel region may be induced by at least one of the first source region and the first drain region. The at least one of the first source region and the first drain region may include a second material having a larger lattice constant than a lattice constant of a semiconductor material disposed in at least one of the first channel region and an area proximate at least one of the first source region and the first drain region. The second material may include a material selected from the group including SiGe and Ge. The at least one of the first source region and the first drain region may include a second material having a smaller lattice constant than a lattice constant of a semiconductor material disposed in at least one of the first channel region and an area proximate at least one of the first source region and the first drain region. The second material may include a material selected from the group of SiGe, Si, and SiC.

The strain in the first channel region is induced by the first gate. The first gate may include material selected from the group of metal silicide, metal germanosilicide, and metal germanocide.

The structure may include a second transistor disposed over a second region of the substrate. The second transistor may include a second source region and a second drain region disposed in a second portion of the substrate, a second channel region disposed between the second source region and the second drain region, the second channel region having a second type of strain, and a second gate disposed above the second channel region and between the second source and second drain regions, the second gate including a material selected from the group of a doped semiconductor, a metal, and a metallic compound; and a second trench structure proximate at least one side of one of the second source region and the second drain region, the second trench structure inducing only a portion of the second type of strain in the second channel region. The first and second types of strain may be different.

The portion of the strain induced by the first trench structure may be approximately zero. The structure may include a first strain-inducing element, and a first epitaxial strained layer. The first channel region may be disposed within a portion of the first epitaxial strained layer and the first strain-inducing element may induce only a portion of the strain in the first channel region. The first strain-inducing element may include a first cap layer disposed over a surface of the first transistor. The first strain-inducing element may include the first gate. The first strain-inducing element may include at least one of the first source region and the first drain region.

In another aspect, the invention features a method for forming a semiconductor structure, the method including providing a substrate and forming a first transistor over a first region of the substrate. The first transistor may be formed by defining a first source region and a first drain region in a first portion of the substrate, defining a first channel region between the first source region and the first drain region, the first channel region having a first type of strain, and forming a first gate above the first channel region and between the first source and first drain regions, the first gate including a material selected from the group of a doped semiconductor, a metal, and a metallic compound. A trench structure may be formed proximate at least one side of one of the first source region and the first drain region, the first trench structure tailored to induce only a portion of the first type of strain in the first channel region.

One or more of the following features may be included. A second transistor may be formed over a second region of the substrate. The second transistor may be formed by defining a second source region and a second drain region in a second portion of the substrate, defining a second channel region between the second source region and the second drain region, the second channel region having a second type of strain, and forming a second gate above the second channel region and between the second source and second drain regions, the second gate including a material selected from the group of a doped semiconductor, a metal, and a metallic compound. A second trench structure is formed proximate at least one side of one of the second source region and the second drain region, the second trench structure tailored to induce only a portion of the second type of strain in the second channel region.

The first and second types of strain may be different. A first cap layer may be formed over a surface of the first transistor, the cap layer tailored to induce the first type of strain in the first channel region. At least a portion of the strain in the first channel region may be induced by at least one of the first source region and the first drain region. At least one of the first source region and the first drain region may include a second material having a larger lattice constant than a lattice constant of a semiconductor material disposed in at least one of the first channel region and an area proximate at least one of the first source region and the first drain region.

The at least one of the first source region and the first drain region may include a second material having a smaller lattice constant than a lattice constant of a semiconductor material disposed in at least one of the first channel region and an area proximate at least one of the first source region and the first drain region.

At least a portion of the strain in the first channel region may be induced by the first gate. The portion of the first type of strain the first trench structure is tailored to induce may be approximately zero. The first channel region may be defined in a portion of a first epitaxial strained layer.

A first strain-inducing element may be provided. The first strain-inducing element may include a first cap layer disposed over a surface of the first transistor. The first strain-inducing element may include the first gate. The first strain-inducing element may include at least one of the first source region and the first drain region.

BRIEF DESCRIPTION OF DRAWINGS

FIGS. 10a-10e are schematic plan and cross-sectional views, of a device including the semiconductor structure illustrated in FIG. 9, with FIG. 10b being taken along the line 10b-10b in FIG. 10a; FIG. 10c being taken along the line 10c-10c in FIG. 10a; and FIGS. 10d-10e illustrating the semiconductor structure of FIG. 10c after alternative processing steps.

Like-referenced features represent common features in corresponding drawings.

DETAILED DESCRIPTION

Figure 1A:
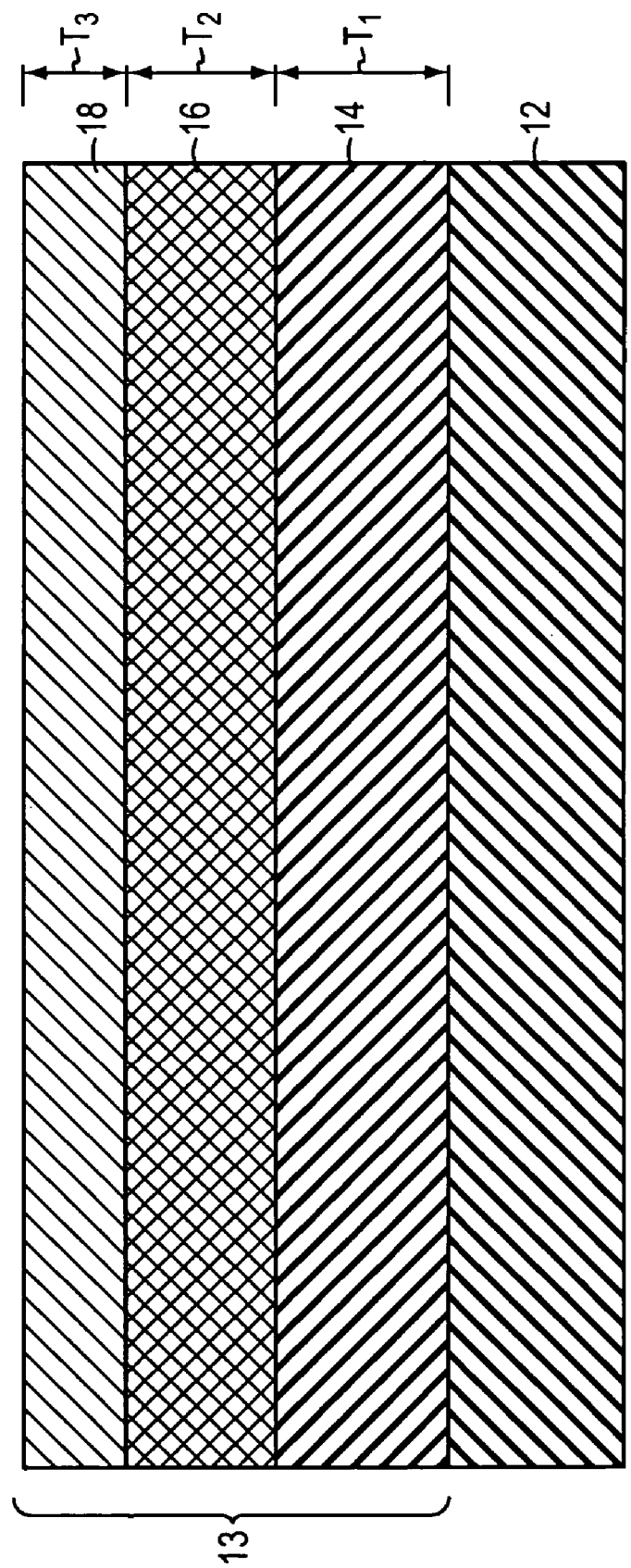
FIGS. 1-9 are a series of schematic cross-sectional views of a semiconductor structure illustrating a process for fabricating the structure.

In FIG. 1a, which illustrates a structure amenable to use in connection with the present invention, a substrate 12 is made of a semiconductor, such as Si, Ge, or SiGe. A plurality of layers collectively indicated as 13 are formed on substrate 12. The plurality of layers 13 may include a relaxed graded buffer layer 14 disposed over substrate 12. Graded layer 14 includes, for example, SiGe having a grading rate of, for example, 10% Ge per μm of thickness, and a thickness $T_1$ of, for example, 1-9 μm.

A relaxed layer 16 is disposed over graded SiGe layer 14. Relaxed layer 16 contains, for example, $Si_{1-x}Ge_x$ wherein $0.1 \leq x \leq 0.9$ and has a thickness $T_2$ of, e.g., 0.2-2 μm. In some embodiments, $Si_{1-x}Ge_x$ may include $Si_{0.70}Ge_{0.30}$ and $T_2$ may be approximately 1.5 μm. Relaxed layer 16 may be substantially or fully relaxed, as determined by triple axis X-ray diffraction, and may have a threading dislocation density of $<1 \times 10^6$ dislocations/$cm^2$, as determined by etch pit density (EPD) analysis. Because threading dislocations are linear defects disposed within a volume of crystalline material, threading dislocation density may be measured as either the number of dislocations intersecting a unit area within a unit volume or the line length of dislocation per unit volume. Threading dislocation density therefore, may be expressed in either units of dislocations/$cm^2$ or $cm/cm^3$. Relaxed layer 16 may have a surface particle density of, e.g., less than about 0.3 particles/$cm^2$. Further, relaxed layer 16 may have a localized light-scattering defect level of less than about 0.3 defects/$cm^2$ for particle defects having a size (diameter) greater than 0.13 μm, a defect level of about 0.2 defects/$cm^2$ for particle defects having a size greater than 0.16 μm, a defect level of about 0.1 defects/$cm^2$ for particle defects having a size greater than 0.2 μm, and a defect level of about 0.03 defects/$cm^2$ for defects having a size greater than 1 μm. Process optimization may enable reduction of the localized light-scattering defect levels to about 0.09 defects/$cm^2$ for particle defects having a size greater than 0.09 μm and to 0.05 defects/$cm^2$ for particle defects having a size greater than 0.12 μm.

Substrate 12, graded layer 14, and relaxed layer 16 may be formed from various material systems, including various combinations of group II, group III, group IV, group V, and group VI elements. For example, each of substrate 12, graded layer 14, and relaxed layer 16 may include a III-V compound. Substrate 12 may include gallium arsenide (GaAs), graded layer 14 and relaxed layer 16 may include indium gallium arsenide (InGaAs) or aluminum gallium arsenide (AlGaAs). These examples are merely illustrative, and many other material systems are suitable.

A strained semiconductor layer 18 is disposed over relaxed layer 16. Strained layer 18 may include a semiconductor such as at least one of a group II, a group III, a group IV, a group V, and a group VI element. Strained semiconductor layer 18 may include, for example, Si, Ge, SiGe, GaAs, indium phosphide (InP), and/or zinc selenide (ZnSe). Strained layer 18 may have a starting thickness $T_3$ of, for example, 50-1000 angstroms (Å). In an embodiment, $T_3$ may be approximately 200-500 Å.

Strained layer 18 may be formed by epitaxy, such as by atmospheric-pressure CVD (APCVD), low- (or reduced-) pressure CVD (LPCVD), ultra-high-vacuum CVD (UHVCVD), by molecular beam epitaxy (MBE), or by atomic layer deposition (ALD). Strained layer 18 containing Si may be formed by CVD with precursors such as dichlorosilane, silane, disilane, or trisilane. Strained layer 18 containing Ge may be formed by CVD with precursors such as germane or digermane. The epitaxial growth system may be a single-wafer or multiple-wafer batch reactor. The growth system may also utilize a low-energy plasma to enhance layer growth kinetics.

In an embodiment in which strained layer 18 contains substantially 100% Si, strained layer 18 may be formed in a dedicated chamber of a deposition tool that is not exposed to Ge source gases, thereby avoiding cross-contamination and improving the quality of the interface between strained layer 18 and relaxed layer 16. Furthermore, strained layer 18 may be formed from an isotopically pure precursor(s). Isotopically pure materials (e.g., Si or Ge) have better thermal conductivity than materials present as mixtures of atomic isotopes. Higher thermal conductivity may help dissipate heat from devices subsequently formed on strained layer 18, thereby maintaining the enhanced carrier mobilities provided by strained layer 18.

After formation, strained layer 18 has an initial misfit dislocation density of, for example, 0-$10^5$ $cm/cm^2$. In an embodiment, strained layer 18 has an initial misfit dislocation density of approximately 0 $cm/cm^2$. Because misfit dislocations are linear defects generally lying within a plane between two crystals within an area, they may be measured in terms of total line length per unit area. Misfit dislocation density, therefore, may be expressed in units of dislocations/cm or $cm/cm^2$. In one embodiment, strained layer 18 may be tensilely strained, e.g., Si formed over SiGe. In another embodiment, strained layer 18 may be compressively strained, e.g., Ge formed over SiGe.

Strained layer 18 may have a surface particle density of, e.g., less than about 0.3 particles/cm$^2$. As used herein, "surface particle density" includes not only surface particles but also light-scattering defects, and crystal-originated pits (COPs), and other defects incorporated into strained layer 18. Process optimization may enable reduction of the localized light-scattering defect levels to about 0.09 defects/cm$^2$ for particle defects having a size greater than 0.09 µm and to 0.05 defects/cm$^2$ for particle defects having a size greater than 0.12 µm. These surface particles may be incorporated in strained layer 18 during the formation of strained layer 18, or they may result from the propagation of surface defects from an underlying layer, such as relaxed layer 16.

In alternative embodiments, graded layer 14 may be absent from the structure. Relaxed layer 16 may be formed in various ways, and the invention is not limited to embodiments having graded layer 14. In other embodiments, strained layer 18 may be formed directly on substrate 12. In this case, the strain in layer 18 may be induced by lattice mismatch between layer 18 and substrate 12, induced mechanically, e.g., by the deposition of overlayers, such as Si$_3$N$_4$, or induced by thermal or lattice mismatch between layer 18 and a subsequently grown layer, such as a SiGe layer. In some embodiments, a uniform semiconductor layer (not shown), having a thickness of approximately 0.01-1.5 µm and comprising the same semiconductor material as substrate 12, is disposed between graded buffer layer 14 and substrate 12. This uniform semiconductor layer may be grown to improve the material quality of layers subsequently grown on substrate 12, such as graded buffer layer 14, by providing a clean, contaminant-free surface for epitaxial growth. In certain embodiments, relaxed layer 16 may be planarized prior to growth of strained layer 18 to eliminate the crosshatched surface roughness induced by graded buffer layer 14. (See, e.g., M. T. Currie, et al., *Appl. Phys. Lett.*, 72 (14) p. 1718 (1998), incorporated herein by reference.) The planarization may be performed by a method such as CMP, and may improve the quality of a subsequent bonding process because it minimizes the wafer surface roughness and increases wafer flatness, thus providing a greater surface area for bonding.

Figure 1B:
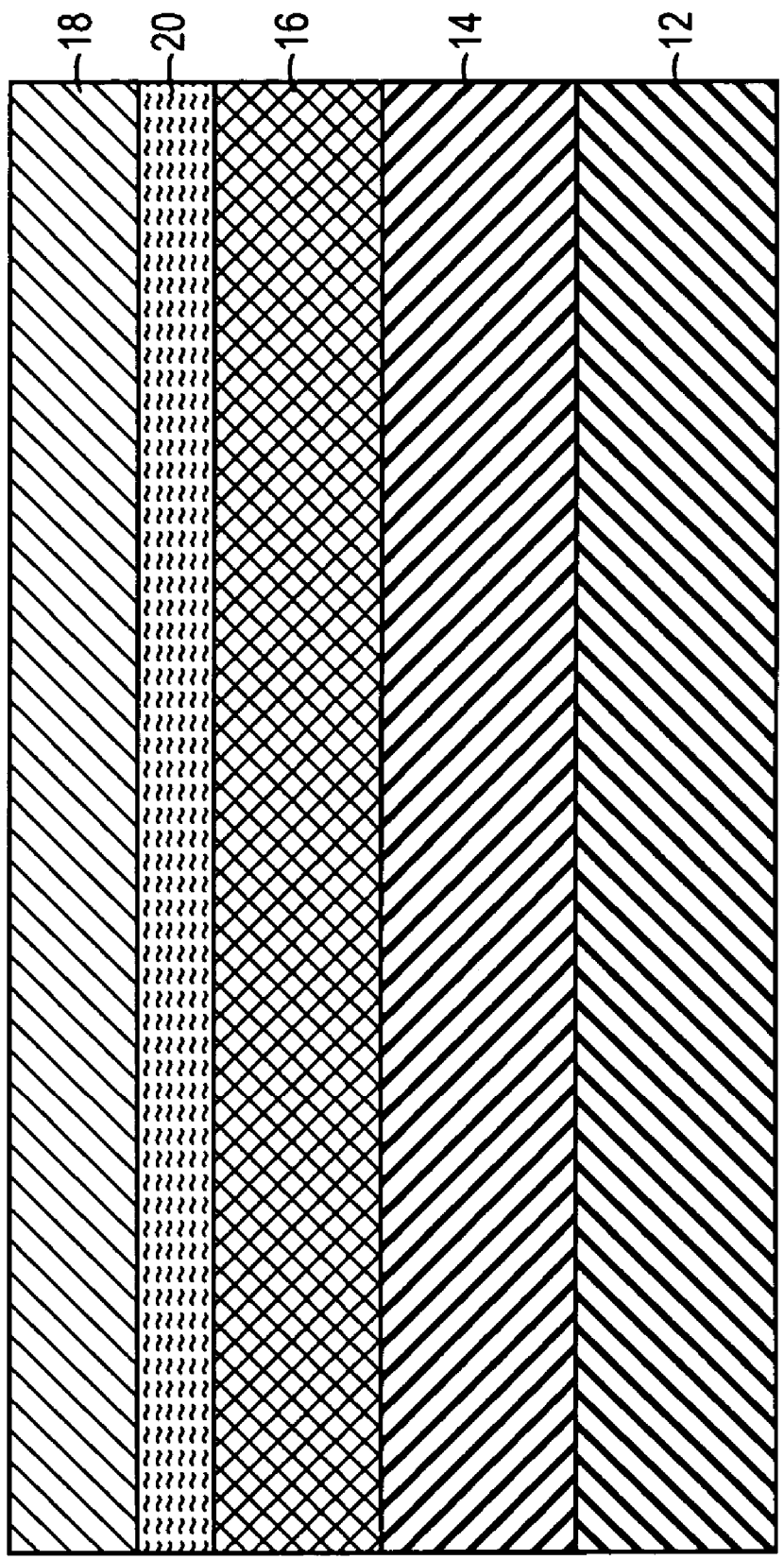

Referring to FIG. 1*b*, after planarization of relaxed layer 16, a relaxed semiconductor regrowth layer 20 including a semiconductor such as SiGe may be grown on relaxed layer 16, thus improving the quality of subsequent strained layer 18 growth by ensuring a clean surface for the growth of strained layer 18. Growing on this clean surface may be preferable to growing strained material, e.g., silicon, on a surface that is possibly contaminated by oxygen and carbon from the planarization process. The conditions for epitaxy of the relaxed semiconductor regrowth layer 20 on the planarized relaxed layer 16 may be chosen such that surface roughness of the resulting structure, including layers formed over regrowth layer 20, is minimized to ensure a surface suitable for, in some embodiments, subsequent high quality bonding for forming, e.g., a strained semiconductor-on-insulator (SSOI) structure.

In another embodiment, a compressively strained layer (not shown) may be disposed below or above strained layer 18. In such embodiment, the compressively strained layer includes Si$_{1-y}$Ge$_y$, with a Ge content (y) higher than the Ge content (x) of relaxed Si$_{1-x}$Ge$_x$ layer 16. The compressively strained layer may contain, for example, a Ge content wherein $0.3 \leq y \leq 1$ and have a thickness of, e.g., 10-200 Å.

Figure 1C:
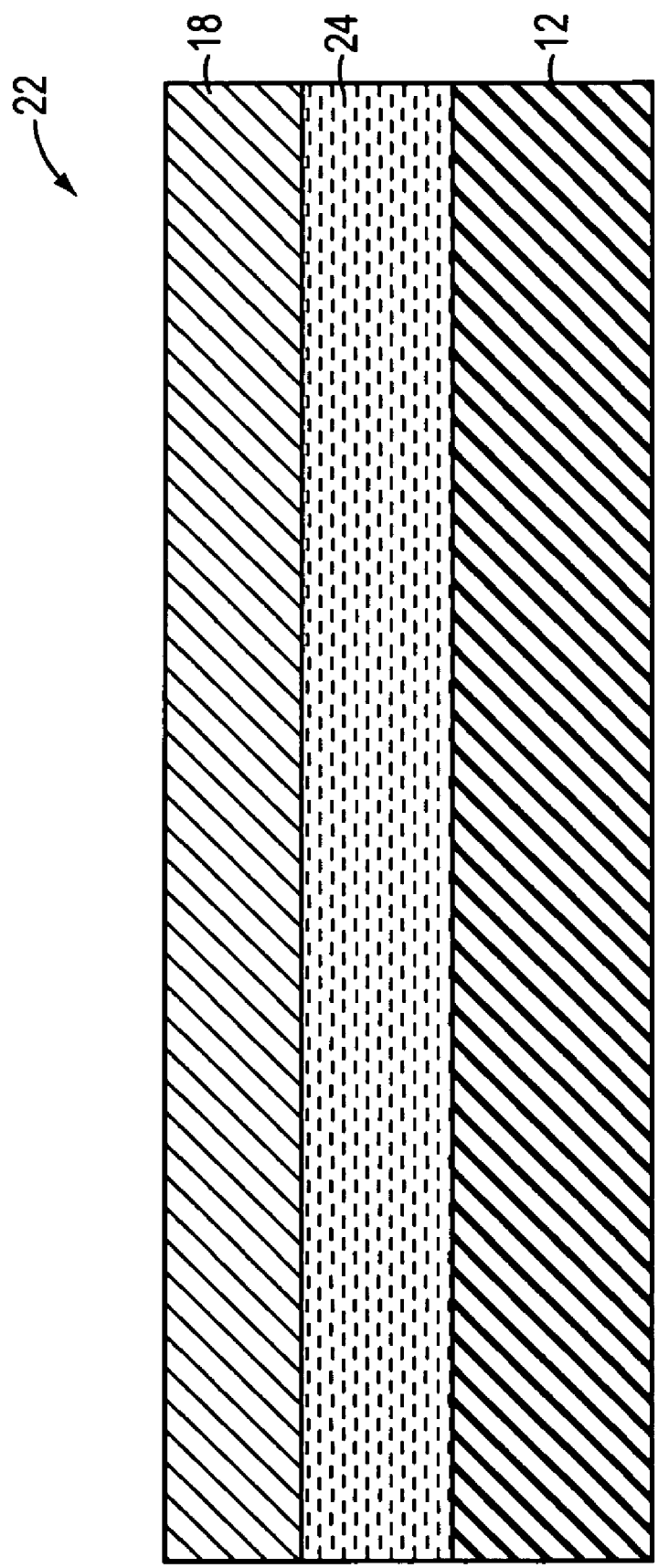

FIG. 1*c* illustrates another type of structure amenable to use in connection with the present invention. Specifically, the structure is an SSOI substrate 22 having an insulator layer 24 disposed beneath strained layer 18. Insulator layer 24 may be a dielectric layer including an oxide, for example, SiO$_2$. In an embodiment, dielectric layer 24 may include a material having a higher melting point (T$_m$) than that of pure SiO$_2$, i.e., higher than 1700° C. Examples of such materials are silicon nitride (Si$_3$N$_4$), aluminum oxide, magnesium oxide, etc. Using dielectric layer 24 with a high T$_m$ helps prevents possible relaxation of the transferred strained semiconductor layer 18 that may occur during subsequent processing, due to softening of the underlying dielectric layer 24 at temperatures typically used during device fabrication (approximately 1000-1200° C.). In such embodiment where strained layer 18 is formed directly on insulator layer 24, relaxed layer 16 and graded layer 14 may be absent from the structure. In another embodiment (not shown), the insulator layer 24 may be disposed directly beneath relaxed layer 16. In this case, graded layer 14 may be absent from the structure. The insulator layer 24 may have a thickness of, e.g., 200-3000 Å.

Figure 2:
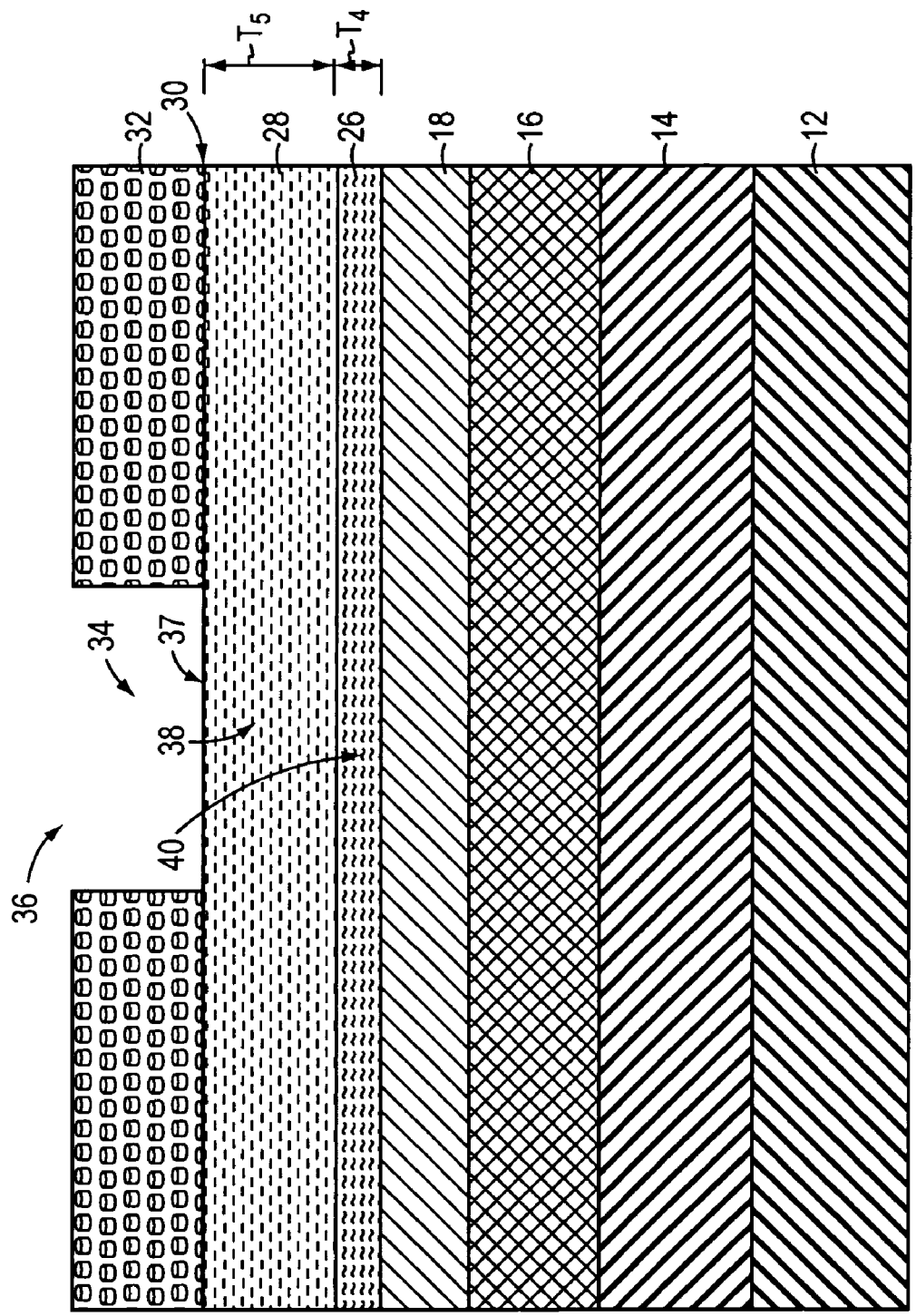

Referring to FIG. 2, a first masking layer 26, such as a pad silicon dioxide layer, hereinafter referred to as pad oxide 26, is formed over strained layer 18 by thermal growth or by a suitable deposition method such as low-pressure chemical vapor deposition (LPCVD). Pad oxide 26 may have a thickness T$_4$ of, e.g., 50-200 Å. Subsequently, a second masking layer 28, such as a masking silicon nitride layer, is deposited over pad oxide 26 by a suitable deposition method such as LPCVD, high density plasma CVD, or plasma-enhanced chemical vapor deposition (PECVD). Masking layer 28 may be a dielectric material, e.g. silicon nitride or silicon oxynitride, and may be etched selectively with respect to underlying pad oxide 26.

Masking layer 28 may include a material selected to exert a type of strain different from the type of strain in strained layer 18. For example, in one embodiment, strained layer 18 may have a first type of strain, e.g., tensile strain, and masking layer 28 may have a second type of strain, e.g., compressive strain. More specifically, strained layer 18 may include tensilely strained silicon and masking layer 28 may include compressively strained silicon nitride. In another embodiment, strained layer 18 may be compressively strained, and masking layer 28 may be tensilely strained. More specifically, strained layer 18 may include compressively strained germanium, and masking layer 28 may include tensilely strained silicon nitride.

Mismatching the types of strain in masking layer 28 and strained layer 18 may help prevent relaxation of strained layer 18 during subsequent high temperature processing steps. In addition, although the thickness of pad oxide 26 may typically be selected to be large enough to buffer the underlying structure from strain exerted by masking layer 28, the thickness of pad oxide 26 may be reduced (e.g., to less than 200 Å, preferably less than 100 Å) to facilitate the exertion of strain by masking layer 28 on underlying layers. Masking layer 28 may have a thickness T$_5$ of, for example, 500-2000 Å.

The strain of silicon nitride films grown by LPCVD at temperatures greater than approximately 700° C. may be selected by varying the silicon content of the nitride film. (See, e.g., S. Habermehl, *J. Appl. Phys.*, 83 (9) p. 4672 (1998), incorporated herein by reference.) For example, LPCVD stoichiometric silicon nitride films (i.e., Si$_3$N$_4$) are typically tensilely strained, while silicon-rich nitride films (e.g., with a silicon volume fraction greater than 0.1-0.15, or with a Si/N atomic ratio greater than 0.75) are typically compressively strained. The silicon content of a nitride film formed by LPCVD may be varied by changes in the ratio of silicon and nitrogen precursors utilized in the growth process. For example, a nitride growth process performed at 850° C. and a pressure of 200 milliTorr (mTorr) utilizing dichlorosilane ($SiCl_2H_2$) as a silicon precursor and ammonia ($NH_3$) as a nitrogen precursor will form a silicon-rich nitride when the ratio of dichlorosilane flow to the total gas flow is greater than approximately 0.85. For lower temperatures, the relative amount of dichlorosilane may need to be increased to form silicon-rich nitride films. Compressive silicon nitride films may have a refractive index greater than approximately 2.4, and tensile silicon nitride films may have a refractive index smaller than approximately 2.4. (See, e.g., M. Sekimoto, et al., *J. Vac. Sci. Technol.,* 21 (4) p. 1017 (1982), incorporated herein by reference.)

In another embodiment, silicon nitride films for various strain levels may be formed by PECVD at deposition temperatures less than approximately 700° C. Variations in precursor gas ratio, RF power, dilution gas, and plasma excitation frequency may lead to strain variations in the final film. For example, for a PECVD process performed at 220° C., 200 Pascals pressure, 100 watts RF power, and helium dilution, a compressive silicon nitride film may be deposited when the ratio of silane flow to total gas flow (silane, ammonia, and nitrogen) is smaller than approximately 0.03. When this ratio is larger than approximately 0.03, a tensilely strained silicon nitride film may be deposited. (See, e.g., M. J. Loboda, et al., *J. Mater. Res.,* 11 (2) p. 391 (1996), incorporated herein by reference.)

In an alternative embodiment, silicon nitride films of varying strain levels may be produced by high density plasma CVD (HDPCVD) in a process utilizing an inductively coupled plasma (ICP) source at temperatures less than 500° C. with precursors such as silane, ammonia, and nitrogen. The plasma used in this process may utilize noble gases such as argon or helium, which may also act as dilution gases in this process. The chuck power levels may be varied to tailor strain levels in silicon nitride films. For example, a process at 150° C. and 10 mTorr utilizing silane, ammonia, and helium gases (total gas flow of 40 standard cubic centimeters per minute (sccm)) and an ICP power of 800 watts may produce compressively strained silicon nitride films for RF chuck power levels less than approximately 40 watts and tensilely strained silicon nitride films for RF chuck power levels greater than approximately 40 watts. (See, e.g., J. W. Lee, et al., *J. Electrochemical. Soc.,* 147 (4) p. 1481 (2000), incorporated herein by reference.)

Figure 3:
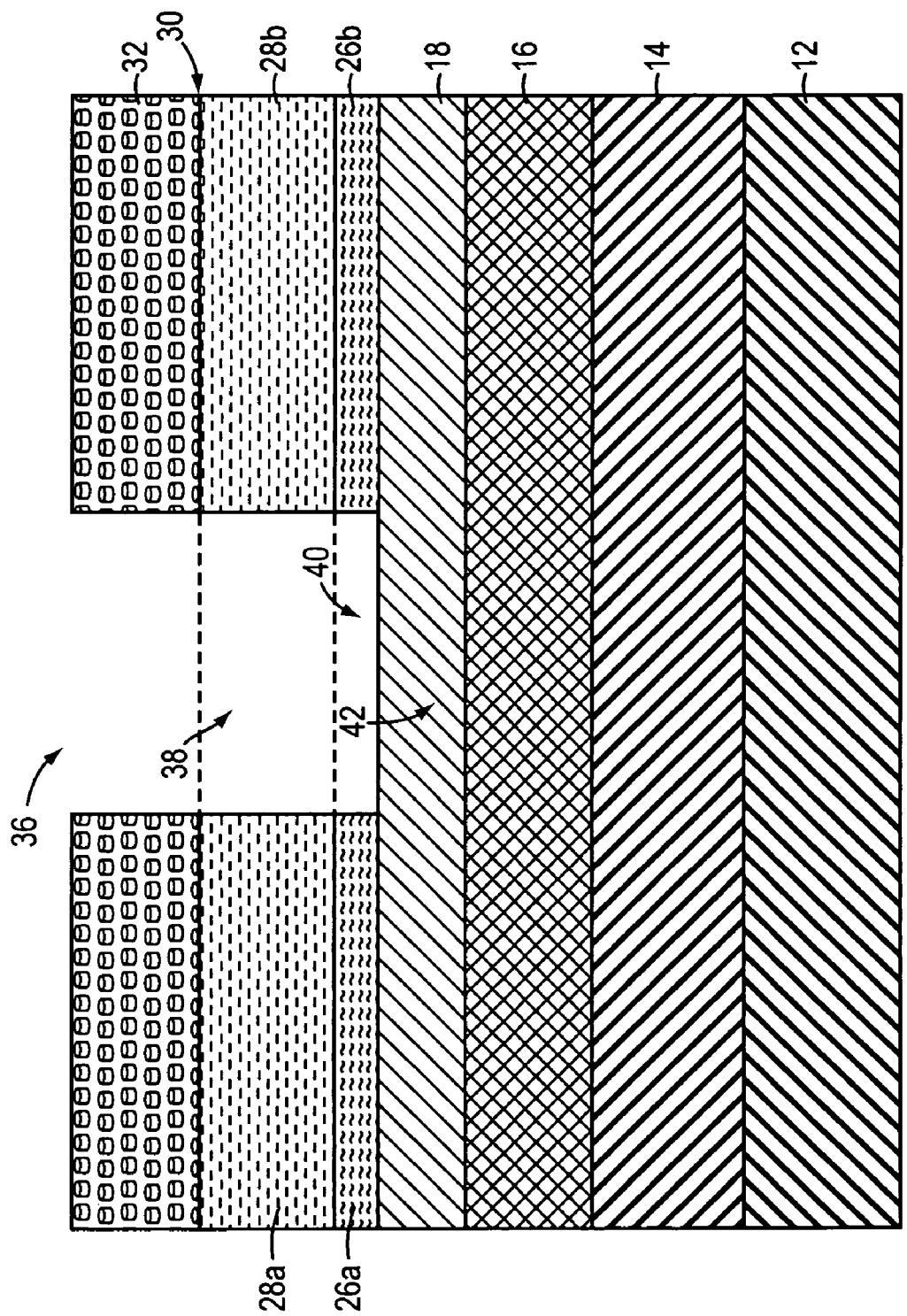

Referring to FIG. 2 and also to FIG. 3, a photoresist layer is deposited over a top surface 30 of masking layer 28 and patterned to form a photoresist mask 32. Photoresist mask 32 defines an opening 34 over a region 36 of substrate 12 and layers 13 in which a trench structure 55 may be formed (see, e.g., trench structure 55 in FIG. 5a). Opening 34 exposes a portion 37 of top surface 30 of masking layer 28 disposed over region 36.

After the definition of photoresist mask 32, a portion 38 of masking layer 28 exposed by photoresist layer 32 is removed, leaving behind masking layer portions 28a, 28b protected by photoresist mask 32 and exposing a portion 40 of pad oxide 26. Portion 40 of pad oxide 26 is then removed, leaving behind pad oxide portions 26a, 26b. In particular, exposed masking layer portion 38 may be removed by a suitable removal process such as a reactive ion etch (RIE) using gases such as a combination of nitrogen trifluoride, ammonia, and oxygen, or a combination of hydrogen bromide, chlorine, and oxygen. Pad oxide portion 40 may be removed by a wet etch that is selective to silicon, such as a hydrofluoric acid etch. The removal of pad oxide portion 40 exposes a portion 42 of strained layer 18. In an alternative embodiment, a first RIE etch may be to performed to remove portion 38 of masking layer 28, as well as portion 40 of pad oxide 26. This first RIE etch may not be selective to underlying semiconductor material, and may etch perhaps a few hundred Å into an underlying semiconductor material, e.g., strained layer 18. Then a second RIE etch step may be performed with a different chemistry and/or etch conditions, to remove ~2500-4000 Å of underlying material, as described below with reference to formation of trench 50.

Figure 4:
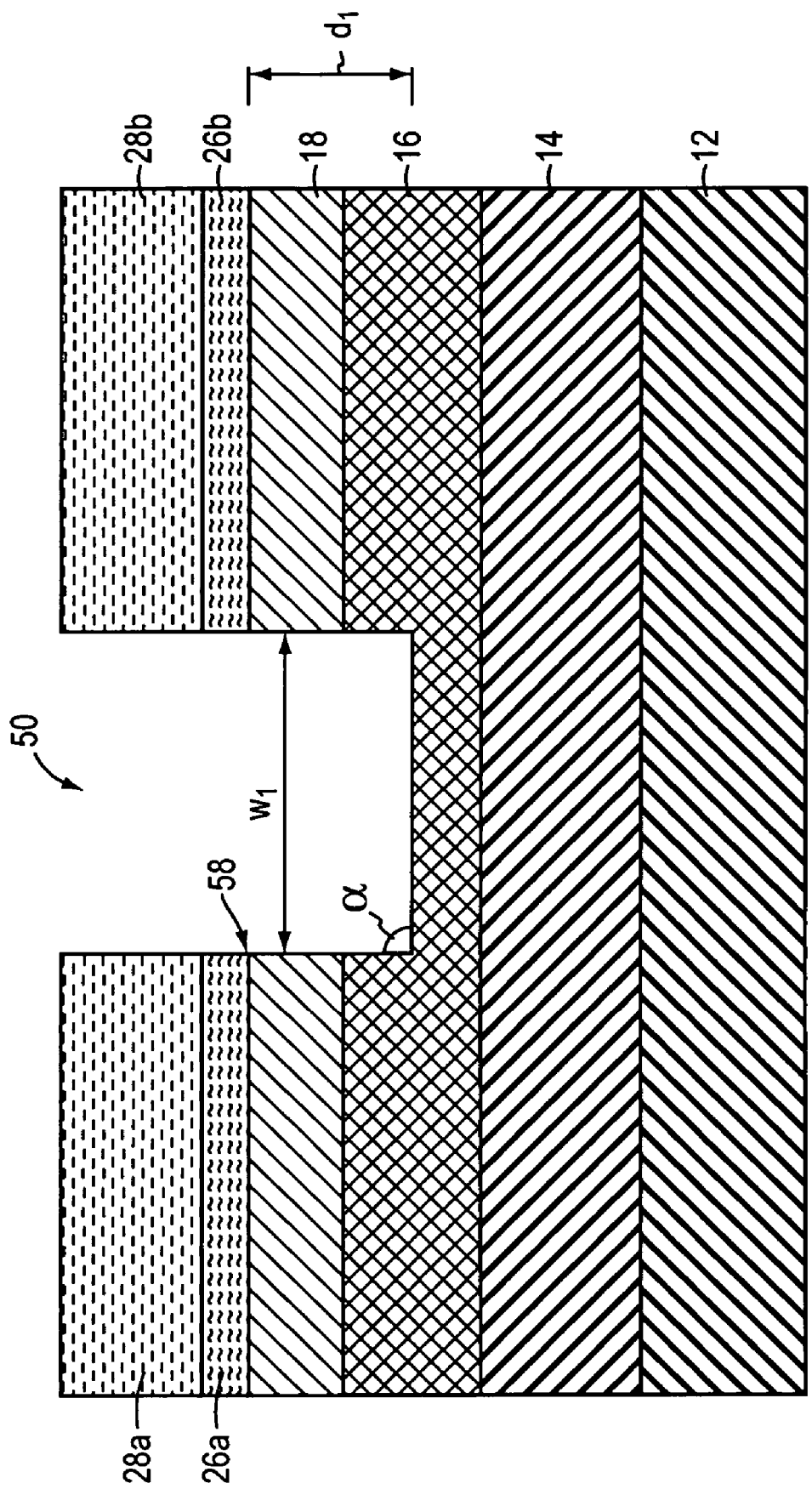

Referring to FIG. 3 and also to FIG. 4, a trench 50 is defined in strained layer 18 and relaxed layer 16. Trench 50 may be formed, for example, by a dry reactive ion etch. A two-step etch process may be used, with the strained layer 18 being etched during the first step with a gas such as chlorine and/or hydrogen bromide, and the relaxed layer 16 being etched during the second step with a gas such as chlorine and/or hydrogen bromide. The total gas pressure and/or the flow ratio of etch gases may differ between the steps of the two-step etch process. Trench 50 may have a depth $d_1$ within a range of, for example, 3000-4000 Å, and a width $w_1$ of less than depth $d_1$, e.g., $w_1$ may be approximately 1000 Å. In some embodiments, the width $w_1$ of trench 50 may be larger than its depth $d_1$, with $w_1$ being as large as several micrometers. In some embodiments, depth $d_1$ may be even deeper, e.g., in deep trench isolation processes. A sidewall 58 of trench 50 may be substantially vertical, i.e., forming an angle α of greater than approximately 80° with a plane parallel to a surface of the substrate. The bottom corners of trench 50 may be substantially rounded to facilitate subsequent filling with an isolation material. After the selective removal of portions 38, 40 of masking layer 28 and pad oxide 26 and the formation of trench 50, photoresist mask 32 may be removed by a stripping process such as a dry strip in an oxygen plasma.

Figure 5A:
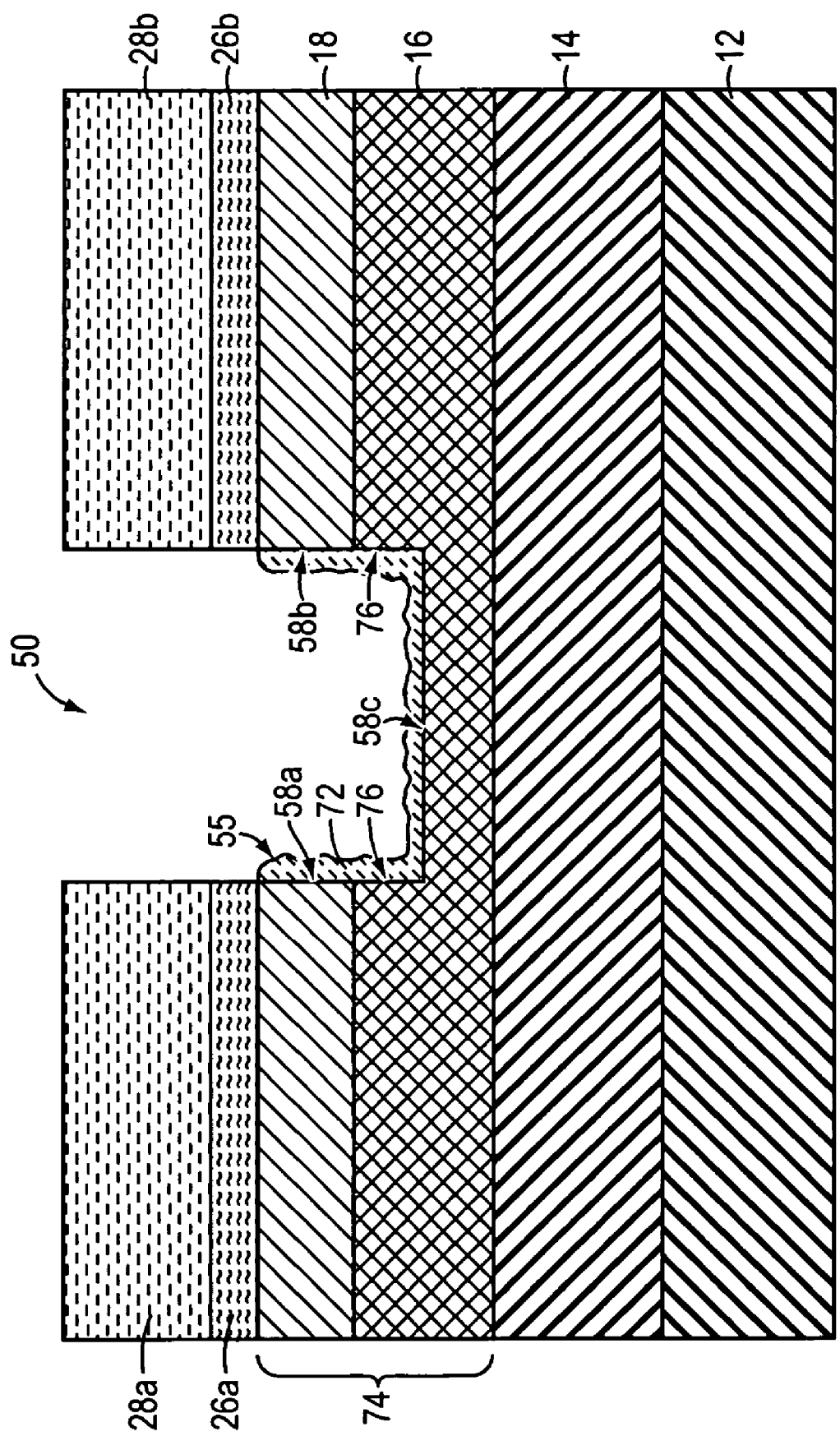
Figure 5B:
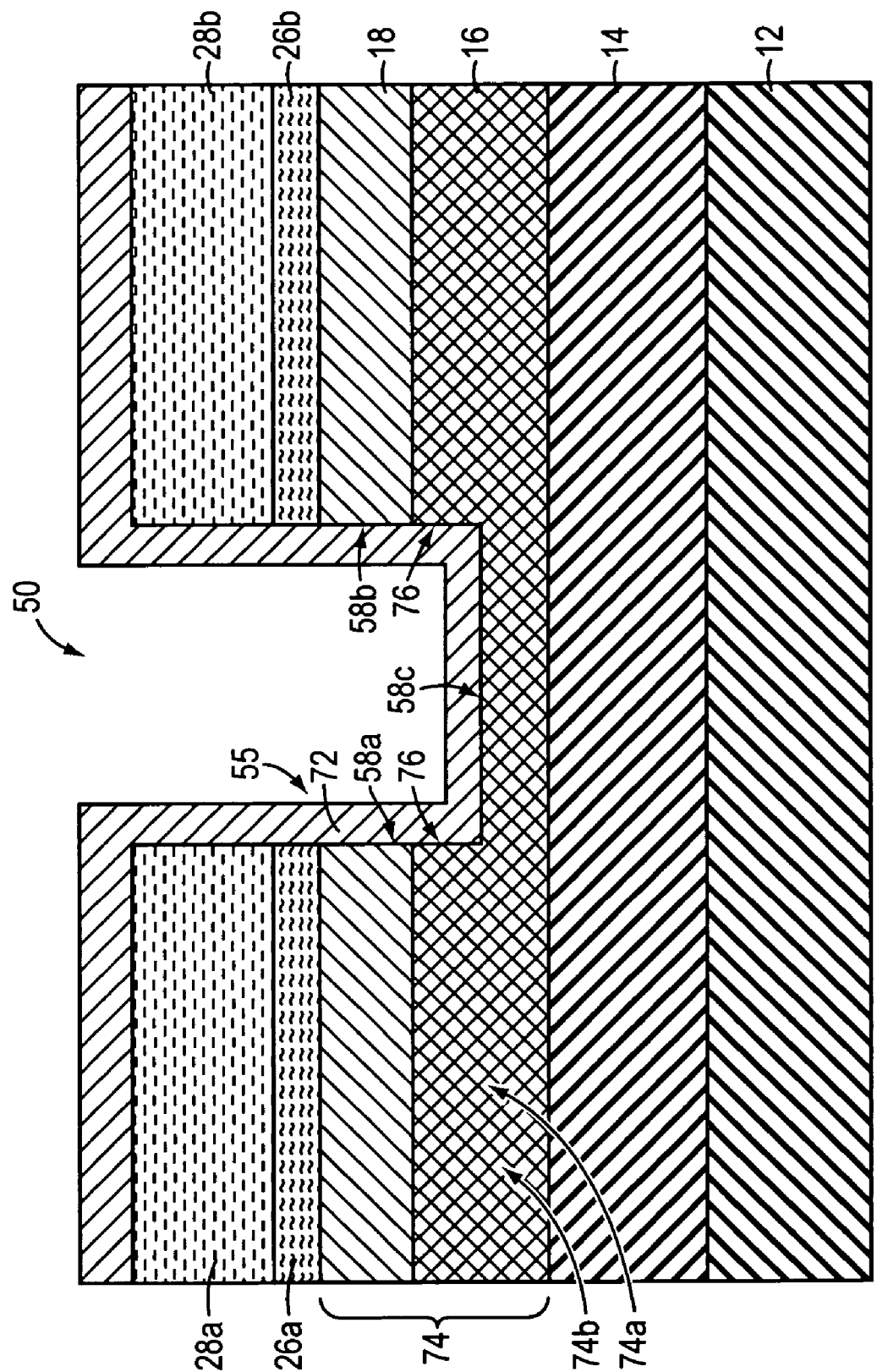

Referring to FIG. 5a, and also to FIG. 5b, trench structure 55 is formed in trench 50. Forming the trench structure 55 may include lining trench sidewalls 58a, 58b and trench bottom portion 58c with a first dielectric layer 72. First dielectric layer 72 may include an oxide, and it may be formed on any portion of strained layer 18 and relaxed layer 16 exposed in trench 50. First dielectric layer 72 may be e.g. 50-150 Å thick. In one embodiment, first dielectric layer 72 may include a nitrided oxide that may result in a lower interface state density than may be obtained with first dielectric layer 72 formed of pure silicon dioxide thermally grown on SiGe.

In one embodiment and referring to FIG. 5a, first dielectric layer 72 may be a thermally grown oxide, formed, for example, by thermal growth in a conventional furnace, such as the ALPHA-8SE manufactured by Tokyo Electron (Austin, Tex.). This oxidation step may take place in a wet, i.e., steam ambient, and/or at a low temperature, i.e., <1000° C. Alternatively, first dielectric layer 72 may be formed by rapid thermal oxidation to reduce STI-module thermal budget. A suitable processing system is the RADIANCE CENTURA system manufactured by Applied Materials (Santa Clara, Calif.). In this embodiment, the oxidation step may further utilize plasma enhancement to increase the oxidation rate. The rapid thermal oxidation may take place in a wet, i.e., steam ambient. Because the rapid thermal oxidation time is limited, e.g., 5 minutes or less, the oxidation may take place at higher temperatures, i.e., >1000° C., although it may still be preferable to carry out the oxidation at a lower temperature, i.e., <1000° C. In other embodiments, first dielectric layer may be formed by thermal oxidation in a dry, e.g., oxygen, ambient or may be formed at elevated pressures, e.g., high-pressure oxidation (HIPOX).

These thermal oxidation processing parameters may permit the incorporation into the oxide of elements, including elements other than Si, disposed in substrate 12. For example, in some embodiments, substrate 12 with layers 13 may be a SiGe virtual substrate and first dielectric layer 72 may include Ge. The ratio of Ge to Si in first dielectric layer 72 may be substantially similar to the ratio of Ge to Si in a substrate portion 74 that includes relaxed layer 16 and strained layer 18. More specifically, first dielectric layer 72 may be an oxide in the form of $Si_{1-x}Ge_xO_2$. Further, an interface 76 between first dielectric layer 72 and trench sidewalls 58a, 58b may have a satisfactory integrity with a low interface trap density, e.g., less than $5 \times 10^{11}/cm^2$.

In another embodiment and referring to FIG. 5b, first dielectric layer 72 may include an oxide, such as $SiO_2$, formed by a suitable deposition method such as LPCVD or PECVD. In this embodiment, first dielectric layer 72 may be pure $SiO_2$, i.e., it may not include Ge. Because first dielectric layer 72 is deposited, the formation of first dielectric layer 72 does not substantially affect the composition of substrate portion 74 at interface 76 between first dielectric layer 72 and trench sidewalls 58a, 58b. More specifically, a first region 74a of substrate portion 74 proximate the interface 76 may have a Ge concentration substantially similar to a Ge concentration in a second region 74b of substrate portion 74 distal the interface 76. The interface 76 between first dielectric layer 72 and trench sidewalls 58a, 58b may have a satisfactory integrity with a low interface trap density, e.g., less than $5 \times 10^{11}/cm^2$. In some embodiments, deposition of first dielectric layer 72 may be followed by an oxidation step to further improve the integrity of interface 76.

Figure 6:
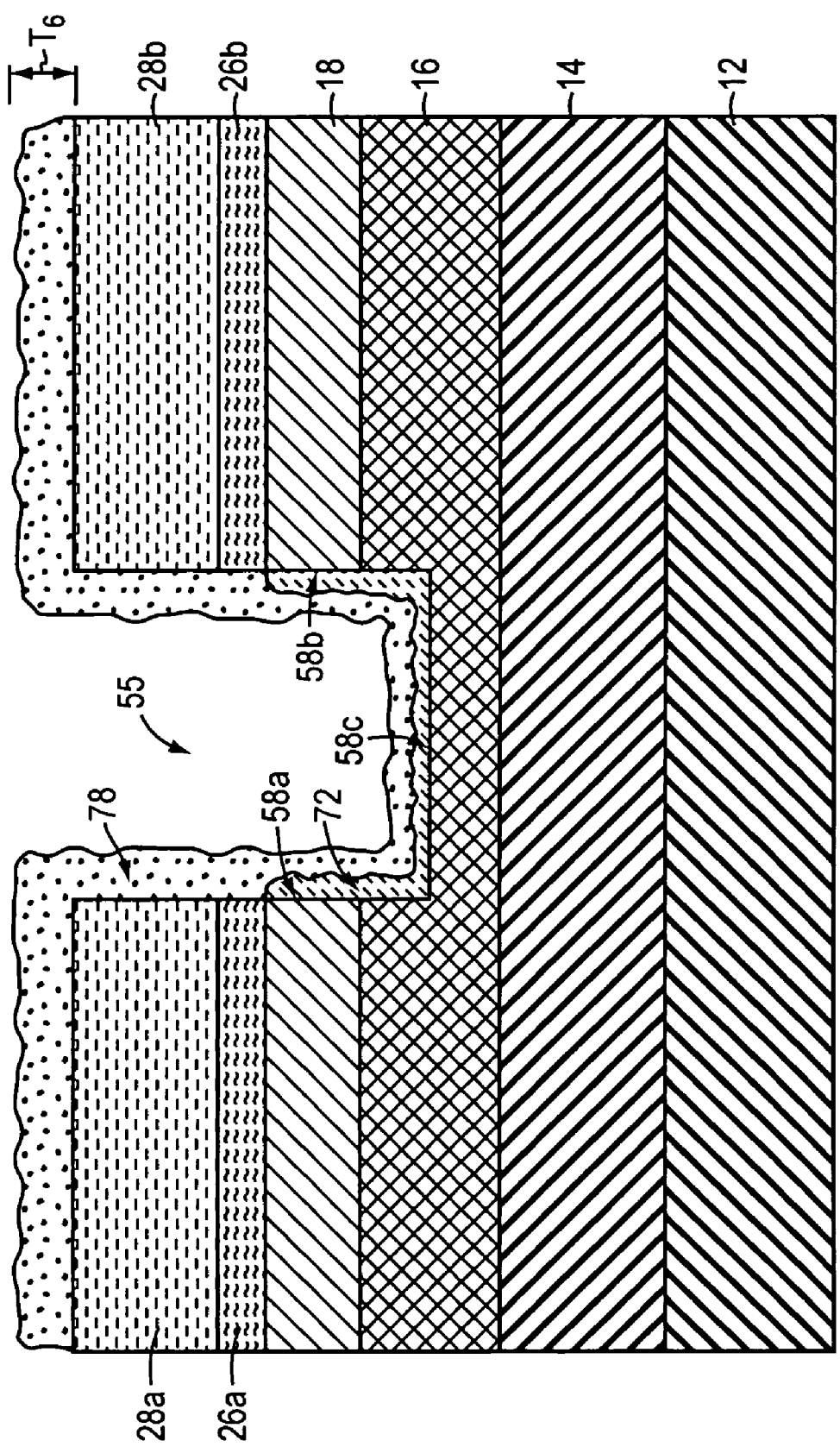

Referring to FIG. 6, in some embodiments, trench structure 55 may include a secondary protective liner 78 formed proximate first dielectric layer 72. This protective liner 78, preferably a dielectric material such as silicon nitride or silicon dioxide, may be deposited conformally over first dielectric layer 72. Protective liner 78 may have a thickness $T_6$ of, e.g., 50-500 Å. Because in some embodiments first dielectric layer 72 may contain Ge, it may be susceptible to attack by etchants used during subsequent processing, e.g., wet cleans such as hydrofluoric acid or even rinses in deionized water. Protective liner 78 may be selected to have a lower etch rate than first dielectric layer 72 in wet etchants such as hydrofluoric acid, or an RCA SC1 clean including water, hydrogen peroxide, and ammonium hydroxide. The formation of the secondary protective liner 78 may thus help to protect first dielectric layer 72 from accelerated etching, thereby preserving the integrity of first dielectric layer 72 during subsequent process steps. Protective liner 78 may also protect the sidewalls 58a, 58b of trench 50 from oxidation during subsequent process steps performed at elevated temperatures and/or in ambients containing oxygen. The volume expansion from such oxidation may result in unwanted compressive strain being induced in the region bounded by the trench structure or in the channel region of subsequently fabricated devices.

Materials and methods of forming dielectric layer 72 (and optionally protective liner 78) may be tailored to define trench structure 55 having the same type of strain as that in a particular layer of the substrate. For example, when strained layer 18 is compressively strained, dielectric layer 72 may be formed in a manner and of a material that will result in it also being compressively strained. In another embodiment, strained layer 18 may be tensilely strained, and dielectric layer 72 may be formed in a manner and of a material that will result in it also being tensilely strained.

In some embodiments, trench structure 55 may include both first dielectric 72 and protective liner 78, and the two layers may exert the same type of strain or different types of strain. Having different types of strain in first dielectric 72 and protective liner 78 may be advantageous. For example, when first dielectric 72 is formed in a steam ambient, compressive strain may be created in trench structure 55 and may affect device performance. Protective liner 78 may help to counteract this compressive strain by providing a tensilely strained layer. The total amount of strain of first dielectric 72 and protective liner 78 is preferably the same type of strain as the type of strain in one of the plurality of layers 13 on substrate 12, for example, strained layer 18.

Figure 7:
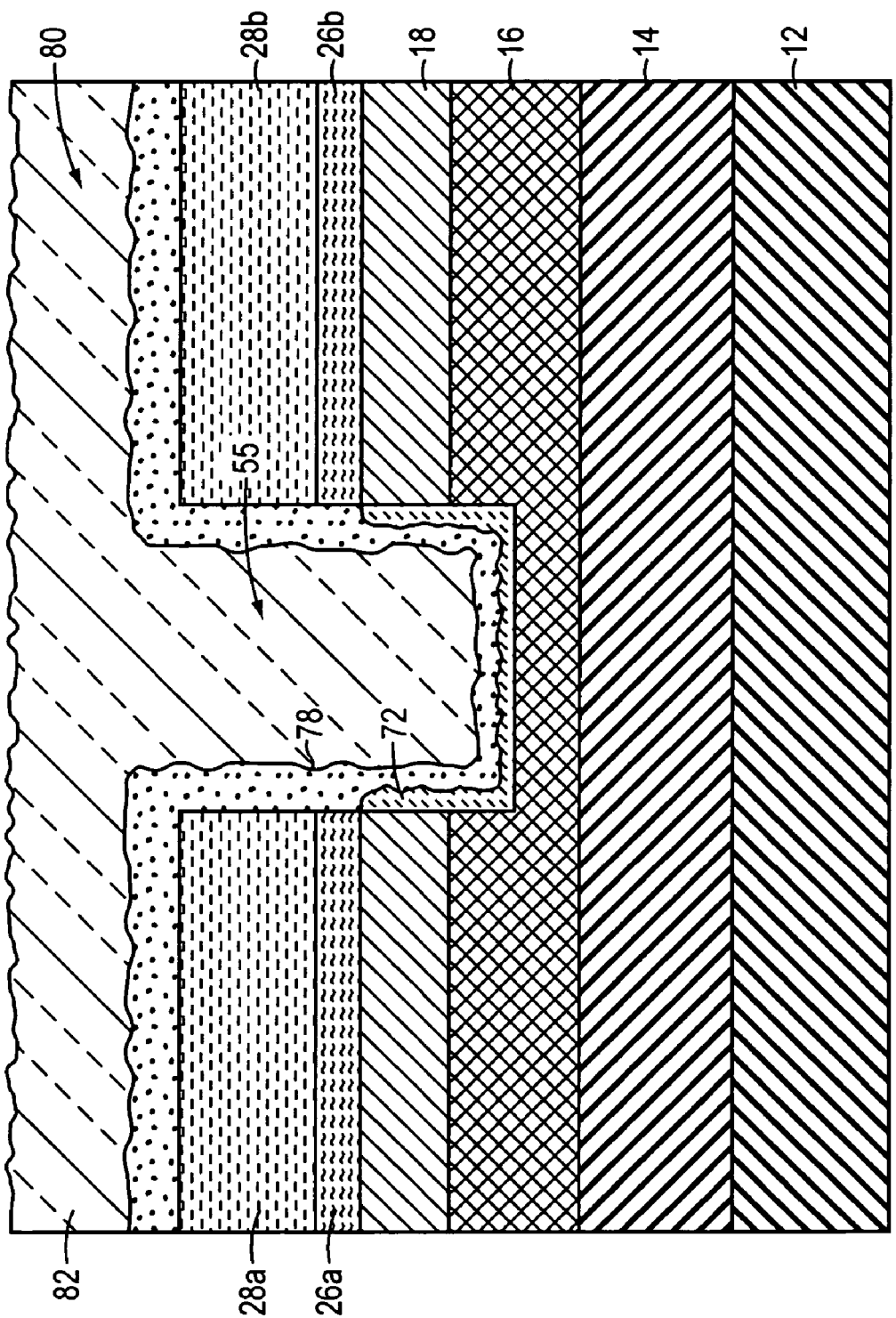

Referring to FIG. 7, trench 50 may be filled with a fill material 80 selected to define a trench structure 55 having the same type of strain as that in one of the plurality of layers 13 disposed over substrate 12. In one embodiment, the fill material 80 is a dielectric, such as silicon dioxide. Fill material 80 may be deposited by, for example, LPCVD, PECVD, or HDPCVD, and may have a thickness sufficient to completely fill trench 50. Alternatively, fill material 80 may be deposited by a spin-on process, e.g., fill material 80 may be a spin-on-glass material such as an inorganic spin-on-glass based on polysilazane. A portion 82 of fill material 80 may be disposed outside trench 50.

In an embodiment in which it is desired that trench structure 55 induce tensile strain, fill material 80 may include an amorphous semiconductor, e.g., amorphous silicon. In a subsequent step (either an additional step, or during a further processing step), fill material 80 may be heated to a temperature above its amorphous-polycrystalline phase transition temperature by annealing or by irradiation with ultraviolet or laser energy. Depending on the method, this may include heating fill material 80 to a temperature higher than approximately 500-700° C. During the phase transition that takes place above its amorphous-polycrystalline phase transition temperature, fill material 80 contracts, inducing tensile strain in a region bounded by trench structure 55, e.g., in a channel region of a subsequently fabricated device.

In an alternative embodiment, fill material 80 has a thermal expansion coefficient greater than that of the material within which it is predominantly formed (i.e. strained layer 18, relaxed layer 16, or substrate 12) and it is deposited at elevated temperatures. Depending on the materials present in strained layer 18, relaxed layer 16, and substrate 12, fill material 80 may be selected to have a coefficient of thermal expansion greater than that of Si ($2.6 \times 10^{-6}/°$ C.), Ge ($5.8 \times 10^{-6}/°$ C.), or GaAs ($6.86 \times 10^{-6}/°$ C.). In the case of trench 50 being formed predominately in SiGe, the coefficient of thermal expansion of the SiGe may be approximated as the weighted average of the coefficients of thermal expansion of Si and Ge. Because coefficients of thermal expansion for these materials tend to increase with temperature, fill material 80 may be chosen to have a coefficient of thermal expansion greater than $8 \times 10^{-6}/°$ C. In this embodiment, when fill material 80 is cooled to room temperature, it contracts more than the surrounding material, inducing tensile strain in a region bounded by trench structure 55, e.g., in the channel region of a subsequently fabricated device. A material suitable for use as fill material 80 may be zinc-alumina-silicate glass.

In another embodiment, fill material 80 is not fully densified, e.g., fill material 80 may include low temperature oxide (LTO), medium temperature oxide (MTO), or silicon dioxide deposited from a tetraethylorthosilicate (TEOS) precursor. An anneal at a temperature above the deposition temperature, e.g., above 700° C., may cause fill material 80 to densify, i.e., contract, thereby inducing tensile strain in the region bounded by trench structure 55, e.g., in the channel region of a subsequently fabricated device. Such a densification anneal is preferably performed at a temperature sufficiently low, e.g., below 1100-1200° C., to prevent strain relief by flow of fill material 80.

In an embodiment, trench structure 55 induces compressive strain, and fill material 80 with a coefficient of thermal expansion smaller than that of the surrounding material may be deposited at elevated temperature. For example, when the surrounding material is predominantly silicon, the fill material 80 may be silicon dioxide. Thus, when fill material 80 is cooled to room temperature, it contracts less than the surrounding material, inducing compressive strain in the region bounded by trench structure 55, e.g., in the channel region of a subsequently fabricated device. In an alternative embodiment, fill material 80 may induce tensile strain as-deposited and may be densified or annealed at high temperatures, e.g., above 900° C. Flow of fill material 80 at such high temperatures may result in compressive strain being induced by fill material 80 after cooling. In another embodiment, compressive silicon dioxide may be deposited by PECVD. In an alternative embodiment, protective liner 78 may be absent in trench 50, and an oxidation step may be performed after filling the trench with fill material 80. Such oxidation is accompanied by a volume expansion which may further induce compressive strain in the region bounded by trench structure 55, e.g., in the channel region of a subsequently fabricated device.

Figure 8:
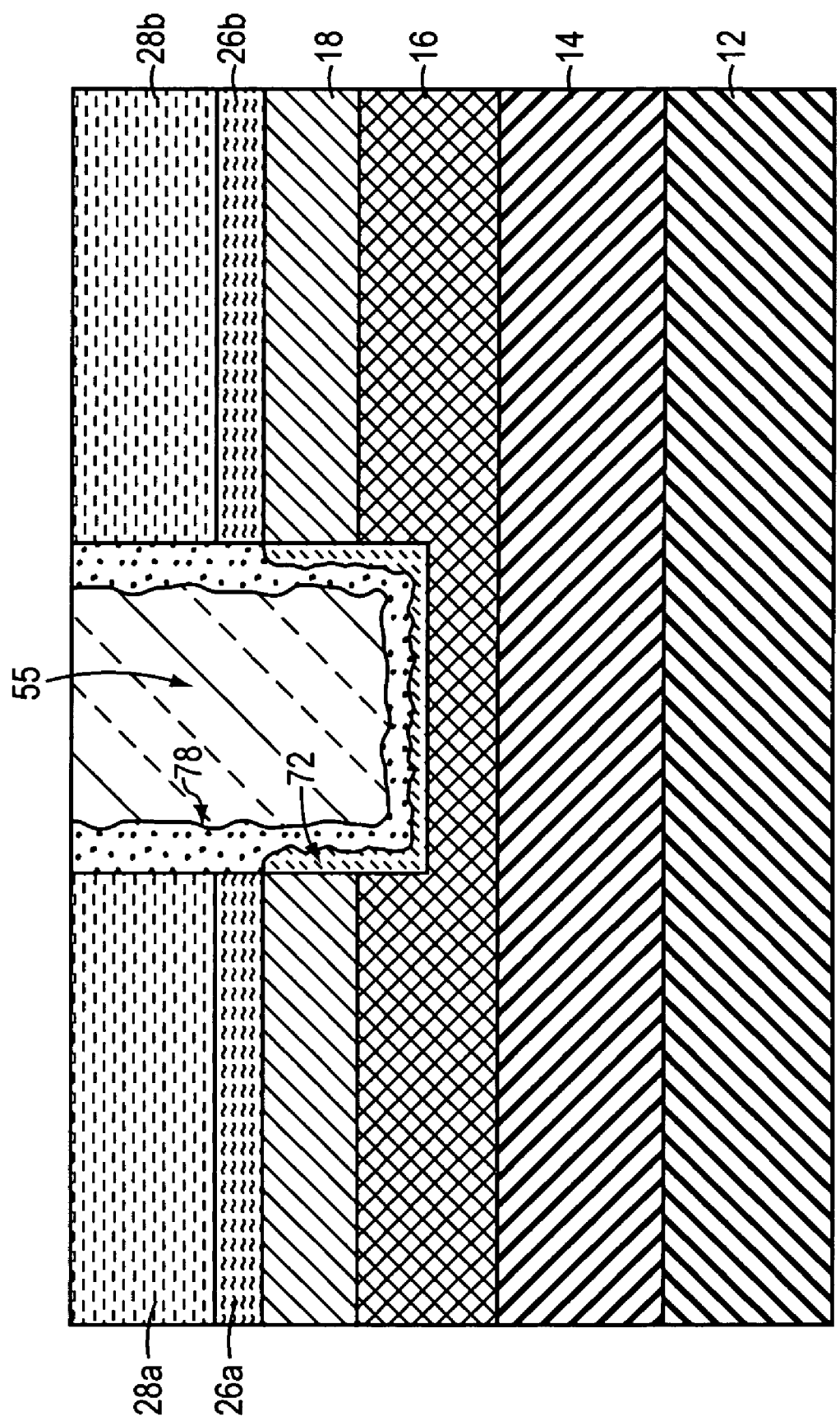

Referring to FIG. 7 and also to FIG. 8, portion 82 of fill material 80 disposed outside trench 50 is removed, e.g., by CMP.

Figure 9:
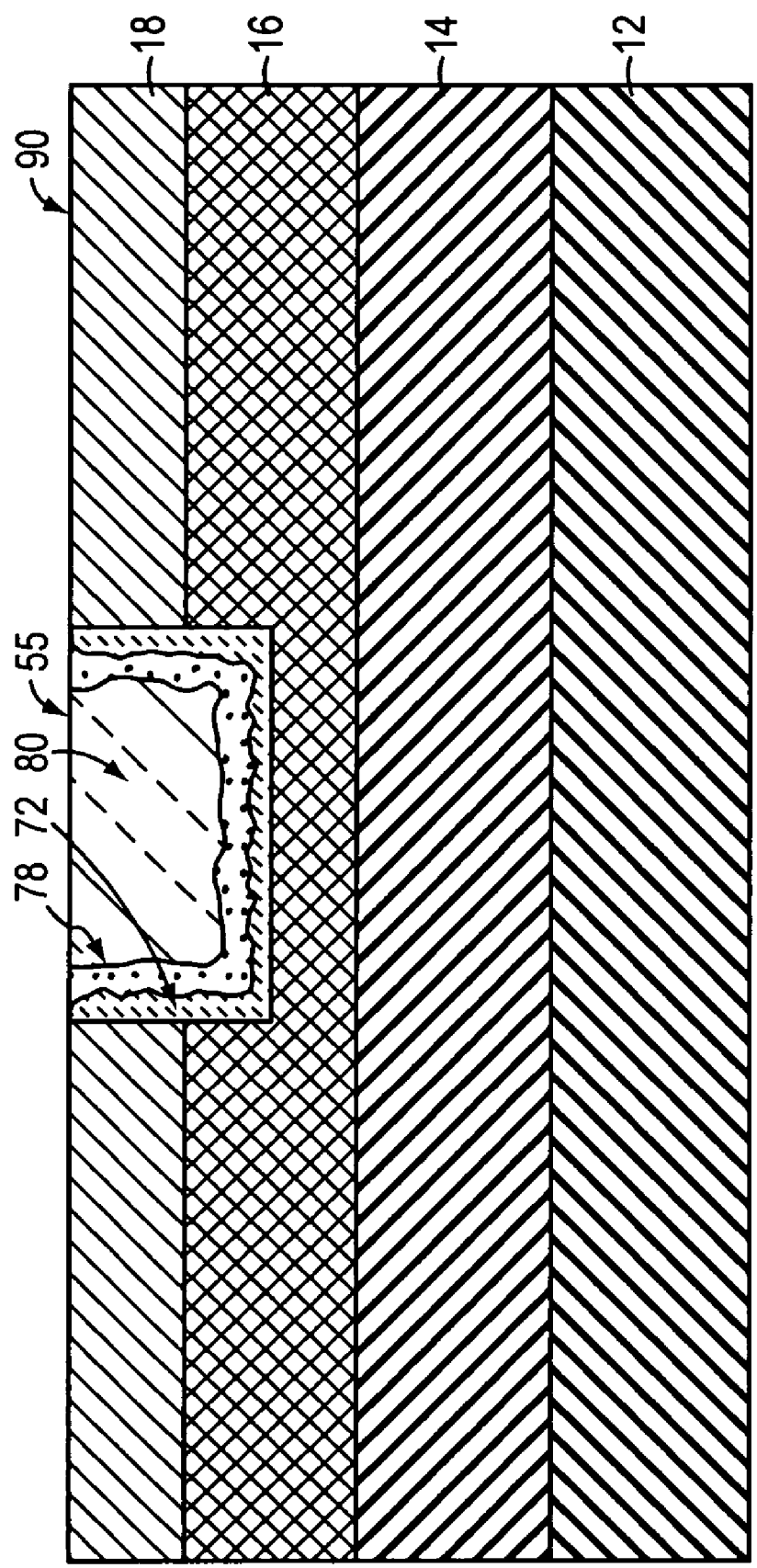

Referring to FIG. 8 and also to FIG. 9, remaining masking layer portions 28a, 28b and pad oxide portions 26a, 26b are removed, exposing a top surface 90 of strained layer 18, and leaving trench 50 filled with fill material 80, liner oxide 72, and in some embodiments, protective liner 78. Masking layer portions 28a, 28b may be removed by a removal process such as RIE using gases such as a combination of nitrogen trifluoride, ammonia, and oxygen, or a combination of hydrogen bromide, chlorine, and oxygen. Pad oxide portions 28a, 28b may be removed by a wet etch that is selective to silicon, such as a hydrofluoric acid etch. After removal of masking layer portions 28a and 28b and pad oxide portions 26a and 26b, a portion of fill material 80 may extend above top surface 90.

Figure 10A:
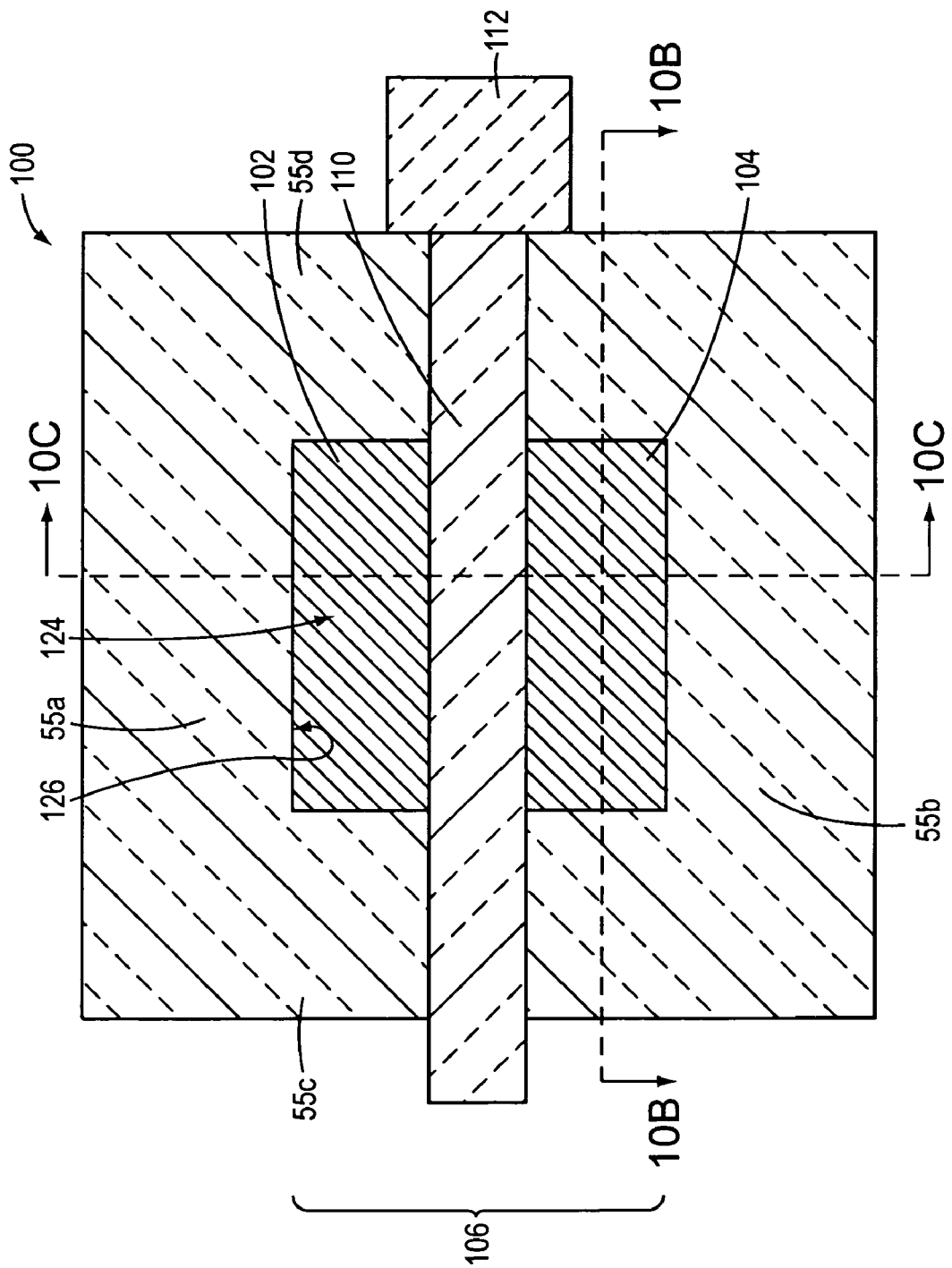
Figure 10B:
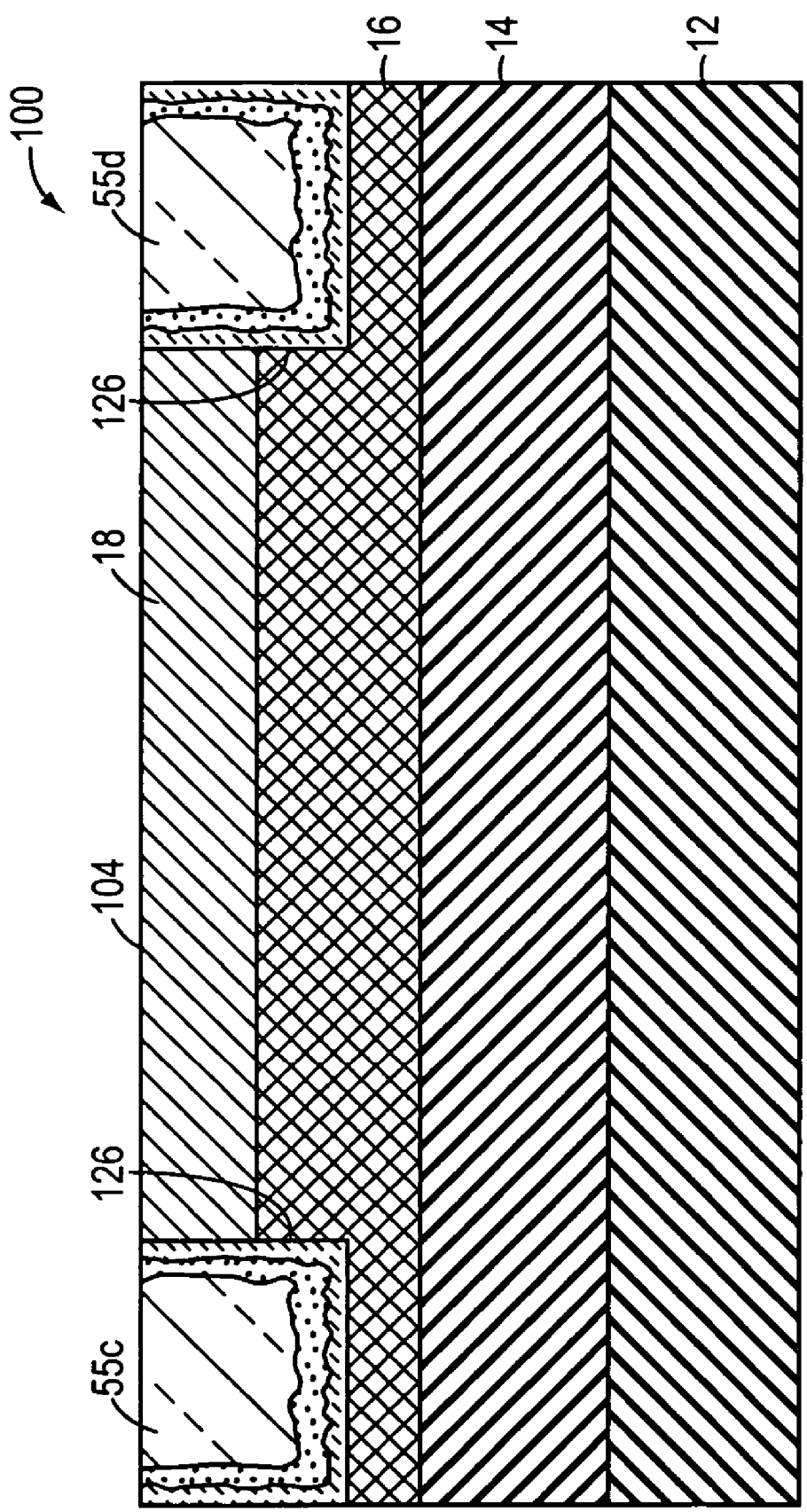
Figure 10C:
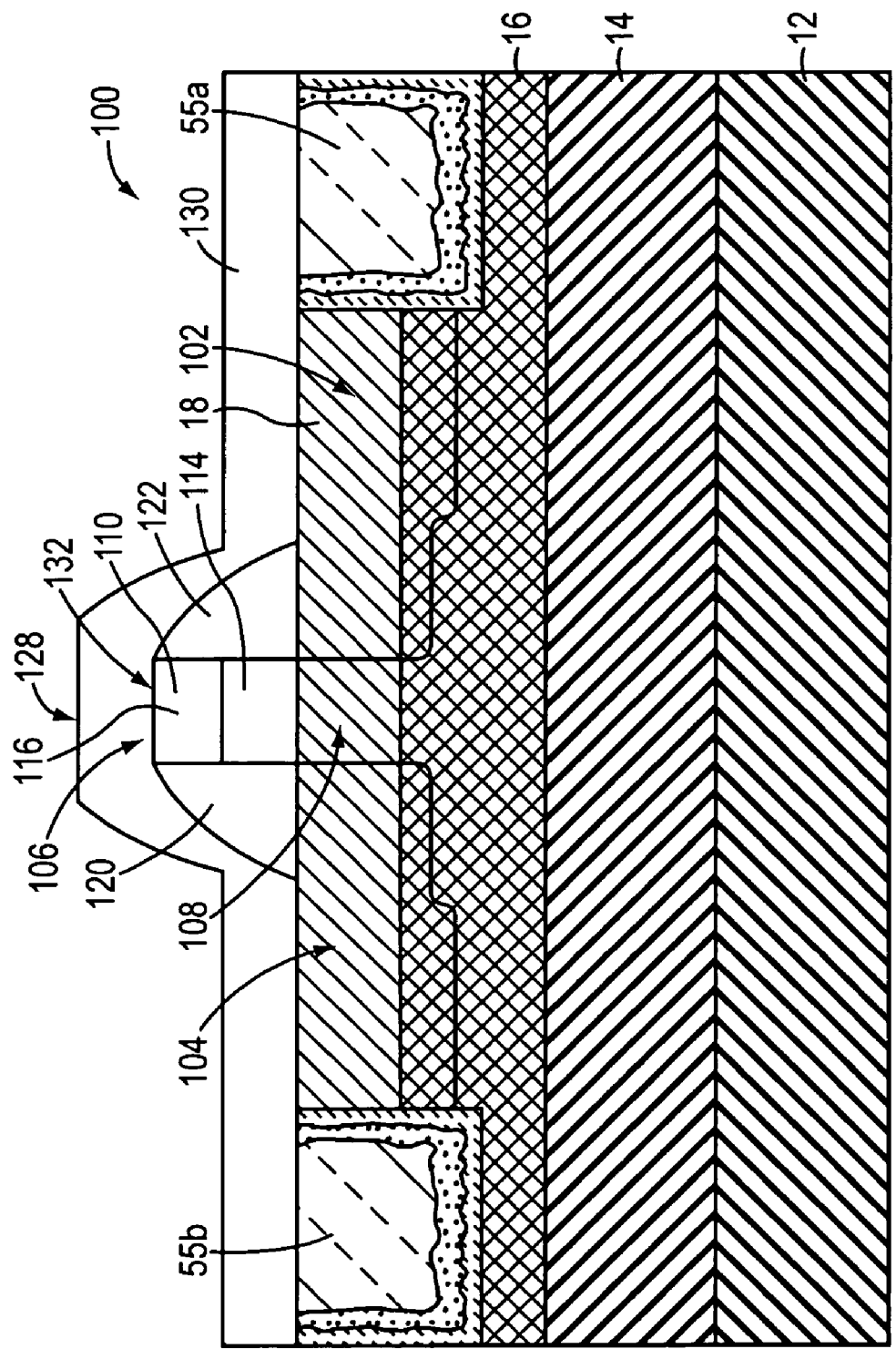

Referring to FIGS. 10a-10c, a structure 100 may include first and second parallel isolation trench structures 55a, 55b proximate a first source region 102 and a first drain region 104 of a first transistor 106. A first channel region 108 may be disposed between the first source and drain regions 102, 104. First channel region 108 may have a first type of strain. In some embodiments, the first type of strain may be tensile. In other embodiments, the first type of strain may be compressive. At least a portion of the first channel region 108 may be disposed in strained layer 18. A first gate 110 may be disposed above the channel region 108 and between the source and drain regions 102, 104. Gate 110 may be connected to a gate contact 1112. A first gate dielectric layer 114 may be formed between gate 110 and channel region 108. First gate 110 and first gate dielectric layer 114 may be collectively referred to as a first gate structure 116. A first and a second sidewall spacer 120, 122 may be formed proximate gate structure 116.

First transistor 106 may be formed on layers 13 disposed over substrate 12. As discussed above with reference to FIG. 1a, layers 13 may include, for example, graded layer 14, relaxed layer 16, and strained layer 18. In other embodiments, first transistor 106 may be formed on an SSOI substrate 22, as shown in FIG. 1c. Source region 102, channel region 108, and drain region 104 may be formed in a portion of the SSOI substrate 22, for example, in a portion of strained layer 18.

Source and drain regions 102, 104 may be formed by, e.g., ion implantation of either n-type or p-type dopants. Gate 110 may be formed of a conductive material, such as doped semiconductor, e.g., polycrystalline Si or polycrystalline SiGe; a metal, e.g., titanium (Ti), tungsten (W), molybdenum (Mo), tantalum (Ta), nickel (Ni), or iridium (Ir); or metallic compounds, e.g., titanium nitride (TiN), titanium silicon nitride (TiSiN), tungsten nitride (WN), tantalum nitride (TaN), tantalum silicide (TaSi), nickel silicide (NiSi), or iridium oxide ($IrO_2$), that provide an appropriate workfunction. The gate dielectric layer 114 may be formed on strained layer 18 by, for example, growing a $SiO_2$ layer by thermal oxidation. Alternatively, gate dielectric layer 114 may include a high-k material with a dielectric constant higher than that of $SiO_2$, such as $ZrO_2$, $Al_2O_3$, $HfO_2$, HfSiON, or $HfSiO_4$. In some embodiments, gate dielectric layer 114 may be a stacked structure, e.g., a thin $SiO_2$ layer capped with a high-k material.

First and second trench structures 55a, 55b confine carriers (not shown), such as holes or electrons generated during operation of first transistor 106, within a region 124 having an outer semiconductor/insulating boundary 126 defined by first and second trench structures 55a, 55b and by adjacent third and fourth trench structures 55c, 55d. By confining carriers to region 124, trench structures 55a-55d help prevent further migration of the carriers, and thereby prevent leakage currents between first transistor 106 and other devices (not shown). The shallow trench isolation provided by first, second, third, and fourth trench structures 55a-55d is inadequate if the edge-leakage current associated with a high interface trap density at the semiconductor/insulating boundary 126 is sufficient to significantly increase the off-state current ($I_{off}$) of transistor 106. On the other hand, this isolation suffices if the edge-leakage current associated with a low interface trap density at the semiconductor-trench boundary 126 ensures a low $I_{off}$ for first transistor 106. $I_{off}$ is affected by the edge-leakage that occurs underneath gate 110. A low interface trap density in the portions of boundary 126 disposed underneath gate 110, therefore, is critical for obtaining a low $I_{off}$. If the interface trap density in boundary 126 underneath gate 110 is low, leakage current cannot flow under gate 110 sufficiently to induce a high $I_{off}$. The $I_{off}$ may be less than $10^{-6}$ Ampere. In some embodiments, the off current is less than $10^{-9}$ Ampere.

Trench structures 55a-55d may include a first dielectric layer 72, and optionally a second protective liner 78. Parameters for forming trench structures 55a-55d may be selected such that one or more of the trench structures 55a-55d induces only a portion of the strain in channel region 108, but not the entire strain in channel region 108. For example, in an embodiment, channel region 108 may be compressively strained, and trench structures 55a-55d may be formed in a manner and of materials such that the trench structures 55a-55d are also compressively strained, and induce only a portion of the compressive strain in channel region 108. In another embodiment, channel region 108 may be tensilely strained, and trench structures 55a-55d may be formed in a manner and of materials such that the trench structures 55a-55d are also tensilely strained, and induce only a portion of the tensile strain in channel region 108. The portion of strain induced by trench structures 55a-55d may be between 0-99.9% of the strain in channel region 108.

As used herein, the term "active area length" refers to the dimension of the active device area bounded by trench structures 55a-55d parallel to the current flow and perpendicular to the gate. Referring to FIG. 10a, the active area length is along the 10c-10c line. The term "active area width" refers to the dimension of the active area bounded by trench structures 55a-55d parallel to the gate and perpendicular to the direction of the current flow. With reference to FIG. 10a, the active area width is along the 10b-10b line.

The use of trench structures to induce a portion of the strain in channel region 108 rather than inducing strain of the opposite type (e.g., inducing tensile strain in a compressively strained channel) may result in superior device performance, particularly when the dimensions of the active device area are scaled to small sizes. For example, device performance may be improved when the active area length is smaller than approximately 1 µm and/or the active area width is smaller than 0.5 µm.

As discussed above, in some embodiments, the strain in channel region 108 may arise from lattice mismatch between strained layer 18 and the underlying layers. In other embodiments, strained layer 18 may be a surface portion of substrate 12 upon which a transistor is fabricated. In such embodiments, the strain in channel region 108 may be induced by another structure, for example, a strain-inducing element 128, introduced during device fabrication. The strain in channel region 108 may be predominantly uniaxial. In other embodiments, the strain may be induced along multiple directions, e.g., the strain may be biaxial strain or hydrostatic strain.

As noted above, in some embodiments, a portion of the strain in channel region 108 may be induced by trench structures 55a-55d. In an embodiment, the portion of the strain induced in channel region 108 by trench structures 55a-55d may be approximately zero, and the strain in channel region 108 may be induced by other structures, for example, a strain-inducing element 128, introduced during device fabrication.

Various approaches may be used to tailor the strain induced by trench structures 55a-55d so that the induced strain is approximately zero. For example, the fill material in the trench structures 55a-55d may be selected to have a coefficient of thermal expansion to be approximately the same as the material surrounding the trenches 50, e.g., the fill material may include silicon when the trench is formed in a silicon substrate. Alternatively, the fill material may include two materials, with a first material having strain that is opposite to the strain of a second material.

With continued reference to FIG. 10c, in one embodiment, the strain in first channel region 108 is induced by a first cap layer 130, such as a layer used as an etch stop during contact metallization. Cap layer 130 may be conformally disposed over the entire device structure 100, e.g., over a surface 132 of first transistor 106, and may be formed from a dielectric material, e.g., silicon nitride, processed to induce tensile or compressive strain in channel region 108. In an embodiment, cap layer 130 includes silicon nitride that may be processed to induce strain as previously described in the discussion of masking layer 28. Additionally, cap layer 130 may be implanted with atoms, e.g., Si or Ge atoms, to tailor the strain level induced in the channel region 108. In another embodiment, the strain in channel region 108 may be induced by the implantation of a gaseous species, e.g., hydrogen, oxygen, helium, or other noble gas, into gate 110 or into a region below channel region 108.

Gate 110 may also induce strain in channel region 108 if gate 110 is composed completely or nearly completely of a metal silicide, metal germanosilicide, or metal germanocide, e.g., nickel silicide (NiSi), nickel germanosilicide (NiSiGe), or nickel germanocide (NiGe). The reaction between the metal and the gate polycrystalline silicon, polycrystalline silicon-germanium, or polycrystalline germanium may result in a volumetric change that may induce strain in channel region 108 after processing. In an alternative embodiment, strain in gate 110 may be induced by deposition of an overlayer, e.g., an oxide, and annealing prior to complete or incomplete silicidation of the gate. Gate 110 may include a semiconductor material that has been amorphized, e.g., by an ion implantation step, and may undergo an amorphous-crystalline phase transition (and accompanying volumetric change) during a subsequent anneal. The presence of an overlayer during such an anneal may result in a strain being induced in channel region 108, even after the overlayer is removed and the gate is silicided.

Figure 10D:
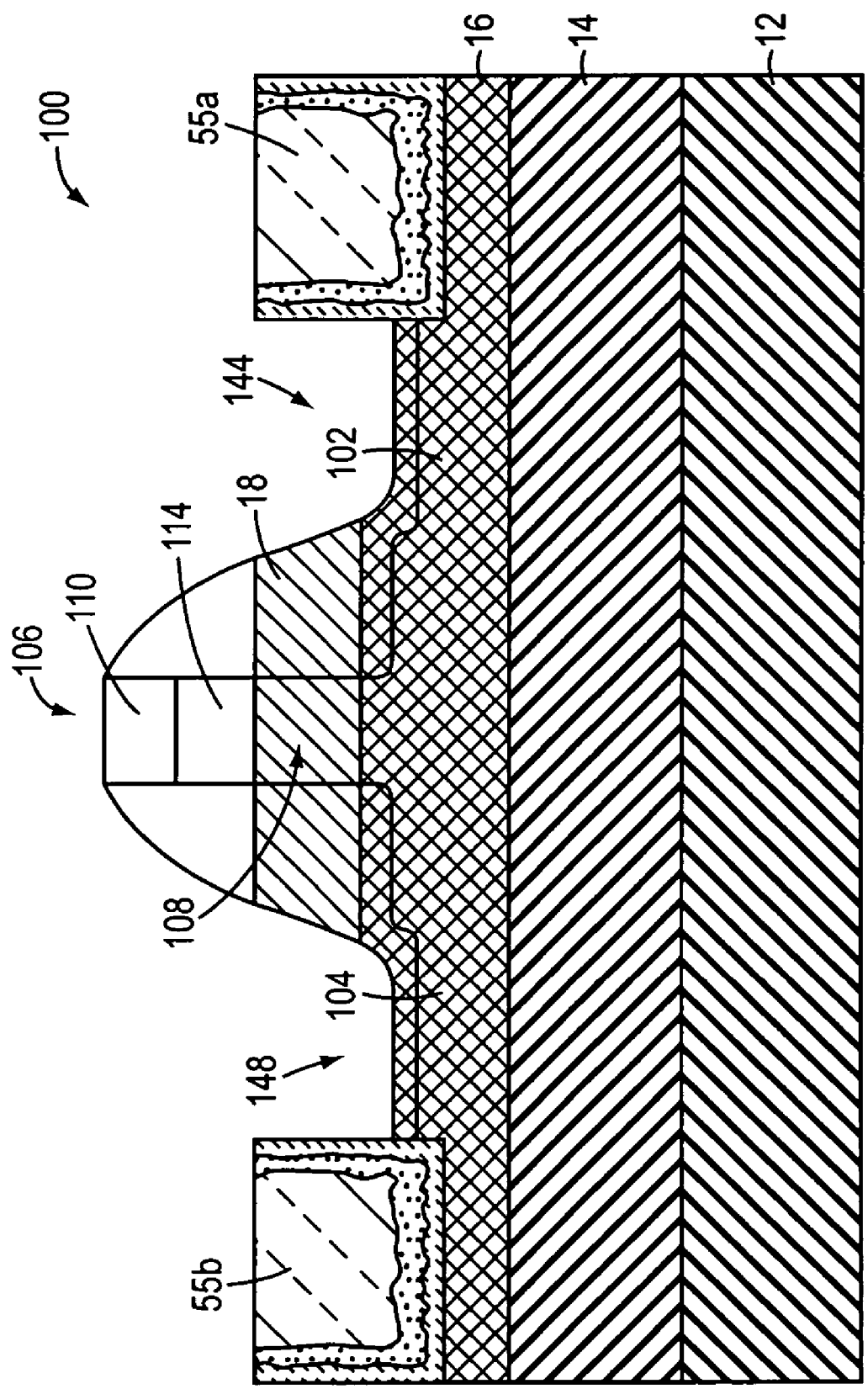
Figure 10E:
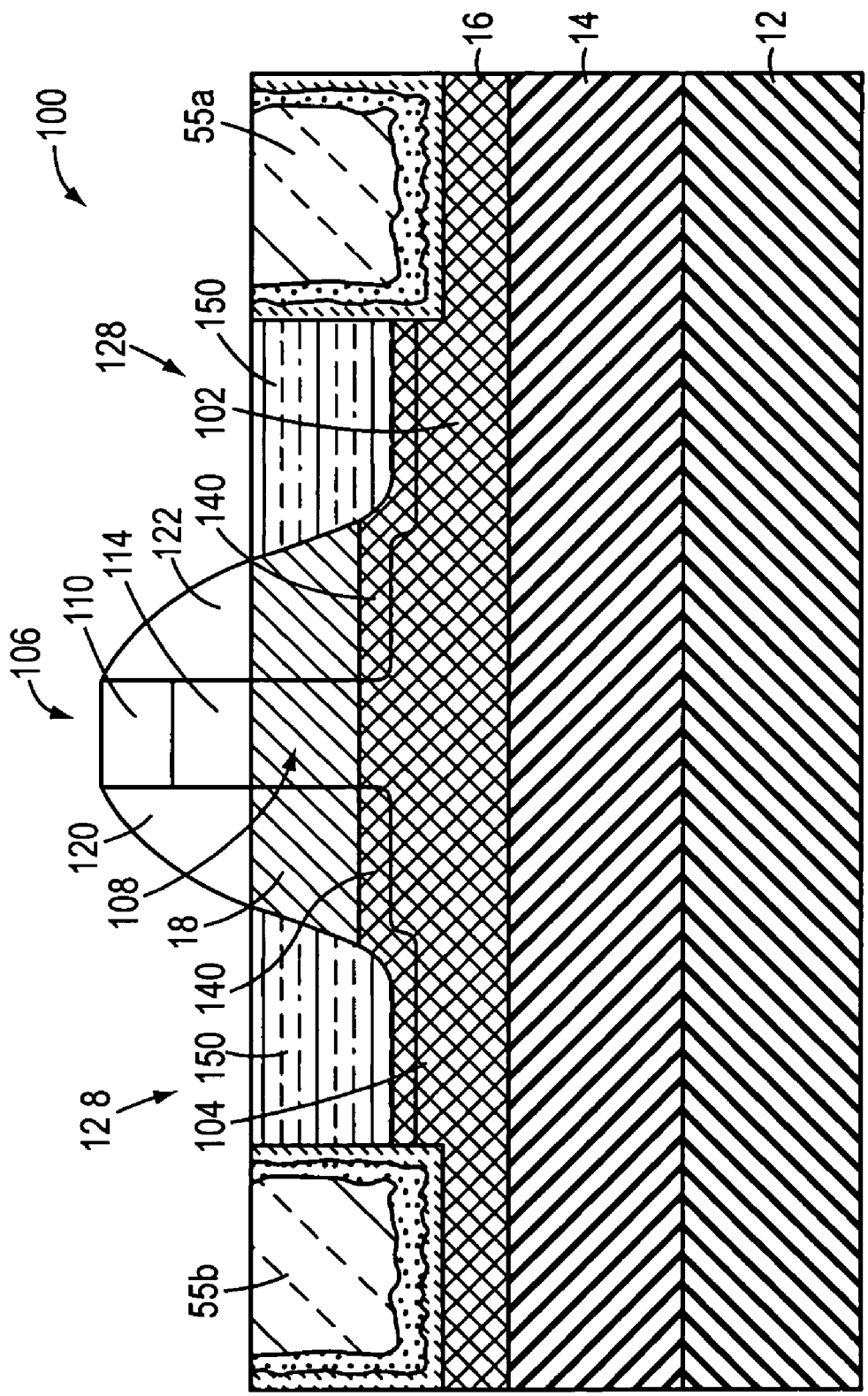

With reference to FIGS. 10d-10e, in another embodiment, the strain in channel region 108 may be induced by the replacement of a portion of the semiconductor material in source region 102 and drain region 104, with a second material having a lattice constant different from that of the semiconductor material disposed in the channel region 108 or in an area 140 proximate at least one of the first source region 102 and first drain region 104. For example, first and second recesses 144, 148 may be defined in source region 102 and drain region 104 that include Si (in which case channel region 108 also includes Si), as described in, e.g., U.S. Pat. Nos. 6,651,273 and 6,621,131, incorporated by reference herein. Recesses 144, 148 may be filled with a second material 150 with a lattice constant larger than that of Si, such as SiGe, thereby inducing compressive strain in channel region 108. Alternatively, recesses 144, 148 in source region 102 and drain region 104 that include Si may be etched and refilled with second material 150 with a smaller lattice constant, such as silicon carbide (SiC), thereby inducing tensile strain in channel region 108. For source, drain, and channel regions that include SiGe, the refill second material 150 may be Ge or SiGe with a higher Ge content for inducing compressive strain or Si or SiGe with a lesser Ge content for inducing tensile strain. Area 140 may be, for example, a portion of relaxed layer 16 and/or a portion of strained layer 18. In an embodiment, first transistor 106 is formed on a bulk semiconductor substrate 12, and area 140 may include a portion of the bulk semiconductor substrate 12.

In another embodiment, strain in channel region 108 may also be induced predominantly by a silicided region of source region 102 and/or drain region 104. Volumetric changes during the reaction of the silicide metal with the semiconductor material in source region 102 or drain region 104 may cause strain to be induced in channel region 108. Such metals may include titanium, nickel, cobalt, platinum or other suitable metals. In such embodiments, source region 102 and drain region 104 may not be etched and refilled with alternative semiconductor materials.

In another embodiment, strain-inducing element 128 may be introduced during back-end metallization steps or during die-level packaging of a chip including first transistor 106. For example, strain-inducing element 128 could be the package to which the chip is attached after the completion of device fabrication. Such a package can be engineered, e.g., deformed or strained, to induce strain across an entire chip along one or more directions, thereby inducing strain in channel region 108. For such embodiments, bulk semiconductor substrate 12 may have a reduced thickness, e.g., due to removal of material by backside grinding. In another embodiment, strain-inducing element 128 could be a metallization layer or a dielectric layer between metal wiring layers deposited and/or processed in a manner such that strain is induced in channel region 108.

The methods described herein by which strain is induced in channel region 108 may be used in combination with the epitaxial strained layer 18 described above, and/or with SSOI or SOI wafers.

Figure 11:
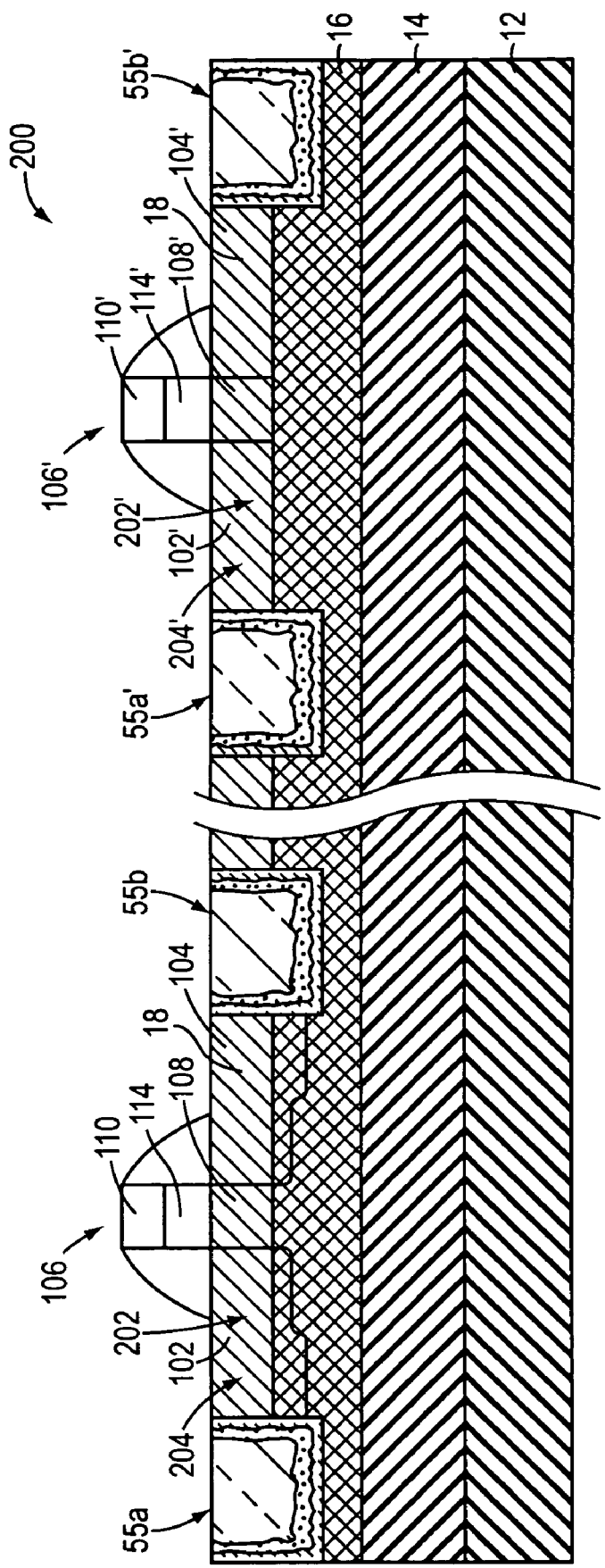
FIG. 11 is a cross-sectional view of a semiconductor structure including two transistors.

Referring to FIG. 11, a structure 200 may include a first transistor 106 and a second transistor 106'. The first transistor 106 may be disposed over a first region of substrate 12, for example, over a first region 202 of strained layer 18. Trench structures 55a and 55b may be formed proximate first source region 102 and first drain region 104. First source region 102 and first drain region 104 may, in turn, be disposed in a first portion of the substrate, for example, in a first portion 204 of strained layer 18. The second transistor 106' may be disposed over a second region of substrate 12, for example, over a second region 202' of strained layer 18. The second transistor 106' may include a second source region 102' and a second drain region 104' disposed in a second portion of the substrate, for example, in a second portion 204' of strained layer 18. The second transistor 106' also may include a second channel region 108' disposed between second source region 102' and second drain region 104'. In some embodiments, second channel region 108' may be tensilely strained. In other embodiments, second channel region 108' may be compressively strained. A second gate 110' may be disposed over second channel region 108' and between second source region 102' and second drain region 104'. The second gate 110' may include a material such as a doped semiconductor, a metal, and a metallic compound. A second gate dielectric 114' may be disposed between second gate 110' and second channel region 108'.

A second trench structure 55a' may be formed proximate at least one side of second source region 102' or second drain region 104'. A second pair of trench structures including trench structures 55a', 55b' may be formed proximate second source region 102' and second drain region 104'. In an embodiment, second channel region 108' may be compressively strained, and trench structures 55a', 55b' may be formed in a manner and of materials such that trench structures 55a', 55b' are also compressively strained, and induce a portion of the compressive strain in second channel region 108'. In another embodiment, second channel region 108' may be tensilely strained, and trench structures 55a', 55b' may be formed in a manner and of materials such that trench structures 55a', 55b' are also tensilely strained, and induce a portion of the tensile strain in second channel region 108'.

The first channel region 108 and the second channel region 108' may have the same or different types of strain. For example, in one embodiment, first channel region 108 may be compressively strained, while second channel region 108' is tensilely strained. In this embodiment, trench structures 55a, 55b may be formed in a manner and of materials such that trench structures 55a and 55b are compressively strained, and induce a portion of the compressive strain in first channel region 108. Trench structures 55a', 55b' may be formed in a manner and of materials such that trench structures 55a', 55b' are tensilely strained, and induce a portion of the tensile strain in second channel region 108'.

In the case of first channel region 108 and second channel region 108' having different types of strain, it may be advantageous in terms of process simplicity for trench structures 55a, 55b, 55a', 55b' to induce approximately no strain on channel regions 108 and 108'. In this case, the strain in strained layer 18 may be augmented with another strain-inducing technique described above, e.g., cap layer 130, strain-inducing gate 110, or etched and refilled source and drain regions 102 and 104. In an embodiment, first transistor 106 could include first channel region 108 in strained layer 18 that is tensilely strained, cap layer 130 that induces tensile strain, and trench structures 55a, 55b that induce little or no strain on first channel region 108. Second transistor 106' could include second channel region 108' in strained layer 18 that is compressively strained, source and drain regions 102', 104' comprising a material with a larger lattice constant than that of surrounding material (at least one of strained layer 18 and relaxed layer 16) and hence inducing compressive strain in second channel region 108', and trench structures 55a', 55b' that induce little or no strain on second channel region 108'. These methods may also be utilized on SSOI substrates.

The use of these composite techniques to cooperatively induce the strain in channel region 108 rather than inducing strain of opposite types (e.g., inducing tensile strain in a compressively strained channel) may result in superior device performance, particularly when the dimensions of the active device area are scaled to small sizes. For example, device performance may be improved when the active area length is smaller than approximately 1 μm and/or the active area width is smaller than 0.5 μm.

In some embodiments, either or both of the gates of transistors 106, 106' may be oriented along crystallographic directions offset from the customary in-plane [110] direction. For example, a transistor gate may be aligned to an in-plane [100] direction on a (100) Si wafer. In other embodiments, a substrate having a surface other than the customary (100) surface may be used in the manufacture of transistors 106, 106'. For example, a substrate with a (110) or (111) surface may be used. For the case of a SOI or SSOI substrate, a layer above the insulating layer may have an in-plane rotation with respect to an underlying substrate (i.e., the crystallographic directions in the layer may be different from that of the substrate) or may have surface crystallographic planes other than those of the underlying substrate. For example, a semiconductor layer may be rotated 45° in-plane prior to bonding to form an SOI or SSOI substrate. Alternatively, a semiconductor (strained or unstrained) may be formed with an alternative surface crystallographic plane (e.g., (110) or (111)) and bonded to a handle wafer (e.g., with a (100) surface).

Embodiments of this invention may also be applicable to transistors with multiple or wrap-around gates. Examples of these include fin-FETs, tri-gate FETs, omega-FETs, and double-gate FETs (the channels of which may be oriented horizontally or vertically).

The invention may be embodied in other specific forms without departing from the spirit or essential characteristics thereof. The foregoing embodiments are therefore to be considered in all respects illustrative rather than limiting on the invention described herein.

What is claimed is:

1. A structure comprising:
  a first transistor disposed over a first region of a substrate, the first transistor including:
    a first source region and a first drain region disposed in a first portion of the substrate,
    a first channel region disposed between the first source region and the first drain region, at least a portion of the first channel region located in a strained layer disposed over the substrate and lattice-mismatched to a proximate material inducing a first type of strain in the strained layer, the first channel region having the first type of strain, and
    a first gate disposed above the first channel region and between the first source and first drain regions, the first gate comprising a conductive material; and
  a first trench structure disposed in a trench,
  wherein the trench is proximate at least one side of one of the first source region and the first drain region, the first trench structure inducing a portion of the first type of strain in the first channel region.

2. The structure of claim 1, wherein the strained layer comprises at least one of a group II, group III, group V, and group VI element.

3. A method for forming a semiconductor structure, the method comprising:
forming a first transistor over a first region of a substrate having a strained layer disposed thereover, the strained layer being lattice-mismatched to a proximate material inducing a first type of strain in the strained layer, the first transistor formed by:
defining a first source region and a first drain region in a first portion of the substrate,
defining a first channel region between the first source region and the first drain region, the first channel region having a first type of strain, at least a portion of the first channel region being disposed in the strained layer, and
forming a first gate above the first channel region and between the first source and first drain regions, the first gate comprising a conductive material;
forming a first trench proximate at least one side of one of the first source region and the first drain region; and
forming a first trench structure in the first trench, the first trench structure being tailored to induce only a portion of the first type of strain in the first channel region.

4. A method for forming a semiconductor structure, the method comprising:
providing a substrate;
forming a first transistor over a first region of the substrate by:
defining a first source region and a first drain region in a first portion of the substrate,
defining a first channel region between the first source region and the first drain region, the first channel region having a first type of strain, and
forming a first gate above the first channel region and between the first source and first drain regions, the first gate comprising a conductive material;
forming a first trench proximate at least one side of one of the first source region and the first drain region; and
forming a first trench structure in the first trench, the first trench structure being tailored to induce only a portion of the first type of strain in the first channel region,
wherein the gate induces at least a second portion of the first type of strain in the first channel region, and forming the first gate comprises (i) forming a polycrystalline semiconductor layer over the substrate and (ii) reacting the polycrystalline semiconductor layer with a metal, such that the first gate consists essentially of an alloy of the metal and the semiconductor layer.

5. The structure of claim 1, further comprising:
a dielectric layer disposed beneath the first channel region.

6. The structure of claim 1 wherein at least one of the first source region and the first drain region comprises a metal-semiconductor alloy, and the strain in the first channel region is induced by the metal-semiconductor alloy.

7. The structure of claim 1 wherein the first transistor is disposed in a chip, the structure further comprising:
a package housing the chip,
wherein the package induces strain in the first channel region.

8. The method of claim 3, further comprising:
forming a metal-semiconductor alloy over at least one of the first source region and the first drain region, the metal-semiconductor alloy tailored to induce the first type of strain in the first channel region.

9. The method of claim 4 further comprising, after forming the first gate, depositing an overlayer over the first gate, and annealing the first gate, wherein the first gate consists essentially of the alloy of the metal and the semiconductor layer.

10. A method for forming a semiconductor structure, the method comprising:
providing a substrate;
forming a first transistor over a first region of the substrate by:
defining a first source region and a first drain region in a first portion of the substrate,
defining a first channel region between the first source region and the first drain region, the first channel region having a first type of strain, and
forming a first gate above the first channel region and between the first source and first drain regions, the first gate comprising a conductive material;
forming a first trench proximate at least one side of one of the first source region and the first drain region;
forming a first trench structure in the first trench, the first trench structure being tailored to induce only a portion of the first type of strain in the first channel region;
disposing the first transistor in a chip; and
attaching the chip to a package,
wherein the package induces at least a portion of the first type of strain in the first channel region and the first type of strain is selected from the group consisting of tensile strain and compressive strain.

11. A method for forming a semiconductor structure, the method comprising:
providing a substrate comprising a strained layer having a first type of strain;
forming a masking layer over the substrate such that the masking layer exerts a second type of strain different from the first type of strain on the strained layer;
removing the masking layer over a first portion of the substrate; and
etching a trench in the first portion of the substrate,
wherein the first type of strain is opposite to the second type of strain.

12. The method of claim 11 wherein the masking layer comprises silicon nitride.

13. The method of claim 11, further comprising forming a pad oxide layer over the substrate prior to forming the masking layer.

14. A structure comprising:
a first transistor disposed over a first region of a substrate, the first transistor including:
a first source region and a first drain region disposed in a first portion of the substrate,
a first channel region disposed between the first source region and the first drain region, the first channel region having a first type of strain, and
a first gate disposed above the first channel region and between the first source and first drain regions, the first gate comprising a conductive material;
a first trench structure disposed in a trench; and
a first strain-inducing element that induces the first type of strain in the first channel region,
wherein the trench bounds the first source region and the first drain region, the first trench structure and the first strain-inducing element each inducing only a portion of the first type of strain in the first channel region, the first type of strain being selected from the group consisting of tensile and compressive strain.

15. The structure of claim 11 wherein the first type of strain is tensile and the second type of strain is compressive.

16. The structure of claim 11 wherein the first type of strain is compressive and the second type of strain is tensile.

17. The structure of claim 1, wherein the proximate material comprises an underlying layer.

18. The structure of claim 1, wherein the proximate material comprises a second material disposed in at least one of the first source and first drain regions.

19. The structure of claim 1, wherein the trench structure comprises a liner dielectric, a protective liner, and a dielectric material.

20. The structure of claim 3, wherein the proximate material comprises an underlying layer.

21. The structure of claim 3, wherein the proximate material comprises a second material disposed in at least one of the first source and first drain regions.

22. The structure of claim 3, wherein the trench structure comprises a liner dielectric, a protective liner, and a dielectric material.

* * * * *